US012593584B2

(12) United States Patent
Kubota et al.

(10) Patent No.: US 12,593,584 B2
(45) Date of Patent: Mar. 31, 2026

(54) DISPLAY APPARATUS, DISPLAY MODULE, AND ELECTRONIC DEVICE

(71) Applicant: SEMICONDUCTOR ENERGY LABORATORY CO., LTD., Atsugi (JP)

(72) Inventors: Daisuke Kubota, Kanagawa (JP); Taisuke Kamada, Saitama (JP); Ryo Hatsumi, Kanagawa (JP); Koji Kusunoki, Kanagawa (JP); Kazunori Watanabe, Tokyo (JP); Susumu Kawashima, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/883,120

(22) Filed: Sep. 12, 2024

(65) Prior Publication Data

US 2025/0008804 A1 Jan. 2, 2025

Related U.S. Application Data

(63) Continuation of application No. 17/625,854, filed as application No. PCT/IB2020/056398 on Jul. 8, 2020, now Pat. No. 12,096,670.

(30) Foreign Application Priority Data

Jul. 17, 2019 (JP) ................................ 2019-132204
Aug. 23, 2019 (JP) ................................ 2019-152454
(Continued)

(51) Int. Cl.
*H10K 59/65* (2023.01)
*H10K 59/35* (2023.01)
(Continued)

(52) U.S. Cl.
CPC ........... *H10K 59/35* (2023.02); *H10K 59/351* (2023.02); *H10K 59/352* (2023.02);
(Continued)

(58) Field of Classification Search
CPC .... H10K 59/35; H10K 59/351; H10K 59/352; H10K 59/353; H10K 59/65;
(Continued)

(56) References Cited

U.S. PATENT DOCUMENTS 7,750,896 B2 7/2010 Kuroda
8,310,413 B2 11/2012 Fish et al.
(Continued)

FOREIGN PATENT DOCUMENTS

CN 001934605 A 3/2007
EP 1728234 A 12/2006
(Continued)

OTHER PUBLICATIONS

International Search Report (Application No. PCT/IB2020/056398) Dated Sep. 1, 2020.
(Continued)

*Primary Examiner* — Donald L Raleigh
(74) *Attorney, Agent, or Firm* — Fish & Richardson P.C.

(57) ABSTRACT

The resolution of a display apparatus having a light detection function is increased. The display apparatus includes a light-emitting device and a light-emitting and light-receiving device. The light-emitting device includes a first pixel electrode, a first light-emitting layer, and a common electrode; the light-emitting and light-receiving device includes a second pixel electrode, a second light-emitting layer, an active layer, and the common electrode; the active layer includes an organic compound; the first light-emitting layer is positioned between the first pixel electrode and the common electrode; the second light-emitting layer and the
(Continued)

active layer are each positioned between the second pixel electrode and the common electrode; the light-emitting device has a function of emitting light of a first color; and the light-emitting and light-receiving device has a function of emitting light of a second color and a function of receiving light of the first color. The light-emitting and light-receiving device functions as both a light-emitting device and a light-receiving device, whereby a pixel can have a light-receiving function without an increase in the number of subpixels included in the pixel. Furthermore, the pixel can be provided with a light-receiving function without a reduction in the resolution of the display apparatus or a reduction in the aperture ratio of each subpixel.

12 Claims, 34 Drawing Sheets

(30) Foreign Application Priority Data

Nov. 13, 2019 (JP) ................................ 2019-205423
Nov. 26, 2019 (JP) ................................ 2019-213696

(51) Int. Cl.
*H10K 59/80* (2023.01)
*H10K 39/30* (2023.01)
*H10K 102/00* (2023.01)

(52) U.S. Cl.
CPC ........... *H10K 59/353* (2023.02); *H10K 59/65* (2023.02); *H10K 59/8792* (2023.02); *H10K 39/30* (2023.02); *H10K 59/87* (2023.02); *H10K 2102/311* (2023.02)

(58) Field of Classification Search
CPC .... H10K 59/8792; H10K 39/30; H10K 59/87; H10K 2102/311; H10K 59/40; H10K 30/00; H10K 50/00; G06F 3/0421; G06F 3/041; G06F 3/042; G06V 40/1318; H10F 55/255; H10F 30/20; H10F 39/12; H10F 55/00; Y02E 10/549; Y02P 70/50; G09F 9/301; G09F 9/33
See application file for complete search history.

(56) References Cited

U.S. PATENT DOCUMENTS

| | | | |
|---|---|---|---|
| 9,088,006 B2 | 7/2015 | Yamazaki et al. | |
| 9,627,648 B2 | 4/2017 | Yamazaki et al. | |
| 10,003,047 B2 | 6/2018 | Yamazaki et al. | |
| 10,032,834 B2 | 7/2018 | Udaka et al. | |
| 10,381,599 B2 | 8/2019 | Yamazaki et al. | |
| 10,903,453 B2 | 1/2021 | Yamazaki et al. | |
| 2005/0225233 A1 | 10/2005 | Boroson et al. | |
| 2007/0241998 A1 | 10/2007 | Fish et al. | |
| 2008/0252223 A1 | 10/2008 | Toyoda et al. | |
| 2009/0230872 A1* | 9/2009 | Kuroda ................ | G06F 3/0412 313/503 |
| 2015/0221706 A1 | 8/2015 | Udaka et al. | |
| 2015/0373243 A1 | 12/2015 | Toda | |
| 2020/0395576 A1 | 12/2020 | Yamazaki et al. | |

FOREIGN PATENT DOCUMENTS

| | | |
|---|---|---|
| JP | 2007-529775 | 10/2007 |
| JP | 2008-262176 A | 10/2008 |
| JP | 2014-197522 A | 10/2014 |
| JP | 2016-054297 A | 4/2016 |
| KR | 2007-0004718 A | 1/2007 |
| TW | 200603672 | 1/2006 |
| TW | 201407843 | 2/2014 |
| WO | WO-2005/091262 | 9/2005 |
| WO | WO-2006/134869 | 12/2006 |
| WO | WO-2014/024582 | 2/2014 |

OTHER PUBLICATIONS

Written Opinion (Application No. PCT/IB2020/056398) Dated Sep. 1, 2020.

* cited by examiner

| 189 |
| 185 |
| 184 |
| 193 |
| 183 |
| 182 |
| 181 |
| 180 |

| 189 |
| 185 |
| 184 |
| 183 |
| 193 |
| 182 |
| 181 |
| 180 |

| 189 |
| 185 |
| 184 |
| 193 |
| 182 |
| 183 |
| 181 |
| 180 |

| 189 |
| 185 |
| 184 |
| 193 |
| 183 |
| 181 |
| 180 |

| 189 |
| 185 |
| 184 |
| 186 |
| 182 |
| 181 |
| 180 |

100A

100C

BM

162

164

154
142
228

190G
223
195

216
114

190R(PD)
115
193R 242
214

210

204
165

215
225
211

222b
208
231n 191
212
209

222b
218
215
225
223
221
231
222a
202

FIG. 24A
| | Intermediate state<br>New crystalline phase | |
|---|---|---|
| Amorphous | Crystalline | Crystal |
| ・completely amorphous | ・CAAC<br>・nc<br>・CAC<br><br>excluding single crystal and poly crystal | ・single crystal<br>・poly crystal |
FIG. 24B
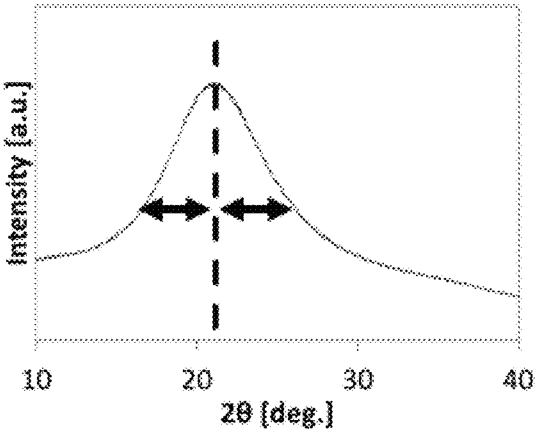
FIG. 24C
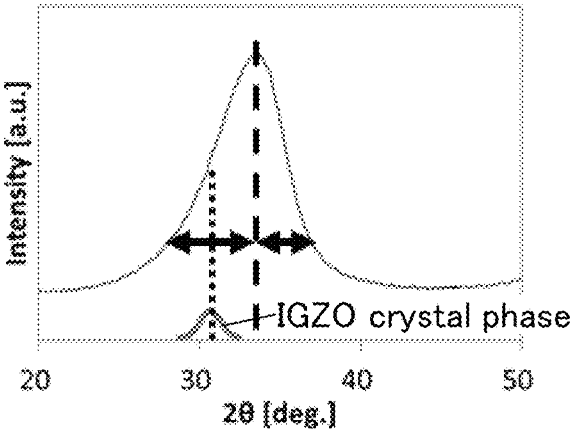
FIG. 24D
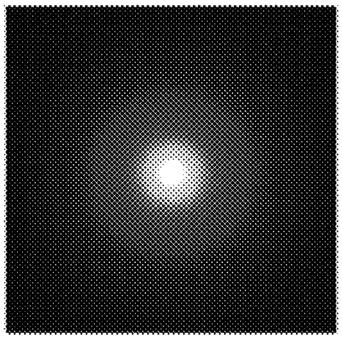
FIG. 24E
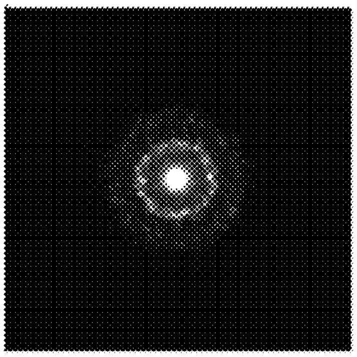

7100

7101

7000

7103

7111

7200

7211

7000

7212

7213

7214

7300

7301

7303

7000

7311

7400

7401

7000

7411

DISPLAY APPARATUS, DISPLAY MODULE, AND ELECTRONIC DEVICE

CROSS REFERENCE TO RELATED APPLICATIONS

This application is a continuation of U.S. application Ser. No. 17/625,854, filed Jan. 10, 2022, now allowed, which is incorporated by reference and is a U.S. National Phase Application under 35 U.S.C. § 371 of International Application PCT/IB2020/056398, filed on Jul. 8, 2020, which is incorporated by reference and claims the benefit of foreign priority applications filed in Japan on Jul. 17, 2019, as Application No. 2019-132204, on Aug. 23, 2019, as Application No. 2019-152454, on Nov. 13, 2019, as Application No. 2019-205423, and on Nov. 26, 2019, as Application No. 2019-213696.

TECHNICAL FIELD

One embodiment of the present invention relates to a display apparatus, a display module, and an electronic device. One embodiment of the present invention relates to a display apparatus including a light-emitting and light-receiving device (also referred to as a light-emitting and light-receiving element) and a light-emitting device (also referred to as a light-emitting element).

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor), an input/output device (e.g., a touch panel), a driving method thereof, and a manufacturing method thereof.

BACKGROUND ART

Recent display apparatuses have been expected to be applied to a variety of uses. Examples of uses for large-size display apparatuses include television devices for home use (also referred to as a TV or a television receiver), digital signage, and PIDs (Public Information Display). In addition, a smartphone and a tablet terminal including a touch panel are being developed as portable information terminals.

Light-emitting apparatuses including light-emitting devices have been developed as display apparatuses. Light-emitting devices (also referred to as EL devices or EL elements) utilizing electroluminescence (hereinafter referred to as EL) have features such as ease of reduction in thickness and weight, high-speed response to input signals, and driving with low DC voltage, and have been used in display apparatuses. For example, Patent Document 1 discloses a flexible light-emitting apparatus using an organic EL device (also referred to as organic EL element).

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a display apparatus having a light detection function. An object of one embodiment of the present invention is to increase the resolution of a display apparatus having a light detection function. An object of one embodiment of the present invention is to provide a highly convenient display apparatus. An object of one embodiment of the present invention is to provide a multifunctional display apparatus. An object of one embodiment of the present invention is to provide a display apparatus with a high aperture ratio. An object of one embodiment of the present invention is to provide a novel display apparatus.

An object of one embodiment of the present invention is to improve the manufacturing yield of a display apparatus having a light detection function. An object of one embodiment of the present invention is to reduce the number of steps for a display apparatus having a light detection function. An object of one embodiment of the present invention is to reduce the manufacturing cost of a display apparatus having a light detection function.

Note that the description of these objects does not preclude the existence of other objects. One embodiment of the present invention does not need to achieve all the objects. Other objects can be derived from the description of the specification, the drawings, and the claims.

Means for Solving the Problems

A display apparatus of one embodiment of the present invention includes a light-emitting device and a light-emitting and light-receiving device. The light-emitting device includes a first pixel electrode, a first light-emitting layer, and a common electrode. The light-emitting and light-receiving device includes a second pixel electrode, a second light-emitting layer, an active layer, and the common electrode. The active layer includes an organic compound. The first light-emitting layer is positioned between the first pixel electrode and the common electrode. The second light-emitting layer and the active layer are each positioned between the second pixel electrode and the common electrode. The light-emitting device has a function of emitting light of a first color. The light-emitting and light-receiving device has a function of emitting light of a second color and a function of receiving light of the first color.

A display apparatus of one embodiment of the present invention includes, for example, m (m is an integer greater than or equal to 2) light-emitting devices and n (n is an integer greater than m) light-emitting and light-receiving devices. It is preferable that m and the n satisfy n=2m.

A display apparatus of one embodiment of the present invention includes p (p is an integer greater than or equal to 2) first light-emitting devices, q (q is an integer greater than or equal to 2) second light-emitting devices, and r (r is an integer greater than p and greater than q) light-emitting and light-receiving devices. The first light-emitting device includes a first pixel electrode, a first light-emitting layer, and a common electrode. The light-emitting and light-receiving device includes a second pixel electrode, a second light-emitting layer, an active layer, and the common electrode. The second light-emitting device includes a third pixel electrode, a third light-emitting layer, and the common electrode. The active layer includes an organic compound. The first light-emitting layer is positioned between the first pixel electrode and the common electrode. The second light-emitting layer and the active layer are each positioned between the second pixel electrode and the common electrode. The third light-emitting layer is positioned between the third pixel electrode and the common electrode. The first light-emitting device has a function of emitting light of a first color. The light-emitting and light-receiving device has a function of emitting light of a second color and a function of receiving light of the first color. The second light-emitting device has a function of emitting light of a third color. It is preferable that p and r satisfy r=2p. It is preferable that p, q, and r satisfy r=p+q.

The light-emitting and light-receiving device can have a structure in which the second pixel electrode, the active layer, the second light-emitting layer, and the common electrode are stacked in this order. Alternatively, the light-emitting and light-receiving device can have a structure in which the second pixel electrode, the second light-emitting layer, the active layer, and the common electrode are stacked in this order.

It is preferable that the light-emitting and light-receiving device further includes a buffer layer. The buffer layer is preferably positioned between the second light-emitting layer and the active layer. The buffer layer is preferably a hole-transport layer.

It is preferable that the light-emitting device and the light-emitting and light-receiving device further include a common layer. It is preferable that the common layer be positioned between the first pixel electrode and the common electrode and between the second pixel electrode and the common electrode.

It is preferable that the display apparatus further includes a resin layer, a light-blocking layer, and a substrate. It is preferable that the resin layer and the light-blocking layer each be positioned between the common electrode and the substrate, The resin layer preferably includes an opening overlapping with the light-emitting and light-receiving device. The resin layer preferably includes a portion overlapping with the light-emitting device. The light-blocking layer preferably includes a portion positioned between the common electrode and the resin layer. The light-blocking layer preferably covers at least part of the opening and at least part of a side surface of the resin layer exposed in the opening.

Alternatively, it is preferable that the resin layer be provided to have an island shape and include a portion overlapping with the light-emitting device. The light-blocking layer preferably includes a portion positioned between the common electrode and the resin layer. At least part of light that has passed through the substrate preferably enters the light-emitting and light-receiving device without via the resin layer. The light-blocking layer preferably covers at least part of a side surface of the resin layer.

It is preferable that the display apparatus further include an adhesive layer. The adhesive layer is preferably positioned between the common electrode and the substrate. It is preferable that the resin layer and the light-blocking layer each be positioned between the adhesive layer and the substrate. The adhesive layer preferably includes a first portion overlapping with the light-emitting and light-receiving device and a second portion overlapping with the light-emitting device. The first portion preferably has a larger thickness than the second portion.

It is preferable that the display apparatus include a plurality of units each including a plurality of light-emitting and light-receiving devices, and have a mode of performing image capturing for each unit and a mode of performing image capturing for each light-emitting and light-receiving device. Alternatively, it is preferable that the display apparatus include a plurality of light-emitting and light-receiving devices, and have a mode of performing image capturing for all the light-emitting and light-receiving devices and a mode of performing image capturing for some of the light-emitting and light-receiving devices.

A display apparatus of one embodiment of the present invention includes a first light-emitting device, a second light-emitting device, a first light-emitting and light-receiving device, and a second light-emitting and light-receiving device. The display apparatus includes a first mode of performing display, a second mode of performing image capturing, and a third mode of simultaneously performing display and image capturing. The first light-emitting device, the second light-emitting device, the first light-emitting and light-receiving device, and the second light-emitting and light-receiving device are positioned on the same surface. In the first mode, the first light-emitting device, the second light-emitting device, the first light-emitting and light-receiving device, and the second light-emitting and light-receiving device each emit light to perform display. In the second mode, the first light-emitting device and the second light-emitting device each emit light and the first light-emitting and light-receiving device and the second light-emitting and light-receiving device each receive light to perform image capturing. In the third mode, the first light-emitting device, the second light-emitting device, and the first light-emitting and light-receiving device each emit light and the second light-emitting and light-receiving device receives light to perform display and image capturing simultaneously.

A display apparatus of one embodiment of the present invention preferably has flexibility.

One embodiment of the present invention is a module that includes the display apparatus having any of the above structures. For example, the module is a module provided with a connector such as a FPC (flexible printed circuit) or a TCP (tape carrier package) or a module mounted with an integrated circuit (IC) by a COG (chip on glass) method, a COF (chip on film) method, or the like.

One embodiment of the present invention is an electronic device including the above module and at least one of an antenna, a battery, a housing, a camera, a speaker, a microphone, and an operation button.

Effect of the Invention

One embodiment of the present invention can provide a display apparatus having a light detection function. One embodiment of the present invention can increase the resolution of a display apparatus having a light detection function. One embodiment of the present invention can provide a highly convenient display apparatus. One embodiment of the present invention can provide a multifunctional display apparatus. One embodiment of the present invention can provide a display apparatus with a high aperture ratio. One embodiment of the present invention can provide a display apparatus with high definition. One embodiment of the present invention can provide a novel display apparatus.

One embodiment of the present invention can improve the manufacturing yield of a display apparatus having a light detection function. One embodiment of the present invention can reduce the number of steps for a display apparatus having a light detection function. One embodiment of the present invention can reduce the manufacturing cost of a display apparatus having a light detection function.

Note that the description of these effects does not preclude the existence of other effects. One embodiment of the present invention does not need to have all these effects.

Other effects can be derived from the description of the specification, the drawings, and the claims.

BRIEF DESCRIPTION OF THE DRAWINGS

FIG. 24A is a diagram showing the classification of crystal structures of IGZO. FIG. 24B is a diagram showing an XRD spectrum of a quartz glass substrate. FIG. 24C is a diagram showing an XRD spectrum of a crystalline IGZO film. FIG. 24D is a diagram showing a nanobeam electron diffraction pattern of a quartz glass substrate. FIG. 24E is a diagram showing a nanobeam electron diffraction pattern of a crystalline IGZO film.

MODE FOR CARRYING OUT THE INVENTION

Figure 1A:
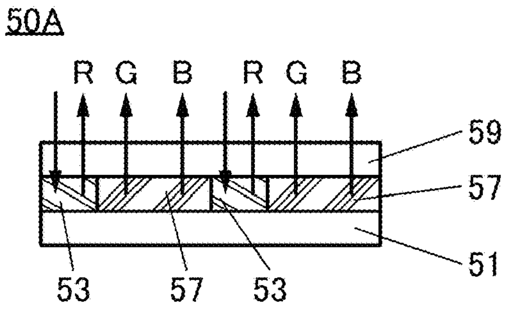
FIG. 1A to FIG. 1D are cross-sectional views illustrating examples of a display apparatus.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure shown in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

In this specification and the like, unless otherwise specified, in describing a structure including a plurality of elements (e.g., light-emitting devices and light-emitting layers), alphabets are not added when a common part of the elements is described. For example, when a common part for a light-emitting layer 193B, a light-emitting layer 193G, and the like is described, the light-emitting layers are simply referred to as a light-emitting layer 193 in some cases.

Embodiment 1

In this embodiment, a display apparatus of one embodiment of the present invention will be described with reference to FIG. 1 to FIG. 14.

A display portion of the display apparatus of this embodiment has one or both of an image capturing function and a sensing function in addition to a function of displaying an image.

For example, an organic EL device that is a light-emitting device and an organic photodiode that is a light-receiving device can be formed over the same substrate. Therefore, the organic photodiode can be incorporated into a display apparatus using the organic EL device.

However, when a subpixel including a light-receiving device is provided in addition to a subpixel including a light-emitting device, the aperture ratio of pixels might be lowered or an increase in the resolution of the display apparatus might become difficult.

In view of this, instead of the light-emitting device, a light-emitting and light-receiving device is provided in a subpixel that emits light of any color in the display apparatus of this embodiment. The light-emitting and light-receiving device has both a function of emitting light (a light-emitting function) and a function of receiving light (a light-receiving function). For example, in the case where a pixel includes three subpixels of a red subpixel, a green subpixel, and a blue subpixel, at least one of the subpixels includes a light-emitting and light-receiving device, and the other subpixels each include a light-emitting device. The light-emitting and light-receiving device functions as both a light-emitting device and a light-receiving device, whereby the pixel can have a light-receiving function without an increase in the number of subpixels included in the pixel. Thus, the display portion of the display apparatus can be provided with one or both of an image capturing function and a sensing function while keeping the aperture ratio of the pixel (aperture ratio of each subpixel) and the resolution of the display apparatus.

The light-emitting and light-receiving device can be manufactured by combining an organic EL device and an organic photodiode. For example, by adding an active layer of an organic photodiode to a layered structure of an organic EL device, the light-emitting and light-receiving device can be manufactured. Furthermore, in the light-emitting and light-receiving device formed of a combination of an organic EL device and an organic photodiode, concurrently depositing layers that can be shared with the organic EL device can inhibit an increase in the number of deposition steps.

For example, one of a pair of electrodes (a common electrode) can be a layer shared by the light-emitting and light-receiving device and the light-emitting device. In another example, at least one of a hole-injection layer, a hole-transport layer, an electron-transport layer, and an electron-injection layer is preferably a layer shared by the light-emitting and light-receiving device and the light-emitting device. As another example, the light-emitting and light-receiving device and the light-emitting device can have the same structure except for the presence or absence of an active layer of the light-receiving device. In other words, the light-emitting and light-receiving device can be manufactured by only adding the active layer of the light-receiving device to the light-emitting device. When the light-emitting and light-receiving device and the light-emitting device include a common layer in such a manner, the number of deposition steps and the number of masks can be reduced, thereby reducing the number of manufacturing steps and the manufacturing cost of the display apparatus. Furthermore, the display apparatus including the light-emitting and light-receiving device can be manufactured using an existing manufacturing apparatus and an existing manufacturing method for the display apparatus.

Note that a layer included in the light-emitting and light-receiving device might have a different function between the case where the light-emitting and light-receiving device function as the light-receiving device and the case where the light-emitting and light-receiving device function as the light-emitting device. In this specification, the name of a component is based on its function in the case where the light-emitting and light-receiving device functions as a light-emitting device. For example, a hole-injection layer functions as a hole-injection layer in the case where the light-emitting and light-receiving device functions as a light-emitting device, and functions as a hole-transport layer in the case where the light-emitting and light-receiving device functions as a light-receiving device. Similarly, an electron-injection layer functions as an electron-injection layer in the case where the light-emitting and light-receiving device functions as a light-emitting device, and functions as an electron-transport layer in the case where the light-emitting and light-receiving device function as a light-receiving device.

As described above, the display portion of the display apparatus of this embodiment includes a light-emitting and light-receiving device and a light-emitting device. Specifically, light-emitting and light-receiving devices and light-receiving devices are arranged in a matrix in the display portion. Accordingly, the display portion has one or both of an image capturing function and a sensing function in addition to a function of displaying an image.

The display portion can be used as an image sensor or a touch sensor. That is, by detecting light with the display portion, an image can be captured and the approach or touch of an object (e.g., a finger or a stylus) can be detected. Furthermore, in the display apparatus of this embodiment, the light-emitting devices can be used as a light source of the sensor. Accordingly, a light-receiving portion and a light source do not need to be provided separately from the display apparatus; hence, the number of components of an electronic device can be reduced.

In the display apparatus of this embodiment, when an object reflects light emitted by the light-emitting device included in the display portion, the light-emitting and light-receiving device can detect the reflected light; thus, detection of imaging and touch (and approach) can be performed even in a dark place.

The display apparatus of this embodiment has a function of displaying an image using the light-emitting device and the light-emitting and light-receiving device. That is, the light-emitting device and the light-emitting and light-receiving device function as display devices (also referred to as display elements).

As the light-emitting device, an EL device such as an OLED (Organic Light-Emitting Diode) and a QLED (Quantum-dot Light-Emitting Diode) is preferably used. Examples of a light-emitting substance included in the EL device include a substance exhibiting fluorescence (fluorescent material), a substance exhibiting phosphorescence (phosphorescent material), an inorganic compound (e.g., a quantum dot material), and a substance exhibiting thermally activated delayed fluorescence (Thermally Activated Delayed Fluorescent (TADF) material). Alternatively, an LED such as a micro-LED (Light Emitting Diode) can be used as the light-emitting device.

The display apparatus of this embodiment has a function of detecting light using the light-emitting and light-receiving device. The light-emitting and light-receiving device can detect light having a shorter wavelength than light emitted by the light-emitting and light-receiving device itself.

When the light-emitting and light-receiving device is used as an image sensor, the display apparatus of this embodiment can capture an image using the light-emitting and light-receiving device. For example, the display apparatus of this embodiment can be used as a scanner.

For example, data on a fingerprint, a palm print, or the like can be obtained with use of the image sensor. That is, a biological authentication sensor can be incorporated in the display apparatus of this embodiment. When the display apparatus incorporates a biological authentication sensor, the number of components of an electronic device can be reduced as compared to the case where a biological authentication sensor is provided separately from the display apparatus; thus, the size and weight of the electronic device can be reduced.

In addition, data on facial expression, eye movement, change of the pupil diameter, or the like of the user can be obtained with use of the image sensor. By analysis of the data, information on the user's physical and mental state can be obtained. Changing the output contents of one or both of display and sound on the basis of the data allows the user to safely use a device for VR (Virtual Reality), a device for AR (Augmented Reality), or a device for MR (Mixed Reality), for example.

When the light-emitting and light-receiving device is used as a touch sensor, the display apparatus of this embodiment can detect the approach or touch of an object with the use of the light-emitting and light-receiving device.

The light-emitting and light-receiving device functions as a photoelectric conversion device that detects light entering the light-emitting and light-receiving device and generates electric charge. The amount of generated charge depends on the amount of incident light.

The light-emitting and light-receiving device can be manufactured by adding an active layer of a light-receiving device to the above-described structure of the light-emitting device.

For the light-emitting and light-receiving device, an active layer of a pn photodiode or a pin photodiode can be used, for example.

It is particularly preferable to use, for the light-emitting and light-receiving device, an active layer of an organic photodiode including a layer containing an organic compound. An organic photodiode, which is easily made thin, lightweight, and large in area and has a high degree of freedom for shape and design, can be used in a variety of display apparatuses.

FIG. 1A to FIG. 1D are cross-sectional views of display apparatuses of one embodiment of the present invention.

A display apparatus 50A illustrated in FIG. 1A includes a layer 53 including light-emitting and light-receiving devices and a layer 57 including light-emitting devices, between a substrate 51 and a substrate 59.

Figure 1B:
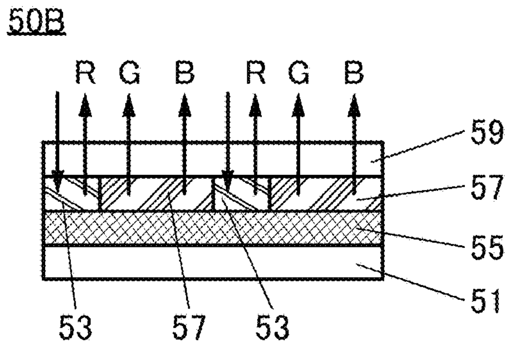

A display apparatus 50B illustrated in FIG. 1B includes the layer 53 including light-emitting and light-receiving devices, a layer 55 including transistors, and the layer 57 including light-emitting devices, between the substrate 51 and the substrate 59.

In the display apparatus 50A and the display apparatus 50B, green (G) light and blue (B) light are emitted from the layer 57 including light-emitting devices, and red (R) light is emitted from the layer 53 including light-emitting and light-receiving devices. In the display apparatus of one embodiment of the present invention, the color of light emitted from the layer 53 including light-emitting and light-receiving devices is not limited to red.

The light-emitting and light-receiving device included in the layer 53 including light-emitting and light-receiving devices can detect light that enters from the outside of the display apparatus 50A or the display apparatus 50B. The light-emitting and light-receiving device can detect one or both of green (G) light and blue (B) light, for example.

The display apparatus of one embodiment of the present invention includes a plurality of pixels arranged in a matrix. One pixel includes one or more subpixels. One subpixel includes one light-emitting and light-receiving device or one light-emitting device. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y). The subpixel of at least one color includes a light-emitting and light-receiving device. The light-emitting and light-receiving device may be provided in all the pixels or in some of the pixels. In addition, one pixel may include a plurality of light-emitting and light-receiving devices.

The layer 55 including transistors includes a transistor electrically connected to the light-emitting and light-receiving device and a transistor electrically connected to the light-emitting device, for example. The layer 55 including transistors may further include a wiring, an electrode, a terminal, a capacitor, a resistor, or the like.

Figure 1C:
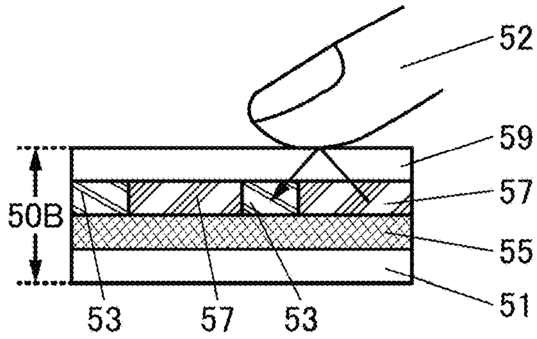
Figure 1D:
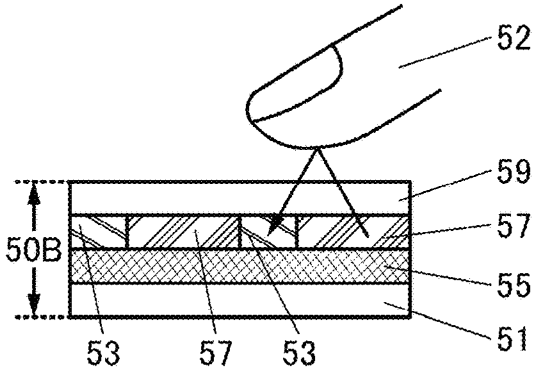

The display apparatus of one embodiment of the present invention may have a function of detecting an object such as a finger that is touching the display apparatus (FIG. 1C). Alternatively, the display apparatus of one embodiment of the present invention may have a function of detecting an object that is approaching (but is not touching) the display apparatus (FIG. 1D). For example, after light emitted by the light-emitting device in the layer 57 including light-emitting devices is reflected by a finger 52 that touches or approaches the display apparatus 50B as illustrated in FIG. 1C and FIG. 1D, the light-emitting and light-receiving device in the layer 53 including light-emitting and light-receiving devices detects the reflected light. Thus, the touch or approach of the finger 52 on/to the display apparatus 50B can be detected.

[Pixel]

Figure 1E:
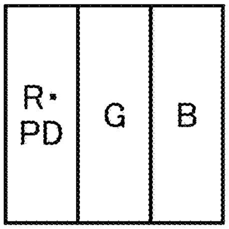
FIG. 1E to FIG. 1G are top views illustrating examples of pixels.
Figure 1F:
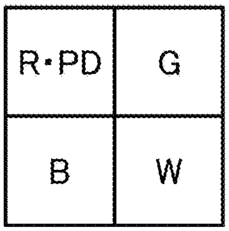
Figure 1G:
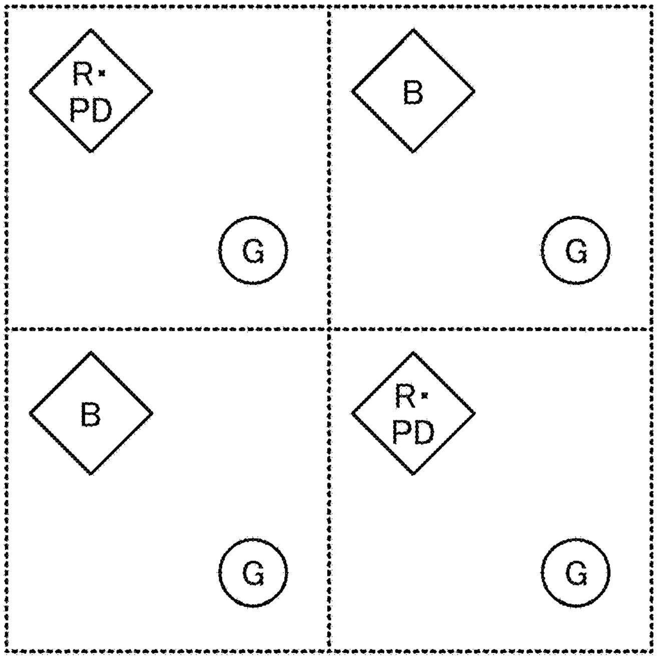

FIG. 1E to FIG. 1G illustrate examples of pixels. Note that the arrangement of subpixels is not limited to the illustrated order. For example, the positions of a subpixel (B) and a subpixel (G) may be reversed.

A pixel illustrated in FIG. 1E employs stripe arrangement and includes a subpixel (R·PD) that exhibits red light and has a light-receiving function, a subpixel (G) that exhibits green light, and a subpixel (B) that exhibits blue light. In a display apparatus including a pixel composed of three subpixels of R, G, and B, a light-emitting device used in the R subpixel can be replaced with a light-emitting and light-receiving device, so that the display apparatus can have a light-receiving function in the pixel.

A pixel illustrated in FIG. 1F employs matrix arrangement and includes a subpixel (R·PD) that exhibits red light and has a light-receiving function, a subpixel (G) that exhibits green light, a subpixel (B) that exhibits blue light, and a subpixel (W) that exhibits white light. Also in a display apparatus including a pixel composed of four subpixels of R, G, B, and W, a light-emitting device used in the R subpixel can be replaced with a light-emitting and light-receiving device, so that the display apparatus can have a light-receiving function in the pixel.

Pixels illustrated in FIG. 1G employ PenTile arrangement and each include subpixels emitting light of two colors that differ among the pixels. The upper-left pixel and the lower-right pixel in FIG. 1G each include a subpixel (R·PD) that exhibits red light and has a light-receiving function and a subpixel (G) that exhibits green light. The lower-left pixel and the upper-right pixel in FIG. 1G each include a subpixel (G) that exhibits green light and a subpixel (B) that exhibits blue light. Note that the shapes of the subpixels illustrated in FIG. 1G each indicate a top surface shape of the light-emitting device or the light-emitting and light-receiving device included in the subpixel.

As described above, the display apparatus of this embodiment can employ any of various types of pixel arrangements. The pixel arrangement in the display apparatus of this embodiment need not be changed when a light-receiving function is incorporated into pixels; thus, the display portion can be provided with one or both of an image capturing function and a sensing function without a reduction in the aperture ratio or resolution.

[Light-Emitting and Light-Receiving Device]

FIG. 2A to FIG. 2E illustrate examples of a stacked-layer structure of the light-emitting and light-receiving device.

The light-emitting and light-receiving device includes at least an active layer and a light-emitting layer between a pair of electrodes.

The light-emitting and light-receiving device may further include, as a layer other than the active layer and the light-emitting layer, a layer containing a substance with a high hole-injection property, a substance with a high hole-transport property, a substance with a high hole-blocking property, a substance with a high electron-transport property, a substance with a high electron-injection property, a substance with a high electron-blocking property, a substance with a bipolar property (a substance with a high electron- and hole-transport property), or the like.

Figure 2A:
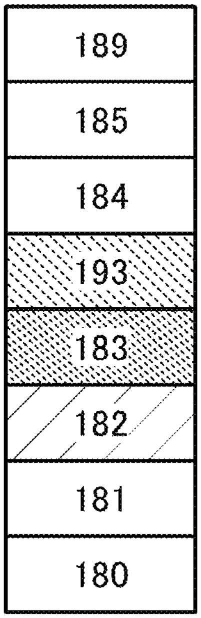
FIG. 2A to FIG. 2E are cross-sectional views illustrating examples of a light-emitting and light-receiving device.
Figure 2B:
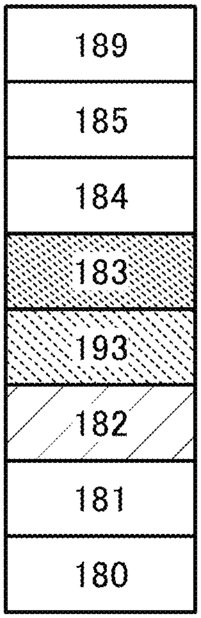
Figure 2C:
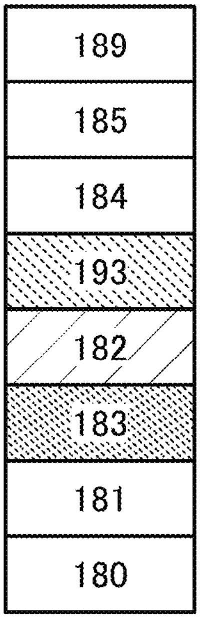

The light-emitting and light-receiving devices illustrated in FIG. 2A to FIG. 2C each include a first electrode 180, a hole-injection layer 181, a hole-transport layer 182, an active layer 183, a light-emitting layer 193, an electron-transport layer 184, an electron-injection layer 185, and a second electrode 189.

Note that each of the light-emitting and light-receiving devices illustrated in FIG. 2A to FIG. 2C can be referred to as a light-emitting device to which the active layer 183 is added. Therefore, the light-emitting and light-receiving device can be formed concurrently with formation of a light-emitting device only by adding a step of forming the active layer 183 in the manufacturing process of the light-emitting device. The light-emitting device and the light-emitting and light-receiving device can be formed over the same substrate. Thus, the display portion can be provided with one or both of an image capturing function and a sensing function without a significant increase in the number of manufacturing steps.

The stacking order of the light-emitting layer 193 and the active layer 183 is not limited. FIG. 2A illustrates an example in which the active layer 183 is provided over the hole-transport layer 182 and the light-emitting layer 193 is provided over the active layer 183. FIG. 2B illustrates an example in which the light-emitting layer 193 is provided over the hole-transport layer 182 and the active layer 183 is provided over the light-emitting layer 193. The active layer 183 and the light-emitting layer 193 may be in contact with each other as illustrated in FIG. 2A and FIG. 2B.

As illustrated in FIG. 2C, a buffer layer is preferably provided between the active layer 183 and the light-emitting layer 193. As the buffer layer, at least one layer of a hole-injection layer, a hole-transport layer, an electron-transport layer, an electron-injection layer, a hole-blocking layer, an electron-blocking layer, and the like can be used. Alternatively, a layer containing a bipolar material may be used as the buffer layer. FIG. 2C illustrates an example in which the hole-transport layer 182 is used as the buffer layer.

The buffer layer provided between the active layer 183 and the light-emitting layer 193 can inhibit transfer of excitation energy from the light-emitting layer 193 to the active layer 183. Furthermore, the buffer layer can also be used to adjust the optical path length (cavity length) of the microcavity structure. Thus, a high emission efficiency can be obtained from the light-emitting and light-receiving device including the buffer layer between the active layer 183 and the light-emitting layer 193.

Figure 2D:
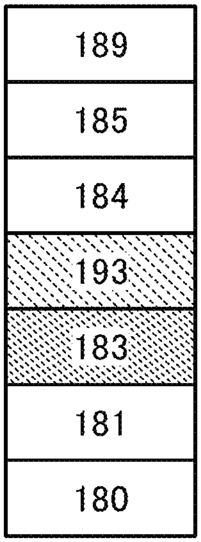

The light-emitting and light-receiving device illustrated in FIG. 2D is different from the light-emitting and light-receiving devices illustrated in FIG. 2A and FIG. 2C in not including the hole-transport layer 182. The light-emitting and light-receiving device may exclude at least one of the hole-injection layer 181, the hole-transport layer 182, the electron-transport layer 184, and the electron-injection layer 185. Furthermore, the light-emitting and light-receiving device may include another functional layer such as a hole-blocking layer or an electron-blocking layer.

Figure 2E:
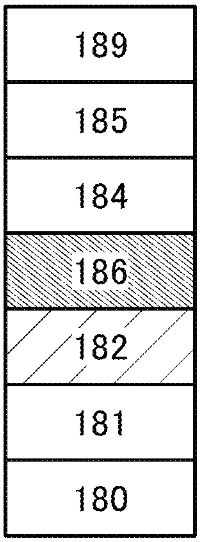

The light-emitting and light-receiving device illustrated in FIG. 2E is different from the light-emitting and light-receiving devices illustrated in FIG. 2A to FIG. 2C in including a layer 186 serving as both a light-emitting layer and an active layer instead of including the active layer 183 and the light-emitting layer 193.

As the layer 186 serving as both a light-emitting layer and an active layer, a layer containing three materials, which are an n-type semiconductor that can be used for the active layer 183, a p-type semiconductor that can be used for the active layer 183, and a light-emitting substance that can be used for the light-emitting layer 193, can be used, for example.

Note that an absorption band on the lowest energy side of an absorption spectrum of a mixed material of the n-type semiconductor and the p-type semiconductor and a maximum peak of an emission spectrum (PL spectrum) of the light-emitting substance preferably do not overlap with each other and are further preferably positioned fully apart from each other.

In the light-emitting and light-receiving device, a conductive film that transmits visible light is used as the electrode through which light is extracted. A conductive film that reflects visible light is preferably used as the electrode through which light is not extracted.

When the light-emitting and light-receiving device is driven as a light-emitting device, the hole-injection layer serves as a layer that injects holes from the anode to the light-emitting and light-receiving device. The hole-injection layer is a layer containing a material with a high hole-injection property. As the material with a high hole-injection property, an aromatic amine compound and a composite material containing a hole-transport material and an acceptor material (electron-accepting material) can be used.

When the light-emitting and light-receiving device is driven as a light-emitting device, the hole-transport layer serves as a layer that transports holes injected from the anode by the hole-injection layer, to the light-emitting layer. When the light-emitting and light-receiving device is driven a light-receiving device, the hole-transport layer serves as a layer that transports holes generated in the active layer on the basis of incident light, to the anode. The hole-transport layer is a layer containing a hole-transport material. As the hole-transport material, a substance with a hole mobility of greater than or equal to $1\times10^{-6}$ $cm^2/Vs$ is preferable. Note that other substances can also be used as long as they have a property of transporting more holes than electrons. As the hole-transport material, materials having a high hole-transport property, such as a π-electron-rich heteroaromatic compound (e.g., a carbazole derivative, a thiophene derivative, and a furan derivative) and an aromatic amine (a compound having an aromatic amine skeleton), are preferable.

When the light-emitting and light-receiving device is driven as a light-emitting device, the electron-transport layer serves as a layer that transports electrons injected from the cathode by the electron-injection layer, to the light-emitting layer. When the light-emitting and light-receiving device is driven as a light-receiving device, the electron-transport layer serves as a layer that transports electrons generated in the active layer on the basis of incident light, to the cathode. The electron-transport layer is a layer containing an electron-transport material. As the electron-transport material, a substance with an electron mobility of greater than or equal to $1\times10^{-6}$ $cm^2/Vs$ is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

When the light-emitting and light-receiving device is driven as a light-emitting device, the electron-injection layer serves as a layer that injects electrons from the cathode to the light-emitting and light-receiving device. The electron-injection layer is a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The light-emitting layer 193 is a layer that contains a light-emitting substance. The light-emitting layer 193 can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material are a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer 193 may contain one or more kinds of organic compounds (e.g., a host material and an assist material) in addition to the light-emitting substance (guest material). As the one or more kinds of organic compounds, one or both of the hole-transport material and the electron-transport material can be used. As the one or more kinds of organic compounds, a bipolar material or a TADF material may be used.

The light-emitting layer 193 preferably includes a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting device can be achieved at the same time.

In the combination of materials for forming an exciplex, the HOMO level (the highest occupied molecular orbital level) of the hole-transport material is preferably higher than or equal to the HOMO level of the electron-transport material. In addition, the LUMO level (the lowest unoccupied molecular orbital level) of the hole-transport material is preferably higher than or equal to that of the electron-transport material. Note that the LUMO levels and the HOMO levels of the materials can be derived from the electrochemical characteristics (the reduction potentials and the oxidation potentials) of the materials that are measured by cyclic voltammetry (CV).

Note that the formation of an exciplex can be confirmed by a phenomenon in which the emission spectrum of a mixed film in which the hole-transport material and the electron-transport material are mixed is shifted to the longer wavelength side than the emission spectrum of each of the materials (or has another peak on the longer wavelength side), observed by comparison of the emission spectra of the hole-transport material, the electron-transport material, and the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by a comparison of the transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed by a comparison of the transient EL of the hole-transport material, the transient EL of the electron-transport material, and the transient EL of the mixed film of these materials.

The active layer 183 contains a semiconductor. Examples of the semiconductor include an inorganic semiconductor such as silicon and an organic semiconductor including an organic compound. This embodiment shows an example in which an organic semiconductor is used as the semiconductor included in the active layer. The use of an organic semiconductor is preferable because the light-emitting layer 193 and the active layer 183 can be formed by the same method (e.g., a vacuum evaporation method) and thus the same manufacturing apparatus can be used.

Examples of an n-type semiconductor material included in the active layer 183 are electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. Although π-electrons widely spread in fullerene having a spherical shape, its electron-accepting property is high. The high electron-accepting property efficiently causes rapid charge separation and is useful for light-receiving devices. Both $C_{60}$ and $C_{70}$ have a wide absorption band in the visible light region, and $C_{70}$ is especially preferable because of having a larger π-electron conjugation system and a wider absorption band in the long wavelength region than $C_{60}$.

Examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of the p-type semiconductor material contained in the active layer 183 include electron-donating organic semiconductor materials such as copper (II) phthalocyanine (CuPc), tetraphenyldibenzoperiflanthene (DBP), zinc phthalocyanine (ZnPc), tin phthalocyanine (SnPc), and quinacridone.

Examples of the p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer 183 is preferably formed by co-evaporation of an n-type semiconductor and a p-type semiconductor.

The layer 186 serving as both a light-emitting layer and an active layer is preferably formed using the above-described light-emitting material, n-type semiconductor, and p-type semiconductor.

The hole-injection layer 181, the hole-transport layer 182, the active layer 183, the light-emitting layer 193, the electron-transport layer 184, the electron-injection layer 185, and the layer 186 serving as both a light-emitting layer and an active layer may be formed using either a low-molecular compound or a high-molecular compound and may contain an inorganic compound. Each layer can be formed by an evaporation method (including a vacuum evaporation method), a transfer method, a printing method, an inkjet method, a coating method, or the like.

The detailed structures of the light-emitting and light-receiving device and the light-emitting device included in the display apparatus of one embodiment of the present invention will be described below with reference to FIG. 3 to FIG. 5.

The display apparatus of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

FIG. 3 to FIG. 5 illustrate top-emission display apparatuses as examples.

Structure Example 1

Figure 3A:
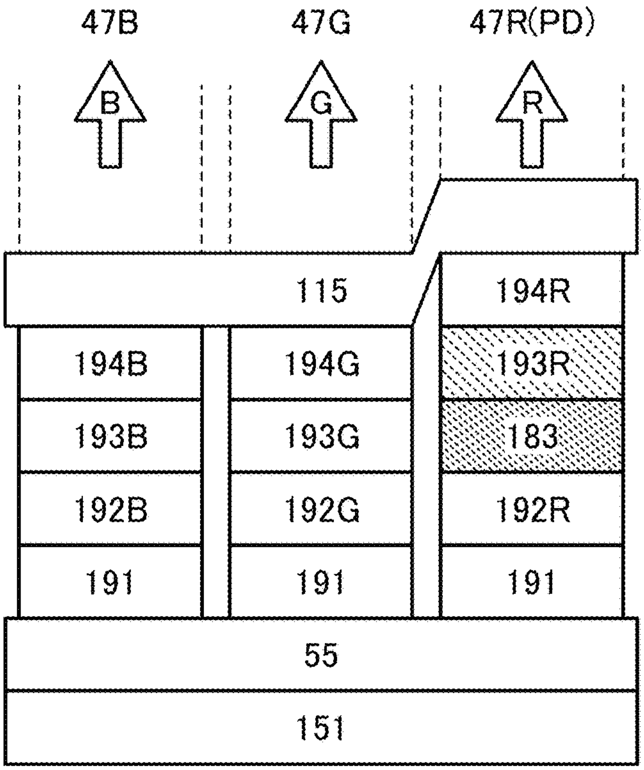
FIG. 3A and FIG. 3B are cross-sectional views each illustrating an example of a display apparatus.
Figure 3B:
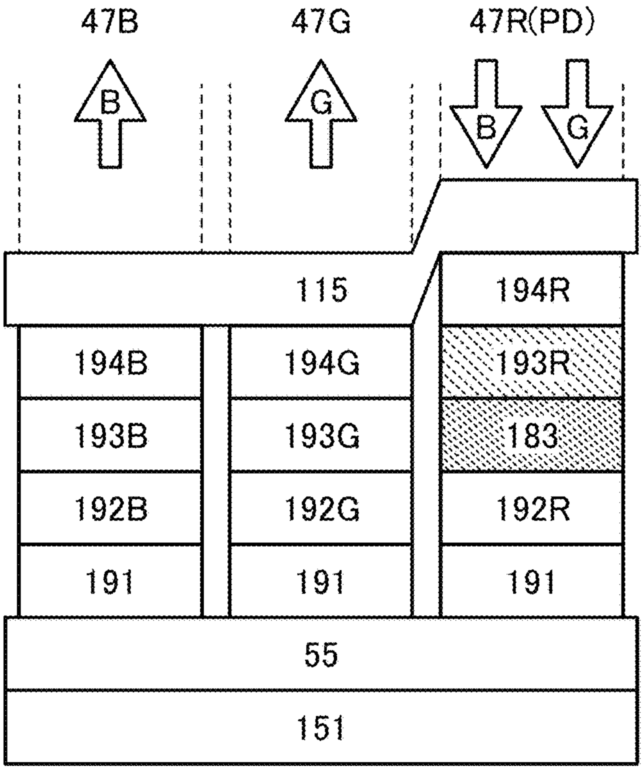

The display apparatus illustrated in FIG. 3A and FIG. 3B includes a light-emitting device 47B emitting blue (B) light, a light-emitting device 47G emitting green (G) light, and a light-emitting and light-receiving device 47R(PD) emitting red (R) light and having a light-receiving function over a substrate 151 with the layer 55 including transistors therebetween.

FIG. 3A illustrates a case where the light-emitting and light-receiving device 47R(PD) functions as a light-emitting device. FIG. 3A illustrates an example in which the light-emitting device 47B emits blue light, the light-emitting device 47G emits green light, and the light-emitting and light-receiving device 47R(PD) emits red light.

FIG. 3B illustrates a case where the light-emitting and light-receiving device 47R(PD) functions as a light-receiving device. FIG. 3B illustrates an example in which the light-emitting and light-receiving device 47R(PD) detects blue light emitted by the light-emitting device 47B and green light emitted by the light-emitting device 47G.

The light-emitting device 47B, the light-emitting device 47G, and the light-emitting and light-receiving device 47R (PD) each include a pixel electrode 191 and a common electrode 115. In this embodiment, the case where the pixel electrode 191 functions as an anode and the common electrode 115 functions as a cathode is described as an example.

In the description made in this embodiment, also in the light-emitting and light-receiving device 47R(PD), the pixel electrode 191 functions as an anode and the common electrode 115 functions as a cathode as in the light-emitting device. In other words, when the light-emitting and light-receiving device 47R(PD) is driven by application of reverse bias between the pixel electrode 191 and the common electrode 115, the light-emitting and light-receiving device 47R(PD) can detect light entering the light-emitting and light-receiving device 47R(PD) and can generate and extract electric charge as current.

The common electrode 115 is shared by the light-emitting device 47B, the light-emitting device 47G, and the light-emitting and light-receiving device 47R(PD). The pixel electrodes 191 included in the light-emitting device 47B, the light-emitting device 47G, and the light-emitting and light-receiving device 47R(PD) are electrically insulated from one another (also referred to as electrically isolated from one another).

The materials, thicknesses, and the like of the pair of electrodes included in the light-emitting device 47B, the light-emitting device 47G, and the light-emitting and light-receiving device 47R(PD) can be equal to one another. Accordingly, the manufacturing cost of the display apparatus can be reduced and the manufacturing process of the display apparatus can be simplified.

The structures of the display apparatuses illustrated in FIG. 3A and FIG. 3B will be specifically described.

The light-emitting device 47B includes a buffer layer 192B, a light-emitting layer 193B, and a buffer layer 194B in this order over the pixel electrode 191. The light-emitting layer 193B contains a light-emitting substance that emits blue light. The light-emitting device 47B has a function of emitting blue light.

The light-emitting device 47G includes a buffer layer 192G, a light-emitting layer 193G, and a buffer layer 194G in this order over the pixel electrode 191. The light-emitting layer 193G contains a light-emitting substance that emits green light. The light-emitting device 47G has a function of emitting green light.

The light-emitting and light-receiving device 47R(PD) includes a buffer layer 192R, the active layer 183, a light-emitting layer 193R, and a buffer layer 194R in this order over the pixel electrode 191. The light-emitting layer 193R contains a light-emitting substance that emits red light. The active layer 183 contains an organic compound that absorbs light having a shorter wavelength than red light (e.g., one or both of green light and blue light). Note that an organic compound that absorbs ultraviolet light as well as visible light may be used for the active layer 183. The light-emitting and light-receiving device 47R(PD) has a function of emitting red light. The light-emitting and light-receiving device 47R(PD) has a function of detecting at least one of light emission of the light-emitting device 47G and light emission of the light-emitting device 47B and preferably has a function of detecting both of them.

The active layer 183 preferably contains an organic compound that does not easily absorb red light and that absorbs light having a shorter wavelength than red light. Thus, the light-emitting and light-receiving device 47R(PD) can have a function of efficiently emitting red light and a function of accurately detecting light having a shorter wavelength than red light.

The pixel electrode 191, the buffer layer 192R, the buffer layer 192G, the buffer layer 192B, the active layer 183, the light-emitting layer 193R, the light-emitting layer 193G, the light-emitting layer 193B, the buffer layer 194R, the buffer layer 194G, the buffer layer 194B, and the common electrode 115 may each have a single-layer structure or a stacked-layer structure.

In each of the display apparatuses in FIG. 3A and FIG. 3B, the buffer layers, the active layer, and the light-emitting layer are separately formed for the devices.

The buffer layers 192R, 192G, and 192B can each include one or both of a hole-injection layer and a hole-transport layer. Furthermore, the buffer layers 192R, 192G, and 192B may each include an electron-blocking layer. The buffer layers 194B, 194G, and 194R can each include one or both of an electron-injection layer and an electron-transport layer. Furthermore, the buffer layers 194R, 194G, and 194B may each include a hole-blocking layer. Note that the above description of the layers included in the light-emitting and light-receiving device can be referred to for materials or the like of the layers included in the light-emitting devices.

Structure Example 2

Figure 4A:
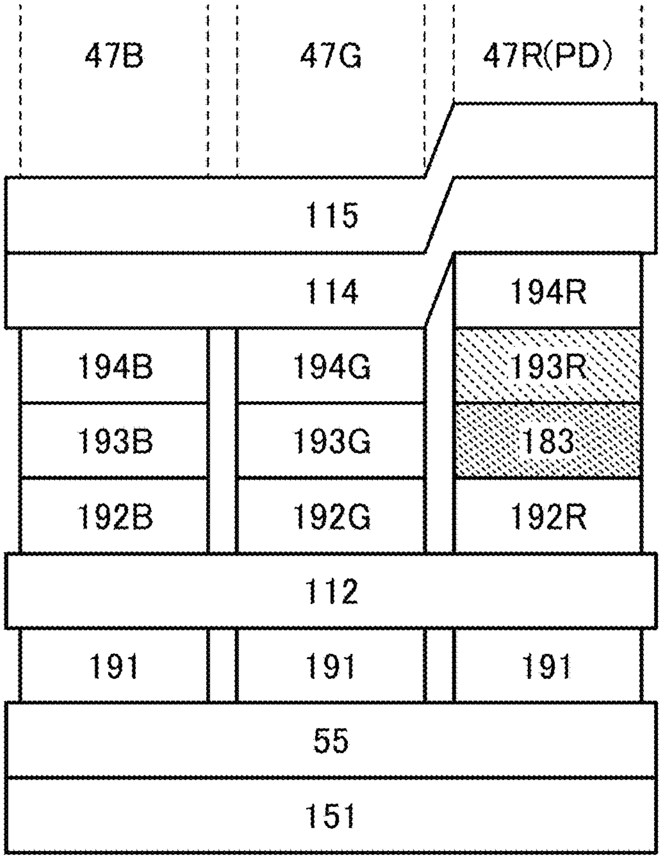
FIG. 4A and FIG. 4B are cross-sectional views each illustrating an example of a display apparatus.
Figure 4B:
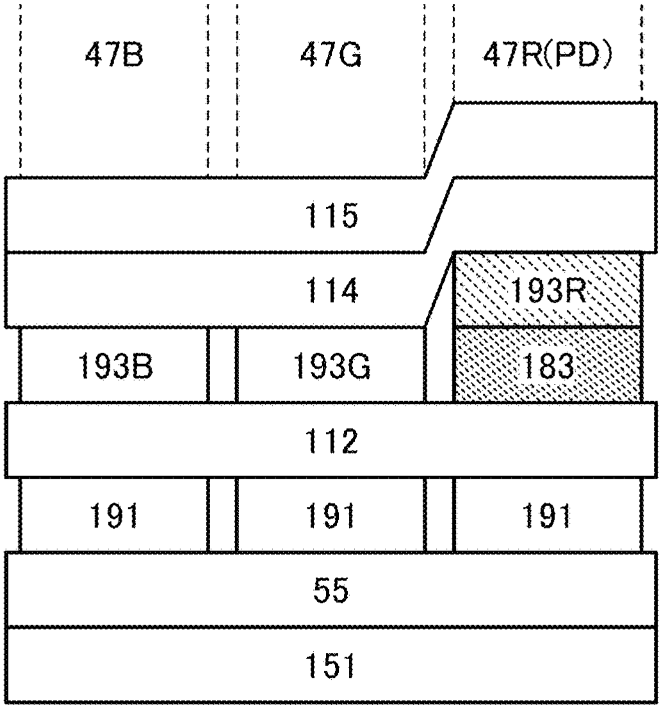

As illustrated in FIG. 4A and FIG. 4B, the light-emitting device 47B, the light-emitting device 47G, and the light-emitting and light-receiving device 47R(PD) may include a common layer between the pair of electrodes. Thus, the light-emitting and light-receiving device can be incorporated into the display apparatus without a significant increase in the number of manufacturing steps.

The light-emitting device 47B, the light-emitting device 47G, and the light-emitting and light-receiving device 47R (PD) illustrated in FIG. 4A include a common layer 112 and a common layer 114 in addition to the structure illustrated in FIG. 3A and FIG. 3B.

The light-emitting device 47B, the light-emitting device 47G, and the light-emitting and light-receiving device 47R (PD) illustrated in FIG. 4B are different from those in the structure illustrated in FIG. 3A and FIG. 3B in that the buffer layers 192R, 192G, and 192B and the buffer layers 194R, 194G, and 194B are not included and the common layer 112 and the common layer 114 are included.

The common layer 112 can include one or both of a hole-injection layer and a hole-transport layer. The common layer 114 can include one or both of an electron-injection layer and an electron-transport layer.

The common layer 112 and the common layer 114 may each have a single-layer structure or a stacked-layer structure.

Structure Example 3

Figure 5A:
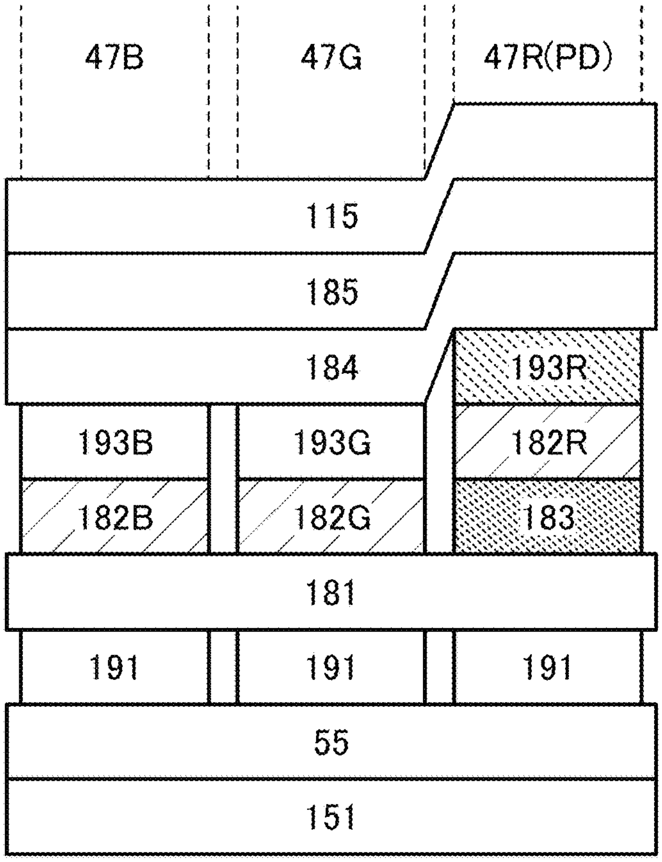
FIG. 5A and FIG. 5B are cross-sectional views each illustrating an example of a display apparatus.

A display apparatus illustrated in FIG. 5A is an example in which the stacked-layer structure illustrated in FIG. 2C is used in the light-emitting and light-receiving device 47R (PD).

The light-emitting and light-receiving device 47R(PD) includes the hole-injection layer 181, the active layer 183, a hole-transport layer 182R, the light-emitting layer 193R, the electron-transport layer 184, the electron-injection layer 185, and the common electrode 115 in this order over the pixel electrode 191.

The hole-injection layer 181, the electron-transport layer 184, the electron-injection layer 185, and the common electrode 115 are common layers to the light-emitting device 47G and the light-emitting device 47B.

The light-emitting device 47G includes the hole-injection layer 181, a hole-transport layer 182G, the light-emitting layer 193G, the electron-transport layer 184, the electron-injection layer 185, and the common electrode 115 in this order over the pixel electrode 191.

The light-emitting device 47B includes the hole-injection layer 181, a hole-transport layer 182B, the light-emitting layer 193B, the electron-transport layer 184, the electron-injection layer 185, and the common electrode 115 in this order over the pixel electrode 191.

The light-emitting device included in the display apparatus of this embodiment preferably employs a microcavity structure. Therefore, one of the pair of electrodes of the light-emitting device is preferably an electrode having properties of transmitting and reflecting visible light (transflective electrode), and the other is preferably an electrode having a property of reflecting visible light (reflective electrode). When the light-emitting device has a microcavity structure, light obtained from the light-emitting layer can be resonated between the electrodes, whereby light emitted from the light-emitting device can be intensified.

Note that the transflective can have a stacked-layer structure of a reflective electrode and an electrode having a property of transmitting visible light (also referred to as a transparent electrode). In this specification and the like, the reflective electrode functioning as part of a transflective electrode may be referred to as a pixel electrode or a common electrode, and the transparent electrode may be referred to as an optical adjustment layer; however, in some cases, the transparent electrode (optical adjustment layer) can also be regarded as having a function of a pixel electrode or a common electrode.

The light transmittance of the transparent electrode is greater than or equal to 40%. For example, the light-emitting device preferably includes an electrode having a visible light (light at wavelengths greater than or equal to 400 nm and less than 750 nm) transmittance of higher than or equal to 40%. The visible light reflectivity of the transflective electrode is higher than or equal to 10% and lower than or equal to 95%, preferably higher than or equal to 30% and lower than or equal to 80%. The reflective electrode has a visible light reflectance of higher than or equal to 40% and lower than or equal to 100%, preferably higher than or equal to 70% and lower than or equal to 100%. These electrodes preferably have a resistivity less than or equal to $1\times10^{-2}$ Ωcm. Note that in the case where a light-emitting device that emits near-infrared light is used in the display apparatus, the near-infrared light (light at wavelengths greater than or equal to 750 nm to less than or equal to 1300 nm) transmittance and reflectivity of these electrodes are preferably in the above ranges.

The hole-transport layers 182B, 182G, and 182R may each have a function of an optical adjustment layer. Specifically, the thickness of the hole-transport layer 182B is preferably adjusted such that the optical distance between the pair of electrodes in the light-emitting device 47B intensifies blue light. Similarly, the thickness of the hole-transport layer 182G is preferably adjusted such that the optical distance between the pair of electrodes in the light-emitting device 47G intensifies green light. The thickness of the hole-transport layer 182R is preferably adjusted such that the optical distance between the pair of electrodes in the light-emitting and light-receiving device 47R(PD) intensifies red light. The layer used as the optical adjustment layer is not limited to the hole-transport layer. Note that when the transflective electrode has a stacked-layer structure of a reflective electrode and a transparent electrode, the optical path length between the pair of electrodes represents the optical path length between a pair of reflective electrodes.

Structure Example 4

Figure 5B:
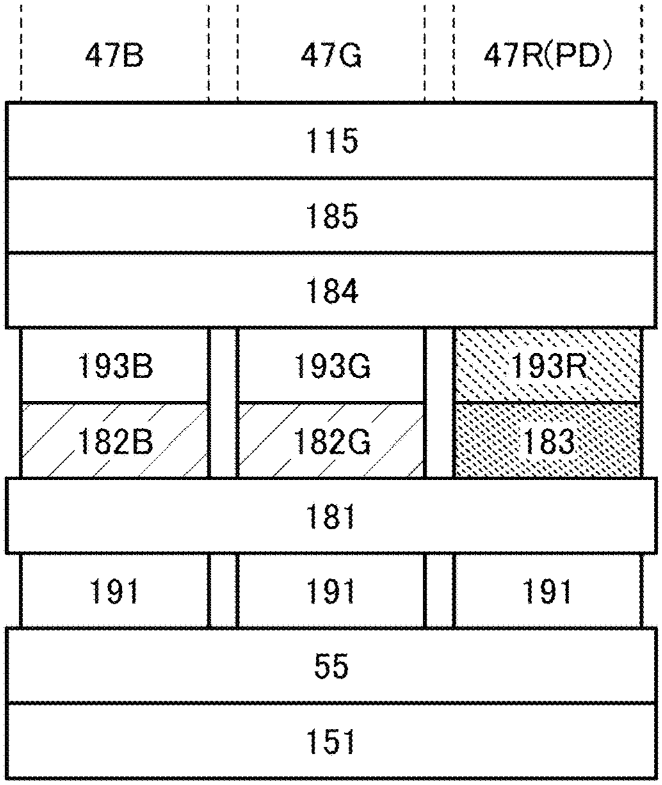

A display apparatus illustrated in FIG. 5B is an example in which the stacked-layer structure illustrated in FIG. 2D is used in the light-emitting and light-receiving device 47R (PD).

The light-emitting and light-receiving device 47R(PD) includes the hole-injection layer 181, the active layer 183, the light-emitting layer 193R, the electron-transport layer 184, the electron-injection layer 185, and the common electrode 115 in this order over the pixel electrode 191.

The hole-injection layer 181, the electron-transport layer 184, the electron-injection layer 185, and the common electrode 115 are common layers to the light-emitting device 47G and the light-emitting device 47B.

The light-emitting device 47G includes the hole-injection layer 181, the hole-transport layer 182G, the light-emitting layer 193G, the electron-transport layer 184, the electron-injection layer 185, and the common electrode 115 in this order over the pixel electrode 191.

The light-emitting device 47B includes the hole-injection layer 181, the hole-transport layer 182B, the light-emitting layer 193B, the electron-transport layer 184, the electron-injection layer 185, and the common electrode 115 in this order over the pixel electrode 191.

The hole-transport layer is provided in the light-emitting device 47G and the light-emitting device 47B and is not provided in the light-emitting and light-receiving device 47R(PD). In this manner, a layer provided in only one of the light-emitting devices and the light-emitting and light-receiving device may exist in addition to the active layer and the light-emitting layer.

More detailed structures of the display apparatus of one embodiment of the present invention will be described below with reference to FIG. 6 to FIG. 10.

[Display Apparatus 10A]

Figure 6A:
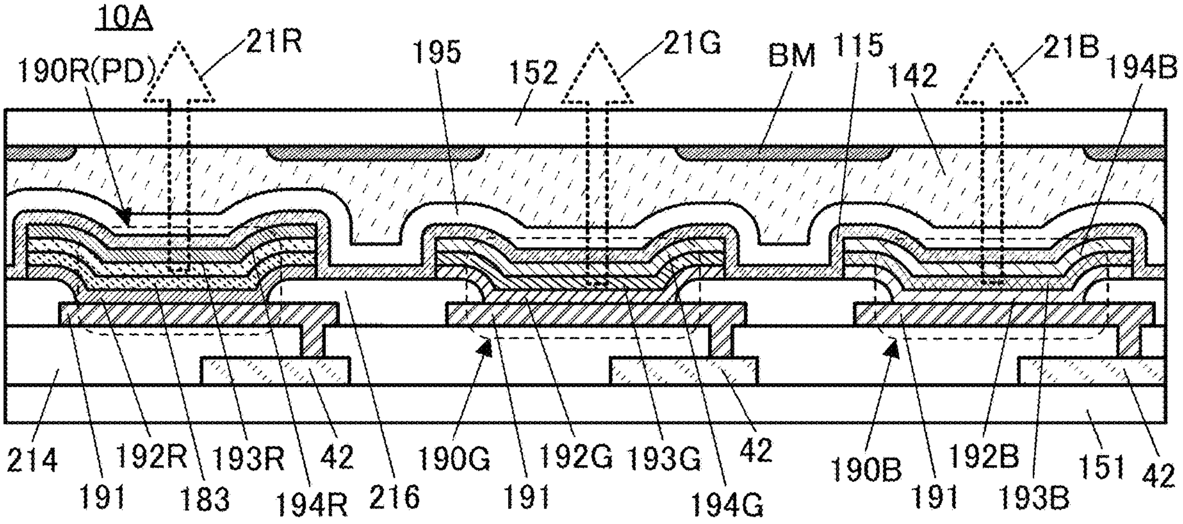
FIG. 6A and FIG. 6B are cross-sectional views illustrating an example of a display apparatus.
Figure 6B:
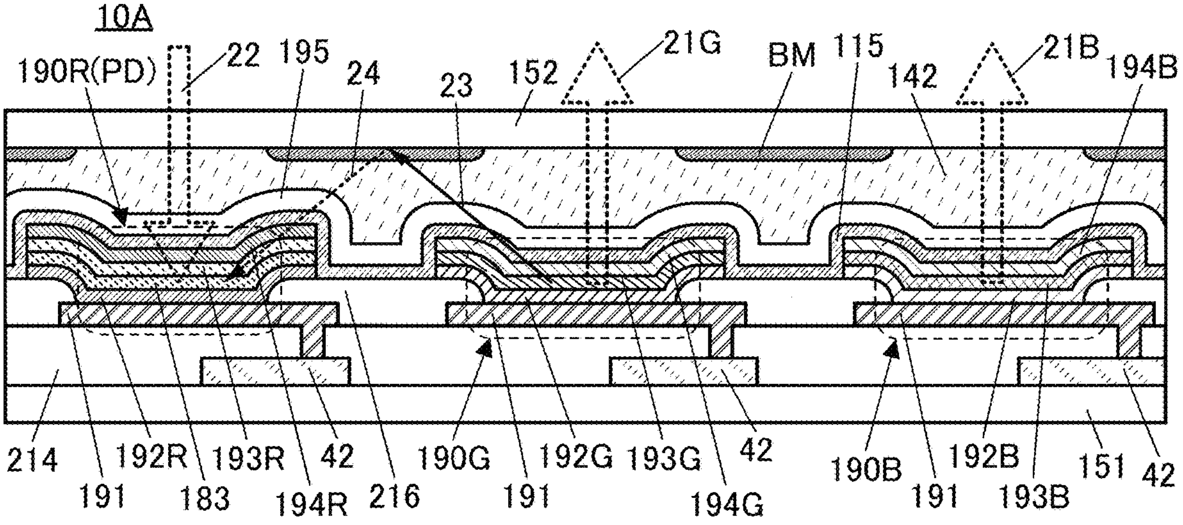

FIG. 6A and FIG. 6B each illustrate a cross-sectional view of a display apparatus 10A.

The display apparatus 10A includes a light-emitting device 190B, a light-emitting device 190G, and a light-emitting and light-receiving device 190R(PD).

The light-emitting device 190B includes the pixel electrode 191, the buffer layer 192B, the light-emitting layer 193B, the buffer layer 194B, and the common electrode 115. The light-emitting device 190B has a function of emitting blue light 21B.

The light-emitting device 190G includes the pixel electrode 191, the buffer layer 192G, the light-emitting layer 193G, the buffer layer 194G, and the common electrode 115. The light-emitting device 190G has a function of emitting green light 21G.

The light-emitting and light-receiving device 190R(PD) includes the pixel electrode 191, the buffer layer 192R, the active layer 183, the light-emitting layer 193R, the buffer layer 194R, and the common electrode 115. The light-emitting and light-receiving device 190R(PD) has a function of emitting red light 21R and a function of detecting light 22.

FIG. 6A illustrates a case where the light-emitting and light-receiving device 190R(PD) functions as a light-emitting device. FIG. 6A illustrates an example in which the light-emitting device 190B emits blue light, the light-emitting device 190G emits green light, and the light-emitting and light-receiving device 190R(PD) emits red light.

FIG. 6B illustrates a case where the light-emitting and light-receiving device 190R(PD) functions as a light-receiving device. FIG. 6B illustrates an example in which the light-emitting and light-receiving device 190R(PD) detects blue light emitted by the light-emitting device 190B and green light emitted by the light-emitting device 190G.

The pixel electrode 191 is positioned over an insulating layer 214. An end portion of the pixel electrode 191 is covered a partition 216. Two adjacent pixel electrodes 191 are electrically insulated (electrically isolated) from each other by the partition 216.

An organic insulating film is suitable for the partition 216. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. The partition 216 is a layer that transmits visible light. Although the details will be described later, a partition 217 that blocks visible light may be provided in place of the partition 216.

The display apparatus 10A includes the light-emitting and light-receiving device 190R(PD), the light-emitting device 190G, the light-emitting device 190B, a transistor 42, and the like between a pair of substrates (the substrate 151 and a substrate 152).

The light-emitting and light-receiving device 190R(PD) has a function of detecting light. Specifically, the light-emitting and light-receiving device 190R(PD) is a photoelectric conversion device that receives the light 22 entering from the outside of the display apparatus 10A and converts it into an electric signal. The light 22 can also be referred to as light that has been emitted from one or both of the light-emitting device 190G and the light-emitting device 190B and reflected by an object. The light 22 may enter the light-emitting and light-receiving device 190R(PD) through a lens.

The light-emitting device 190G and the light-emitting device 190B (which will be collectively referred to as a light-emitting device 190) have a function of emitting visible light. Specifically, the light-emitting device 190 is an electroluminescent device that emits light toward the substrate 152 (see light 21G and light 21B) when voltage is applied between the pixel electrode 191 and the common electrode 115.

The buffer layer 192, the light-emitting layer 193, and the buffer layer 194 can also be referred to an organic layer (a layer containing an organic compound) or an EL layer. The pixel electrode 191 preferably has a function of reflecting visible light. The common electrode 115 has a function of transmitting visible light.

The pixel electrode 191 is electrically connected to a source or a drain of the transistor 42 through an opening provided in the insulating layer 214. The transistor 42 has a function of controlling the driving of the light-emitting device or the light-emitting and light-receiving device.

At least part of a circuit electrically connected to the light-emitting and light-receiving device 190R(PD) is preferably formed using the same material in the same steps as a circuit electrically connected to the light-emitting device 190 of each color. In that case, the thickness of the display apparatus can be reduced compared with the case where the two circuits are separately formed, resulting in simplification of the manufacturing steps.

The light-emitting and light-receiving device 190R(PD) and the light-emitting device 190 of each color are preferably covered with a protective layer 195. In FIG. 6A and the like, the protective layer 195 is provided on and in contact with the common electrode 115. Providing the protective layer 195 can inhibit entry of impurities such as the light-emitting and light-receiving device 190R(PD) and the light-emitting device of each color, so that the light-emitting and light-receiving device 190R(PD) and the light-emitting device of each color can be increased. The protective layer 195 and the substrate 152 are bonded to each other with an adhesive layer 142.

A light-blocking layer BM is provided on a surface of the substrate 152 on the substrate 151 side. The light-blocking layer BM has an opening at the position overlapping with the light-emitting device 190 of each color and an opening at the position overlapping with the light-emitting and light-receiving device 190R(PD). Note that in this specification and the like, the position overlapping with the light-emitting device 190 refers specifically to a position overlapping with a light-emitting region of the light-emitting device 190. Similarly, the position overlapping with the light-emitting and light-receiving device 190R(PD) refers specifically to a position overlapping with a light-emitting region and a light-receiving region of the light-emitting and light-receiving device 190R(PD).

As illustrated in FIG. 6B, the light-emitting and light-receiving device 190R(PD) can detect light that has been emitted by the light-emitting device 190 and reflected by the object. However, in some cases, light emitted by the light-emitting device 190 is reflected inside the display apparatus 10A and enters the light-emitting and light-receiving device 190R(PD) without via an object. The light-blocking layer BM can reduce the influence of such stray light. For example, in the case where the light-blocking layer BM is not provided, light 23 emitted by the light-emitting device 190G is reflected by the substrate 152 and reflected light 24 enters the light-emitting and light-receiving device 190R(PD) in some cases. Providing the light-blocking layer BM can inhibit entry of the reflected light 24 into the light-emitting and light-receiving device 190R(PD). Thus, noise can be reduced, and the sensitivity of a sensor using the light-emitting and light-receiving device 190R(PD) can be increased.

For the light-blocking layer BM, a material that blocks light emitted from the light-emitting device can be used. The light-blocking layer BM preferably absorbs visible light. As the light-blocking layer BM, a black matrix can be formed using a metal material or a resin material containing pigment (e.g., carbon black) or dye, for example. The light-blocking layer BM may have a stacked-layer structure of a red color filter, a green color filter, and a blue color filter.

[Display Apparatus 10B]

Figure 7A:
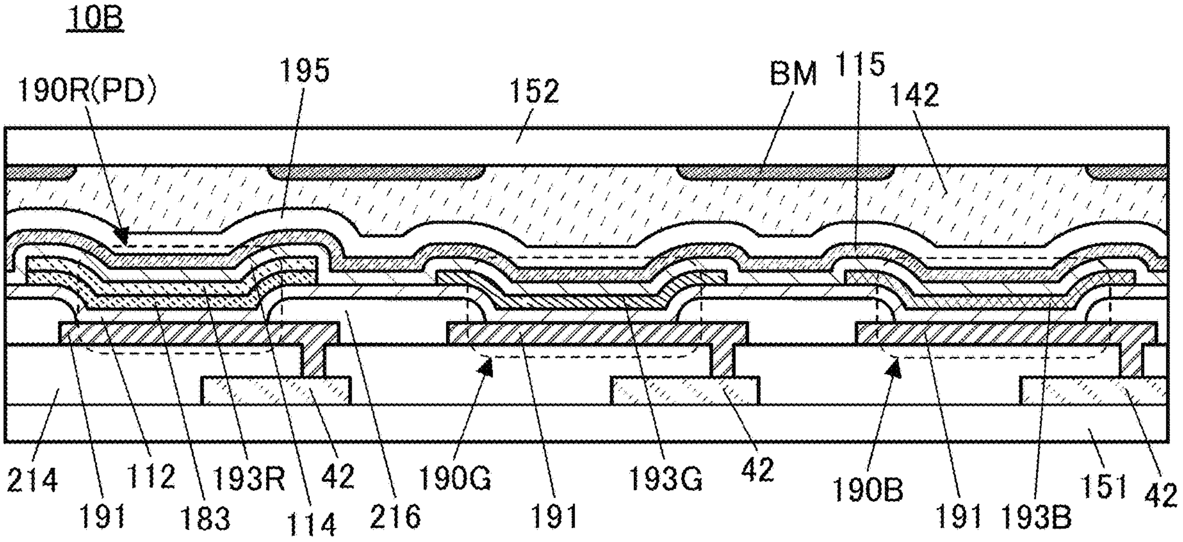
FIG. 7A and FIG. 7B are cross-sectional views each illustrating an example of a display apparatus.

A display apparatus 10B illustrated in FIG. 7A is different from the display apparatus 10A in that each of the light-emitting device 190 and the light-emitting and light-receiving device 190R(PD) does not include the buffer layer 192 or the buffer layer 194 and includes the common layer 112 and the common layer 114. Note that in the description of the display apparatus below, components similar to those of the above-mentioned display apparatus are not described in some cases.

Note that the stacked-layer structure of the light-emitting device 190B, the light-emitting device 190G, and the light-emitting and light-receiving device 190R(PD) is not limited to the structures of the display apparatuses 10A and 10B. For example, any of the stacked-layer structures illustrated in FIG. 2 to FIG. 5 can be used for each device, as appropriate.

[Display Apparatus 10C]

Figure 7B:
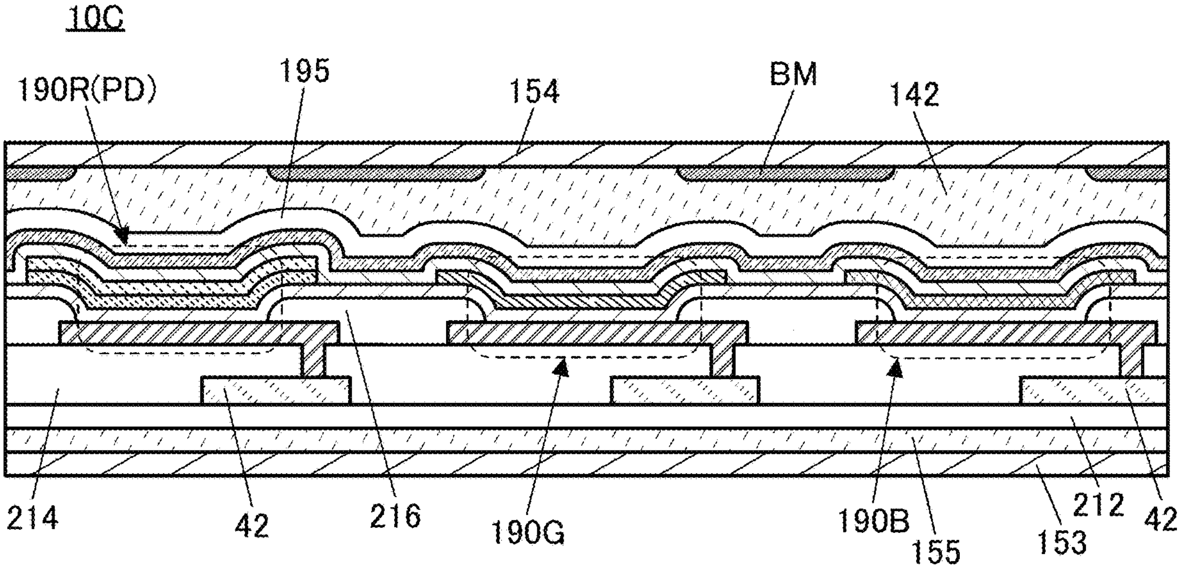

A display apparatus 10C illustrated in FIG. 7B is different from the display apparatus 10B in that the substrate 151 and the substrate 152 are not included but a substrate 153, a substrate 154, an adhesive layer 155, and an insulating layer 212 are included.

The substrate 153 and the insulating layer 212 are bonded to each other with the adhesive layer 155. The substrate 154 and the protective layer 195 are bonded to each other with the adhesive layer 142.

The display apparatus 10C is formed in such a manner that the insulating layer 212, the transistor 42, the light-emitting and light-receiving device 190R(PD), the light-emitting device 190, and the like that are formed over a formation substrate are transferred onto the substrate 153. The substrate 153 and the substrate 154 preferably have flexibility. Accordingly, the flexibility of the display apparatus 10C can be increased. For example, a resin is preferably used for each of the substrate 153 and the substrate 154.

each of the substrate 153 and the substrate 154, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 153 and the substrate 154.

As the substrate included in the display apparatus of this embodiment, a film having high optical isotropy may be used. Examples of the film having high optical isotropy include a triacetyl cellulose (TAC, also referred to as cellulose triacetate) film, a cycloolefin polymer (COP) film, a cycloolefin copolymer (COC) film, and an acrylic film.

[Display Apparatus 10D]

Figure 8A:
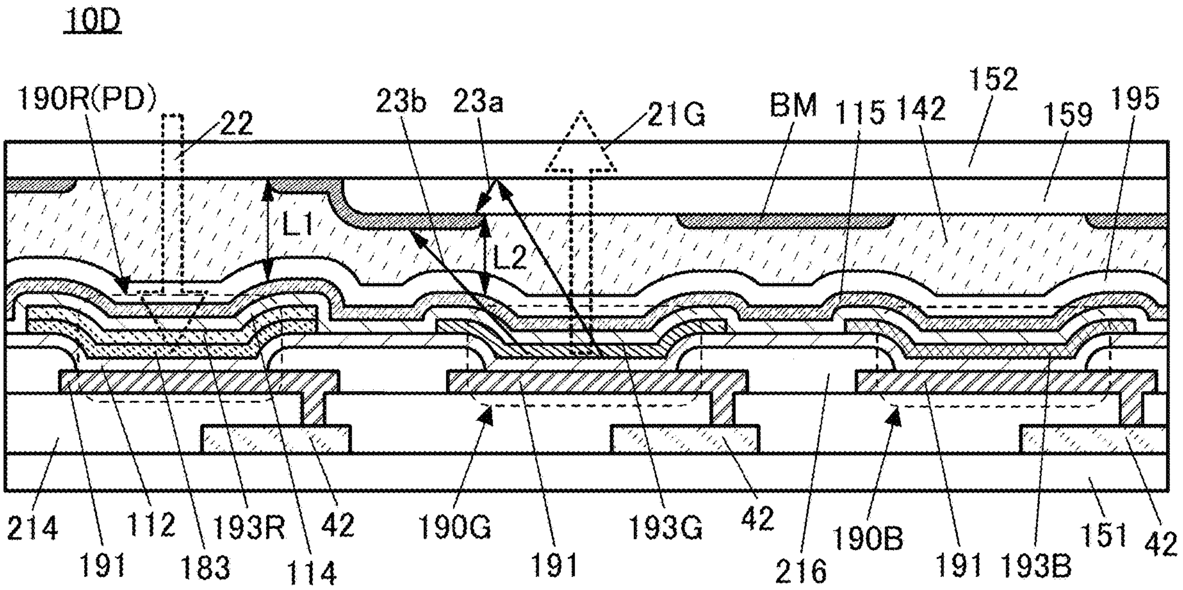
FIG. 8A is a cross-sectional view illustrating an example of a display apparatus.

FIG. 8A is a cross-sectional view of a display apparatus 10D.

The light-emitting and light-receiving device detects light that has been emitted by the light-emitting device and then reflected by an object. However, in some cases, light emitted by the light-emitting device is reflected inside the display apparatus and enters the light-emitting and light-receiving device without via an object. Such stray light ends up as noise in light detection, which is a factor reducing an S/N ratio (signal-to-noise ratio). When the light-blocking layer BM is provided on a surface closer to the display surface than the surface where the light-emitting device and the light-emitting and light-receiving device are provided, the influence of stray light can be inhibited. Thus, noise can be reduced, and the sensitivity of the sensor using the light-emitting and light-receiving device can be increased.

As the light-blocking layer BM is positioned closer to the light-emitting device, stray light from the light-emitting device inside the display apparatus can be reduced and the sensitivity of the sensor can be increased. On the other hand, as the light-blocking layer BM is positioned further from the light-emitting and light-receiving device, the area of the imaging range of the light-emitting and light-receiving device can be smaller, and the imaging resolution can be higher.

Therefore, a component (e.g., a resin layer) may be provided on a surface where the light-blocking layer is formed, to cause a difference between the distance from the light-blocking layer BM to the light-emitting and light-receiving device and the distance from the light-blocking layer BM to the light-emitting device. Adjusting the layout and thickness of the component can increase the distance from the light-blocking layer BM to the light-emitting and light-receiving device and reduce the distance from the light-blocking layer BM to the light-emitting device. Accordingly, noise of the sensor can be reduced and the imaging resolution can be increased.

Note that when the difference between the distance from the light-blocking layer BM to the light-emitting and light-receiving device and the distance from the light-blocking layer BM to the light-emitting device is too large, the viewing angle dependence varies depending on the colors. Therefore, the layout and thickness of the component are preferably adjusted in accordance with the usage of the display apparatus as long as the display quality and the imaging quality are kept in balance.

The display apparatus 10D is different from the display apparatus 10A in including a resin layer 159.

The resin layer 159 is provided on a surface of the substrate 152 on the substrate 151 side. The resin layer 159 is provided at the position overlapping with the light-emitting device 190G and the position overlapping with light-emitting device 190B and is not provided at the position overlapping with the light-emitting and light-receiving device 190R(PD).

Figure 8B:
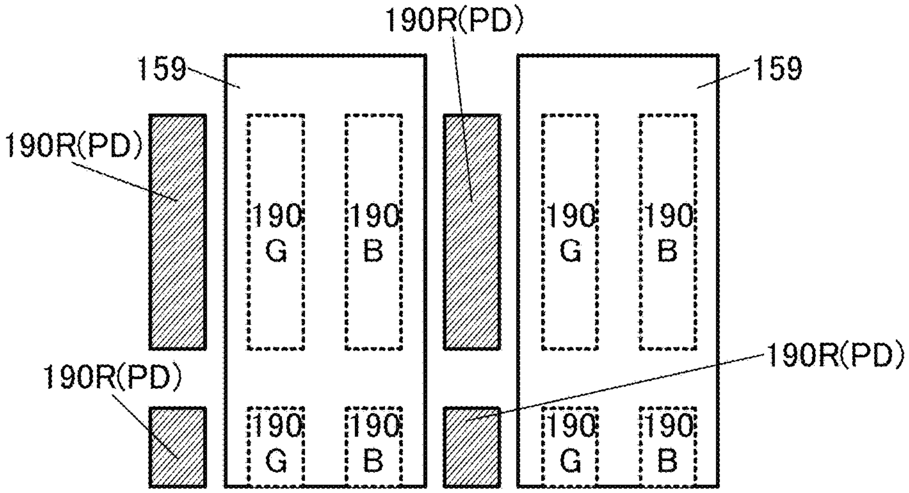
FIG. 8B and FIG. 8C are diagrams each illustrating an example of a top layout of a resin layer.
Figure 8C:
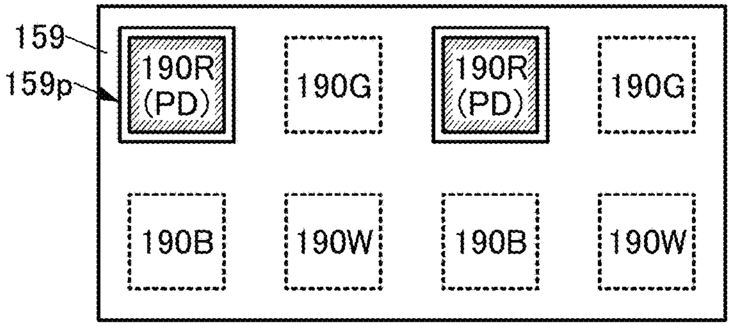

For example, as illustrated in FIG. 8B, the resin layer 159 can be provided to have an island shape at the position overlapping with the light-emitting device 190G and the position overlapping with the light-emitting device 190B and is not provided at the position overlapping with the light-emitting and light-receiving device 190R(PD). Alternatively, the resin layer 159 can be provided at the position overlapping with the light-emitting device 190G and the position overlapping with the light-emitting device 190B and have an opening 159*p* at the position overlapping with the light-emitting and light-receiving device 190R(PD), as illustrated in FIG. 8C, for example.

The light-blocking layer BM is provided on the surface of the substrate 152 on the substrate 151 side and on a surface of the resin layer 159 on the substrate 151 side. The light-blocking layer BM includes openings in the position overlapping with the light-emitting device 190B, the position overlapping with the light-emitting device 190G, and the position overlapping with the light-emitting and light-receiving device 190R(PD).

For example, the light-blocking layer BM can absorb stray light 23*a* that has passed through the resin layer 159 and has been reflected by the surface of the substrate 152 on the substrate 151 side. Moreover, the light-blocking layer BM can absorb stray light 23*b* before the stray light 23*b* reaches the resin layer 159. Thus, stray light incident on the light-emitting and light-receiving device 190R(PD) can be reduced. Consequently, noise can be reduced, and the sensitivity of the sensor using the light-emitting and light-receiving device 190R(PD) can be increased. It is particularly preferable that the light-blocking layer BM be positioned close to the light-emitting device 190, in which case stray light can be further reduced. This is preferable also in terms of display quality, because the light-blocking layer BM provided close to the light-emitting device 190 can reduce viewing angle dependence of display.

Providing the light-blocking layer BM can control the range where the light-emitting and light-receiving device 190R(PD) detects light. When the light-blocking layer BM is positioned apart from the light-emitting and light-receiving device 190R(PD), the imaging range is narrowed, and the imaging resolution can be increased.

In the case where the resin layer 159 has an opening, the light-blocking layer BM preferably covers at least part of the opening and at least part of a side surface of the resin layer 159 exposed in the opening.

In the case where the resin layer 159 is provided in an island shape, the light-blocking layer BM preferably covers at least part of a side surface of the resin layer 159.

Since the light-blocking layer BM is provided along the shape of the resin layer 159 in such a manner, the distance from the light-blocking layer BM to the light-emitting device 190 (specifically, the light-emitting region of the light-emitting device 190) is shorter than the distance from the light-blocking layer BM to the light-emitting and light-receiving device 190R(PD) (specifically, the light-receiving region of the light-emitting and light-receiving device 190R (PD)). Accordingly, noise of the sensor can be reduced, the imaging resolution can be increased, and viewing angle dependence of display can be inhibited. Thus, both the display quality and imaging quality of the display apparatus can be increased.

The resin layer 159 transmits light emitted by the light-emitting device 190. Examples of materials for the resin layer 159 include an acrylic resin, a polyimide resin, an epoxy resin, a polyamide resin, a polyimide-amide resin, a siloxane resin, a benzocyclobutene-based resin, a phenol resin, and precursors of these resins. Note that a component provided between the substrate 152 and the light-blocking layer BM is not limited to the resin layer and may be an inorganic insulating film or the like. As the component becomes thicker, a larger difference occurs between the distance from the light-blocking layer to the light-emitting and light-receiving device 190R(PD) and the distance from the light-blocking layer to the light-emitting device 190. An organic insulating film such as a resin or the like is suitable for the component because it is easily formed to have a large thickness.

In order to compare the distance from the light-blocking layer BM to the light-emitting and light-receiving device 190R(PD) and the distance from the light-blocking layer BM to the light-emitting device 190, it is possible to use, for example, the shortest distance L1 from an end portion of the light-blocking layer BM on the light-emitting and light-receiving device 190R(PD) side to the common electrode 115 and the shortest distance L2 from an end portion of the light-blocking layer BM on the light-emitting device 190 side to the common electrode 115. With the shortest distance L2 smaller than the shortest distance L1, stray light from the light-emitting device 190 can be reduced, and the sensitivity of the sensor using the light-emitting and light-receiving device 190R(PD) can be increased. With the shortest distance L1 larger than the shortest distance L2, the imaging range of the light-emitting and light-receiving device 190R (PD) can be narrowed, and the imaging resolution can be increased.

In addition, when the adhesive layer 142 is provided such that a portion overlapping with the light-emitting and light-receiving device 190R(PD) is made thicker than a portion overlapping with the light-emitting device 190, a difference can occur between the distance from the light-blocking layer BM to the light-emitting and light-receiving device 190R (PD) and the distance from the blocking layer BM to the light-emitting device 190.

[Display Apparatus 10E]

Figure 9A:
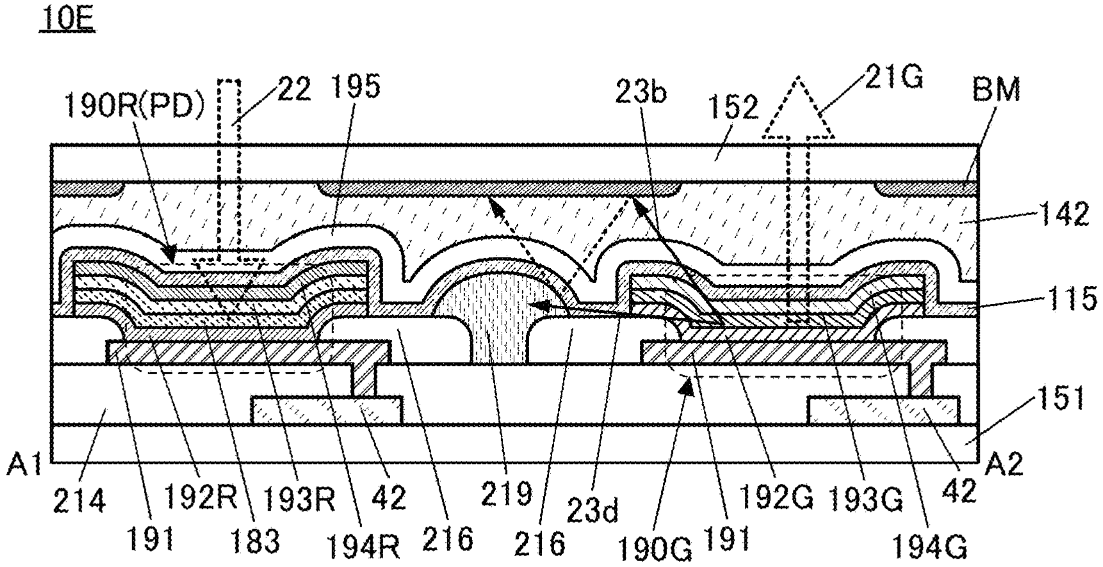
FIG. 9A is a cross-sectional view illustrating an example of a display apparatus.

FIG. 9A illustrates a cross-sectional view of a display apparatus 10E. FIG. 9A corresponds to a cross-sectional view taken along dashed-dotted line A1-A2 in each of top views illustrated in FIG. 9B and FIG. 9C.

In a top view (also referred to as a plan view), a light-blocking layer 219 is provided between the light-emitting and light-receiving device 190R(PD) and the light-emitting device 190G. Similarly, the light-blocking layer 219 is also provided between the light-emitting and light-receiving device 190R(PD) and the light-emitting device 190B. Providing the light-blocking layer between the light-emitting and light-receiving device 190R(PD) and the light-emitting device 190 can inhibit stray light from entering the light-emitting and light-receiving device 190R(PD).

Figure 9B:
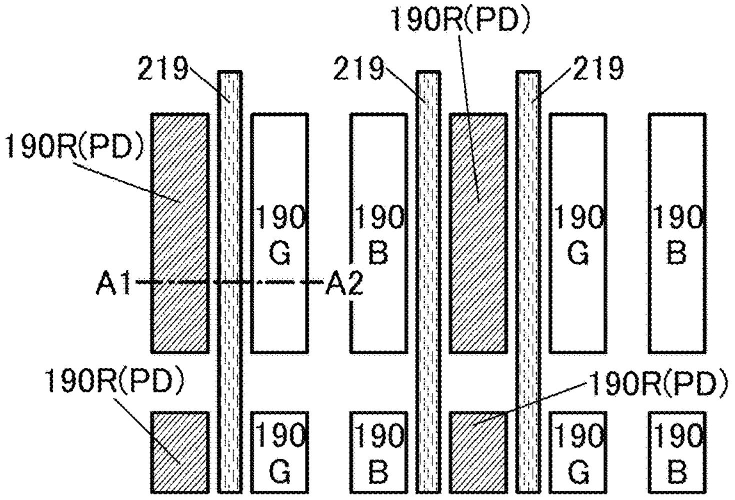
FIG. 9B and FIG. 9C are diagrams each illustrating an example of a top layout of a light-blocking layer.
Figure 9C:
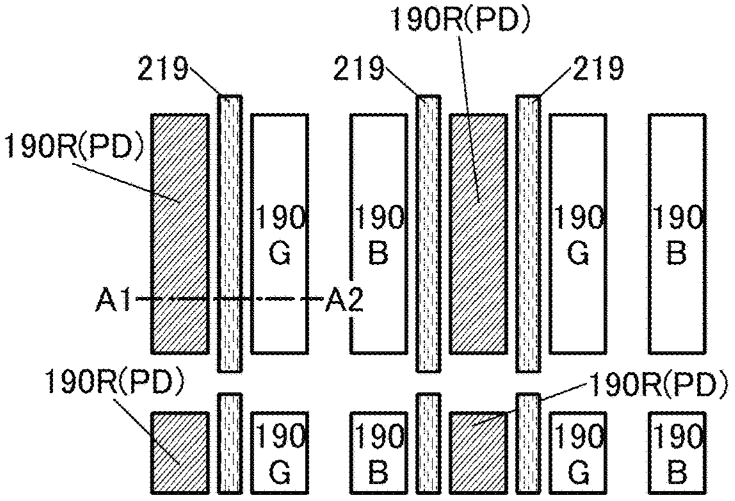

The light-blocking layer 219 may be adjacent to a plurality of light-emitting and light-receiving devices 190R (PD) as illustrated in FIG. 9B and may be adjacent to one light-emitting and light-receiving device 190R(PD) as illustrated in FIG. 9C.

As illustrated in FIG. 9A, the partition 216 has an opening between the light-emitting and light-receiving device 190R (PD) and the light-emitting device 190G. The light-blocking layer 219 is provided to cover the opening. The light-blocking layer 219 preferably covers the opening of the partition 216 and a side surface of the partition 216 exposed in the opening. Furthermore, the light-blocking layer 219 preferably covers at least part of the top surface of the partition 216.

Although the light-blocking layer 219 can be provided over the partition 216 that is not provided with an opening, there is a possibility that stray light passes through the partition 216 and enters the light-emitting and light-receiving device 190R(PD). When the partition 216 is provided with an opening and the light-blocking layer 219 is provided to fill the opening, stray light that passes through the partition 216 is absorbed by the light-blocking layer 219 in the opening of the partition 216. This can inhibit entry of stray light into to the light-emitting and light-receiving device 190R(PD).

The light-blocking layer 219 preferably has a forward tapered shape. Note that an angle (taper angle) between the side surface and the bottom surface of the layer having the forward tapered shape is greater than 0° and less than 90°. This can improve the coverage with the films provided over the light-blocking layer 219 (e.g., the common electrode 115 and the protective layer 195).

The light-blocking layer 219 preferably absorbs at least a wavelength of light that is detected by the light-emitting and light-receiving device 190R(PD). For example, in the case where the light-emitting and light-receiving device 190R (PD) detects green light emitted by the light-emitting device 190G, the light-blocking layer 219 preferably absorbs at least green light. For example, when the light-blocking layer 219 includes a red color filter, the light-blocking layer 219 can absorb green light and thus reflected light can be inhibited from entering the light-emitting and light-receiving device 190R(PD). The light-blocking layer 219 may be a black matrix formed using a resin material containing a pigment or dye, for example. The light-blocking layer 219 may have a stacked-layer structure of a red color filter, a green color filter, and a blue color filter. Alternatively, as the light-blocking layer 219, a colored insulating layer may be formed using a brown resist material.

For example, when the light-emitting and light-receiving device 190R(PD) detects green light emitted by the light-emitting device 190G, in some cases, light emitted by the light-emitting device 190G is reflected by the substrate 152 and the partition 216, and the reflected light enters the light-emitting and light-receiving device 190R(PD). In other cases, light emitted by the light-emitting device 190G passes through the partition 216 and is reflected by the transistor, the wiring, or the like, and thus the reflected light enters the light-emitting and light-receiving device 190R(PD). In the display apparatus 10E, such reflected light can be inhibited from entering the light-emitting and light-receiving device 190R(PD) because light is absorbed by the light-blocking layer BM and the light-blocking layer 219. Thus, noise can be reduced, and the sensitivity of the sensor using the light-emitting and light-receiving device 190R(PD) can be increased.

For example, the light-blocking layer BM can absorb most of the stray light 23*b* before the stray light 23*b* reaches the substrate 152. Furthermore, even when a part of the stray light 23*b* is reflected by the light-blocking layer BM, the light-blocking layer 219 absorbs the stray light 23*b*, thereby inhibiting entry of the stray light 23*b* into the transistor, the wiring, or the like. Thus, stray light can be inhibited from reaching the light-emitting and light-receiving device 190R (PD). With a larger number of times the stray light 23*b* strikes the light-blocking layer BM and the light-blocking layer 219, the amount of absorbed light can be increased and the amount of stray light reaching the light-emitting and light-receiving device 190R(PD) can be extremely small.

Since the light-blocking layer 219 absorbs light, stray light 23*d* that enters the light-blocking layer 219 directly from the light-emitting device can be absorbed by the light-blocking layer 219. This also demonstrates that providing the light-blocking layer 219 can reduce the amount of stray light incident on the light-emitting and light-receiving device 190R(PD).

Providing the light-blocking layer BM can control the range where the light-emitting and light-receiving device 190R(PD) detects light. When the distance from the light-blocking layer BM to the light-emitting and light-receiving device 190R(PD) is long, the imaging range is narrowed, and the imaging resolution can be increased.

[Display Apparatus 10F]

Figure 10A:
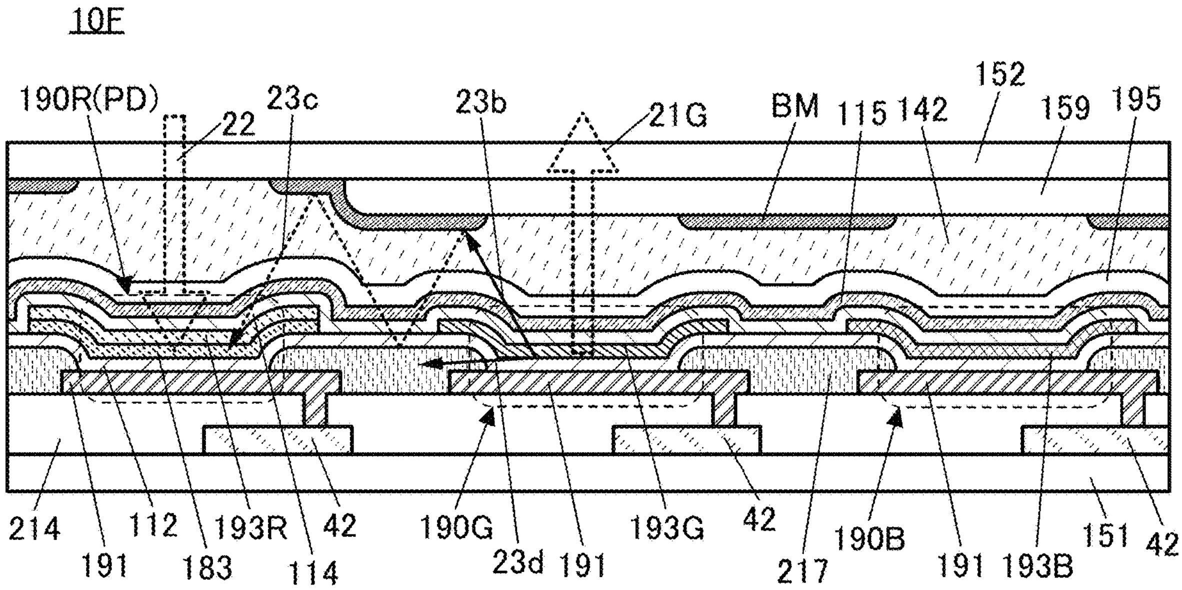
FIG. 10A and FIG. 10B are cross-sectional views each illustrating an example of a display apparatus.

A display apparatus 10F illustrated in FIG. 10A is different from the display apparatus 10D in that the partition 216 transmitting visible light is not included and the partition 217 blocking visible light is included.

The partition 217 preferably absorbs light emitted by the light-emitting device 190. As the partition 217, a black matrix can be formed using a resin material containing a pigment or dye, for example. Moreover, the partition 217 can be formed of a colored insulating layer by using a brown resist material.

In the display apparatus 10D (FIG. 8A), in some cases, light emitted by the light-emitting device 190 is reflected by the substrate 152 and the partition 216, and the reflected light enters the light-emitting and light-receiving device 190R(PD). In other cases, light emitted by the light-emitting device 190 passes through the partition 216 and is reflected by the transistor, the wiring, or the like, and thus the reflected light enters the light-emitting and light-receiving device 190R(PD). In the display apparatus 10F, such reflected light can be inhibited from entering the light-emitting and light-receiving device 190R(PD) because light is absorbed by the partition 217. Thus, noise can be reduced, and the sensitivity of the sensor using the light-emitting and light-receiving device 190R(PD) can be increased.

The partition 217 preferably absorbs at least a wavelength of light that is detected by the light-emitting and light-receiving device 190R(PD). For example, in the case where the light-emitting and light-receiving device 190R(PD) detects green light emitted by the light-emitting device 190, the partition 217 preferably absorbs at least green light. For example, when the partition 217 includes a red color filter, the partition 217 can absorb green light and thus reflected light can be inhibited from entering the light-emitting and light-receiving device 190R(PD).

Although the light-blocking layer BM can absorb most of the stray light 23*b* before the stray light 23*b* reaches the resin layer 159, part of the stray light 23*b* is sometimes reflected and enter the partition 217. When the partition 217 is configured to absorb the stray light 23*b*, the stray light 23*b* can be inhibited from entering the transistor, the wiring, or the like. Thus, stray light 23*c* can be inhibited from reaching the light-emitting and light-receiving device 190R(PD). With a larger number of times the stray light 23*b* strikes the light-blocking layer BM and the partition 217, the amount of absorbed light can be increased and the amount of the stray light 23*c* reaching the light-emitting and light-receiving device 190R(PD) can be extremely small. The resin layer 159 is preferably thick, in which case the number of times the stray light 23*b* strikes the light-blocking layer BM and the partition 217 can be increased.

Since the partition 217 absorbs light, stray light 23*d* that enters the partition 217 directly from the light-emitting device 190 can be absorbed by the partition 217. This also demonstrates that providing the partition 217 can reduce the amount of stray light incident on the light-emitting and light-receiving device 190R(PD).

[Display Apparatus 10G]

Figure 10B:
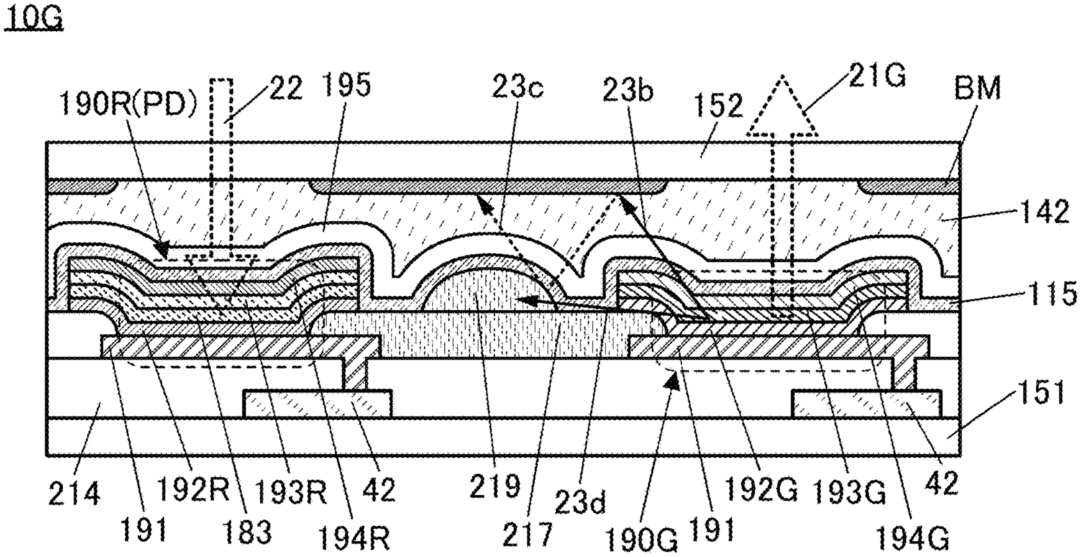

A display apparatus 10G illustrated in FIG. 10B is different from the display apparatus 10E mainly in that the partition 216 transmitting visible light is not included and the partition 217 blocking visible light is included.

The light-blocking layer 219 is positioned over the partition 217. Unlike the partition 216, the partition 217 can absorb light emitted from by light-emitting device; hence, an opening does not need to be formed in the partition 217. Stray light that enters the partition 217 from the light-emitting device is absorbed by the partition 217. The stray light 23*d* that enters the light-blocking layer 219 from the light-emitting device is absorbed by the light-blocking layer 219.

A more detailed structure of the display apparatus of one embodiment of the present invention will be described below with reference to FIG. 11 to FIG. 15.

[Display Apparatus 100A]

Figure 11:
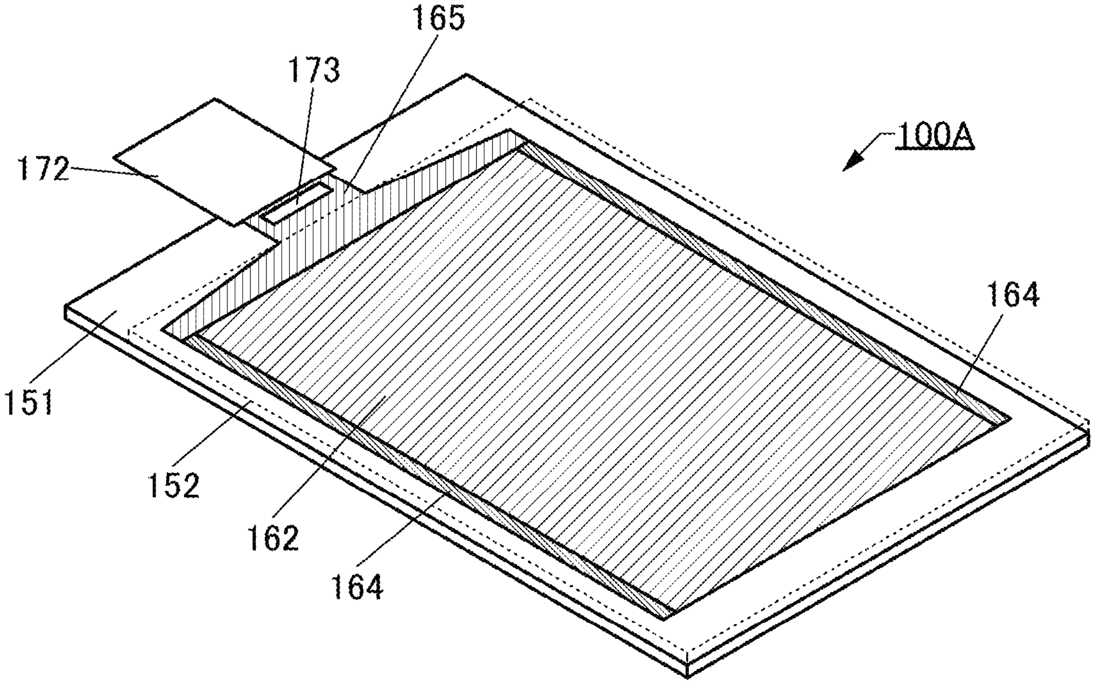
FIG. 11 is a perspective view illustrating an example of a display apparatus.
Figure 12:
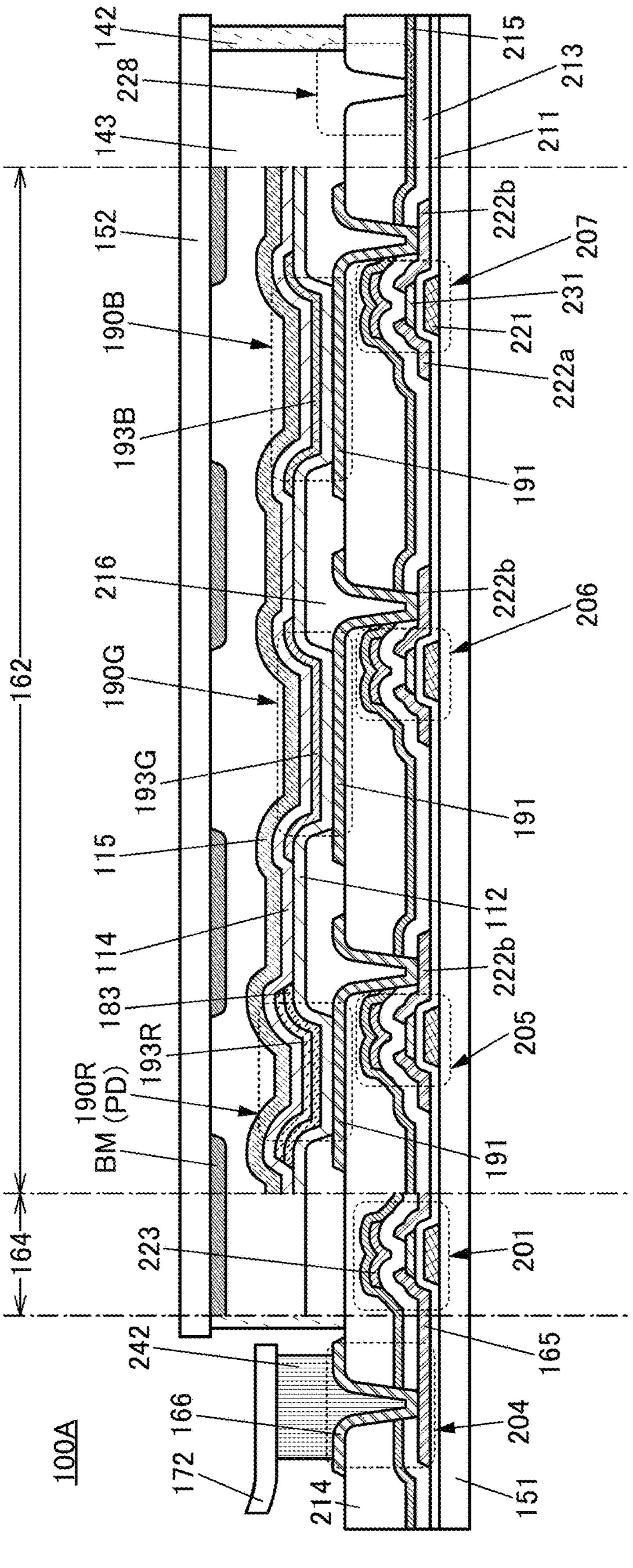
FIG. 12 is a cross-sectional view illustrating an example of a display apparatus.

FIG. 11 illustrates a perspective view of a display apparatus 100A, and FIG. 12 illustrates a cross-sectional view of the display apparatus 100A.

The display apparatus 100A has a structure in which the substrate 152 and the substrate 151 are bonded to each other. In FIG. 11, the substrate 152 is denoted by dashed lines.

The display apparatus 100A includes a display portion 162, a circuit 164, a wiring 165, and the like. FIG. 11 illustrates an example in which an IC (integrated circuit) 173 and an FPC 172 are mounted on the display apparatus 100A. Thus, the structure illustrated in FIG. 11 can be regarded as a display module including the display apparatus 100A, the IC, and the FPC.

As the circuit 164, for example, a scan line driver circuit can be used.

The wiring 165 has a function of supplying a signal and power to the display portion 162 and the circuit 164. The signal and power are input to the wiring 165 from the outside through the FPC 172 or from the IC 173.

FIG. 11 illustrates an example in which the IC 173 is provided over the substrate 151 by a COG (chip on glass) method, a COF (chip on film) method, or the like. An IC including a scan line driver circuit, a signal line driver circuit, or the like can be used as the IC 173, for example. Note that the display apparatus 100A and the display module may have a structure not including an IC. The IC may be mounted on the FPC by a COF method or the like.

FIG. 12 illustrates an example of a cross section of part of a region including the FPC 172, part of a region including the circuit 164, part of a region including the display portion 162, and part of a region including an end portion of the display apparatus 100A illustrated in FIG. 11.

The display apparatus 100A in FIG. 12 includes a transistor 201, a transistor 205, a transistor 206, a transistor 207, the light-emitting device 190B, the light-emitting device 190G, the light-emitting and light-receiving device 190R (PD), and the like between the substrate 151 and the substrate 152.

The substrate 152 and the insulating layer 214 are attached to each other with the adhesive layer 142. A solid sealing structure, a hollow sealing structure, or the like can be employed to seal the light-emitting device 190B, the light-emitting device 190G, and the light-emitting and light-receiving device 190R(PD). In FIG. 12, a hollow sealing structure is employed in which a space 143 surrounded by the substrate 152, the adhesive layer 142, and the insulating layer 214 is filled with an inert gas (e.g., nitrogen or argon). The adhesive layer 142 may overlap with the light-emitting device 190B, the light-emitting device 190G, and the light-emitting and light-receiving device 190R(PD). The space 143 surrounded by the substrate 152, the adhesive layer 142, and the insulating layer 214 may be filled with a resin different from that of the adhesive layer 142.

The light-emitting device 190B has a stacked-layer structure in which the pixel electrode 191, the common layer 112, the light-emitting layer 193B, the common layer 114, and the common electrode 115 are stacked in this order from the insulating layer 214 side. The pixel electrode 191 is connected to a conductive layer 222*b* included in the transistor 207 through an opening provided in the insulating layer 214. The transistor 207 has a function of controlling the driving of the light-emitting device 190B. The end portion of the pixel electrode 191 is covered with the partition 216. The pixel electrode 191 contains a material that reflects visible light, and the common electrode 115 contains a material that transmits visible light.

The light-emitting device 190G has a stacked-layer structure in which the pixel electrode 191, the common layer 112, the light-emitting layer 193G, the common layer 114, and the common electrode 115 are stacked in this order from the insulating layer 214 side. The pixel electrode 191 is connected to a conductive layer 222*b* included in the transistor 206 through an opening provided in the insulating layer 214. The transistor 206 has a function of controlling the driving of the light-emitting device 190G.

The light-emitting and light-receiving device 190R(PD) has a stacked-layer structure in which the pixel electrode 191, the common layer 112, the active layer 183, the light-emitting layer 193R, the common layer 114, and the common electrode 115 are stacked in this order from the insulating layer 214 side. The pixel electrode 191 is electrically connected to the conductive layer 222*b* included in the transistor 205 through an opening provided in the insulating layer 214. The transistor 205 has a function of controlling the driving of the light-emitting and light-receiving device 190R(PD).

Light emitted by the light-emitting device 190B, the light-emitting device 190G, and the light-emitting and light-receiving device 190R(PD) is emitted toward the substrate 152. Light enters the light-emitting and light-receiving device 190R(PD) through the substrate 152 and the space 143. For the substrate 152, a material that has high transmittance with respect to visible light is preferably used.

The pixel electrodes 191 can be formed using the same material in the same step. The common layer 112, the common layer 114, and the common electrode 115 are shared by the light-emitting device 190B, the light-emitting device 190G, and the light-emitting and light-receiving device 190R(PD). The light-emitting and light-receiving device 190R(PD) has the structure of the red-light-emitting device to which the active layer 183 is added. The light-emitting device 190B, the light-emitting device 190G, and the light-emitting and light-receiving device 190R(PD) can have a common structure except for the active layer 183 and the light-emitting layer 193 of each color. Thus, the display portion 162 of the display apparatus 100A can have a light-receiving function without a significant increase in the number of manufacturing steps.

The light-blocking layer BM is provided on the surface of the substrate 152 on the substrate 151 side. The light-blocking layer BM includes openings in the positions overlapping with the light-emitting device 190B, the light-emitting device 190G, and the light-emitting and light-receiving device 190R(PD). Providing the light-blocking layer BM can control the range where the light-emitting and light-receiving device 190R(PD) detects light. Furthermore, with the light-blocking layer BM, light can be inhibited from directly entering the light-emitting and light-receiving device 190R(PD) from the light-emitting device 190 without through an object. Hence, a sensor with less noise and high sensitivity can be obtained.

The transistor 201, the transistor 205, the transistor 206, and the transistor 207 are formed over the substrate 151. These transistors can be formed using the same materials in the same steps.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may have either a single layer or two or more layers.

A material into which impurities such as water and hydrogen do not easily diffuse is preferably used for at least one of the insulating layers that cover the transistors. This allows the insulating layer to serve as a barrier layer. Such a structure can effectively inhibit diffusion of impurities into the transistors from the outside and increase the reliability of the display apparatus.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, a hafnium oxynitride film, a hafnium nitride oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. Note that a base film may be provided between the substrate 151 and the transistors. Any of the above-described inorganic insulating films can be used as the base film.

Here, an organic insulating film often has a lower barrier property than an inorganic insulating film. Therefore, the organic insulating film preferably has an opening in the vicinity of an end portion of the display apparatus 100A. This can inhibit entry of impurities from the end portion of the display apparatus 100A through the organic insulating film. Alternatively, the organic insulating film may be formed so that an end portion of the organic insulating film is positioned on the inner side than the end portion of the display apparatus 100A is, to prevent the organic insulating film from being exposed at the end portion of the display apparatus 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 shown in FIG. 12, an opening is formed in the insulating layer 214. This can inhibit entry of impurities into the display portion 162 from the outside through the insulating layer 214 even when an organic insulating film is used as the insulating layer 214. Thus, the reliability of the display apparatus 100A can be increased.

Each of the transistor 201, the transistor 205, the transistor 206, and the transistor 207 includes a conductive layer 221 functioning as a gate, the insulating layer 211 functioning as the gate insulating layer, a conductive layer 222*a* and the conductive layer 222*b* functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistor 201, the transistor 205, the transistor 206, and the transistor 207. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used in the transistor, and an amorphous semiconductor or a semiconductor having crystallinity (a microcrystalline semiconductor, a polycrystalline semiconductor, a single crystal semiconductor, or a semiconductor partly including crystal regions) can be used. It is preferable to use a semiconductor having crystallinity, in which case degradation of the transistor characteristics can be suppressed.

A semiconductor layer of a transistor preferably includes a metal oxide (also referred to as an oxide semiconductor). Alternatively, the semiconductor layer of the transistor may include silicon. Examples of silicon include amorphous silicon and crystalline silicon (e.g., low-temperature polysilicon or single crystal silicon).

The semiconductor layer preferably includes indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of +30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 164 and the transistor included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures.

A connection portion 204 is provided in a region of the substrate 151 that does not overlap with the substrate 152. In the connection portion 204, the wiring 165 is electrically connected to the FPC 172 via a conductive layer 166 and a connection layer 242. On the top surface of the connection portion 204, the conductive layer 166 obtained by processing the same conductive film as the pixel electrode 191 is exposed. Thus, the connection portion 204 and the FPC 172 can be electrically connected to each other through the connection layer 242.

A variety of optical members can be arranged on the outer surface of the substrate 152. Examples of the optical members include a polarizing plate, a retardation plate, a light diffusion layer (a diffusion film or the like), an anti-reflective layer, and a light-condensing film. Furthermore, an antistatic film inhibiting the attachment of dust, a water repellent film inhibiting the attachment of stain, a hard coat film inhibiting generation of a scratch caused by the use, a shock absorbing layer, or the like may be provided on the outside of the substrate 152.

For each of the substrate 151 and the substrate 152, glass, quartz, ceramic, sapphire, resin, or the like can be used. When a flexible material is used for the substrate 151 and the substrate 152, the flexibility of the display apparatus can be increased.

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer, an anisotropic conductive film (ACF), an anisotropic conductive paste (ACP), or the like can be used.

As materials that can be used for a gate, a source, and a drain of a transistor and conductive layers such as a variety of wirings and electrodes included in a display apparatus, metals such as aluminum, titanium, chromium, nickel, copper, yttrium, zirconium, molybdenum, silver, tantalum, or tungsten, an alloy containing any of these metals as its main component, and the like can be given. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked-layer film of any of the above materials can be used as a conductive layer. For example, a stacked-layer film of indium tin oxide and an alloy of silver and magnesium, or the like is preferably used for increased conductivity. These materials can also be used for conductive layers such as a variety of wirings and electrodes included in the display apparatus, and conductive layers (conductive layers functioning as pixel electrodes or common electrodes) included in the light-emitting device and the light-emitting and light-receiving device.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

[Display Apparatus 100B]

Figure 13:
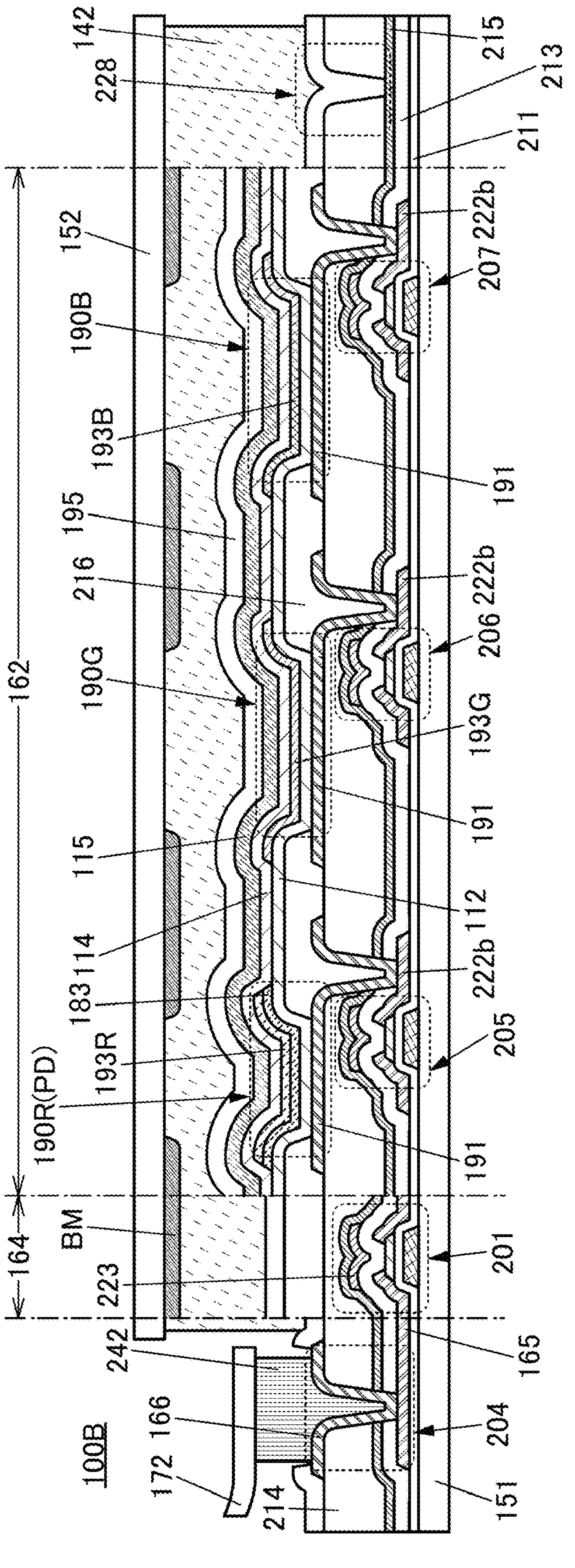
FIG. 13 is a cross-sectional view illustrating an example of a display apparatus.

FIG. 13 illustrates a cross-sectional view of a display apparatus 100B.

The display apparatus 100B is different from the display apparatus 100A mainly in including the protective layer 195. Detailed description of a structure similar to that of the display apparatus 100A is omitted.

When the protective layer 195 covering the light-emitting device 190B, the light-emitting device 190G, and the light-emitting and light-receiving device 190R(PD) is provided, impurities such as water can be inhibited from entering the light-emitting device 190B, the light-emitting device 190G, and the light-emitting and light-receiving device 190R(PD), so that the reliabilities of the light-emitting device 190B, the light-emitting device 190G, and the light-emitting and light-receiving device 190R(PD) can be increased.

In the region 228 in the vicinity of an end portion of the display apparatus 100B, the insulating layer 215 and the protective layer 195 are preferably in contact with each other through an opening in the insulating layer 214. In particular, the inorganic insulating film included in the insulating layer 215 and the inorganic insulating film included in the protective layer 195 are preferably in contact with each other. Thus, entry of impurities from the outside into the display portion 162 through the organic insulating film can be inhibited. Thus, the reliability of the display apparatus 100B can be increased.

The protective layer 195 may have a single-layer structure or a stacked-layer structure; for example, the protective layer 195 may have a three-layer structure that includes an inorganic insulating layer over the common electrode 115, an organic insulating layer over the inorganic insulating layer, and an inorganic insulating layer over the organic insulating layer. In that case, an end portion of the inorganic insulating film preferably extends beyond an end portion of the organic insulating film.

Furthermore, a lens may be provided in a region overlapping with the light-emitting and light-receiving device 190R(PD). Thus, the sensitivity and accuracy of the sensor using the light-emitting and light-receiving device 190R(PD) can be increased.

The lens preferably has a refractive index of greater than or equal to 1.3 and less than or equal to 2.5. The lens can be formed using at least one of an inorganic material and an organic material. For example, a material containing a resin can be used for the lens. Moreover, a material containing at least one of an oxide and a sulfide can be used for the lens.

Specifically, a resin containing chlorine, bromine, or iodine, a resin containing a heavy metal atom, a resin having an aromatic ring, a resin containing sulfur, and the like can be used for the lens. Alternatively, a material containing a resin and nanoparticles of a material having a higher refractive index than the resin can be used for the lens. Titanium oxide, zirconium oxide, or the like can be used for the nanoparticles.

In addition, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, and the like can be used for the lens. Alternatively, zinc sulfide and the like can be used for the lens.

In the display apparatus 100B, the protective layer 195 and the substrate 152 are bonded to each other with the adhesive layer 142. The adhesive layer 142 is provided to overlap with each of the light-emitting device 190B, the light-emitting device 190G, and the light-emitting and light-receiving device 190R(PD); that is, the display apparatus 100B employs a solid sealing structure.

[Display Apparatus 100C]

Figures 14A, 14B:
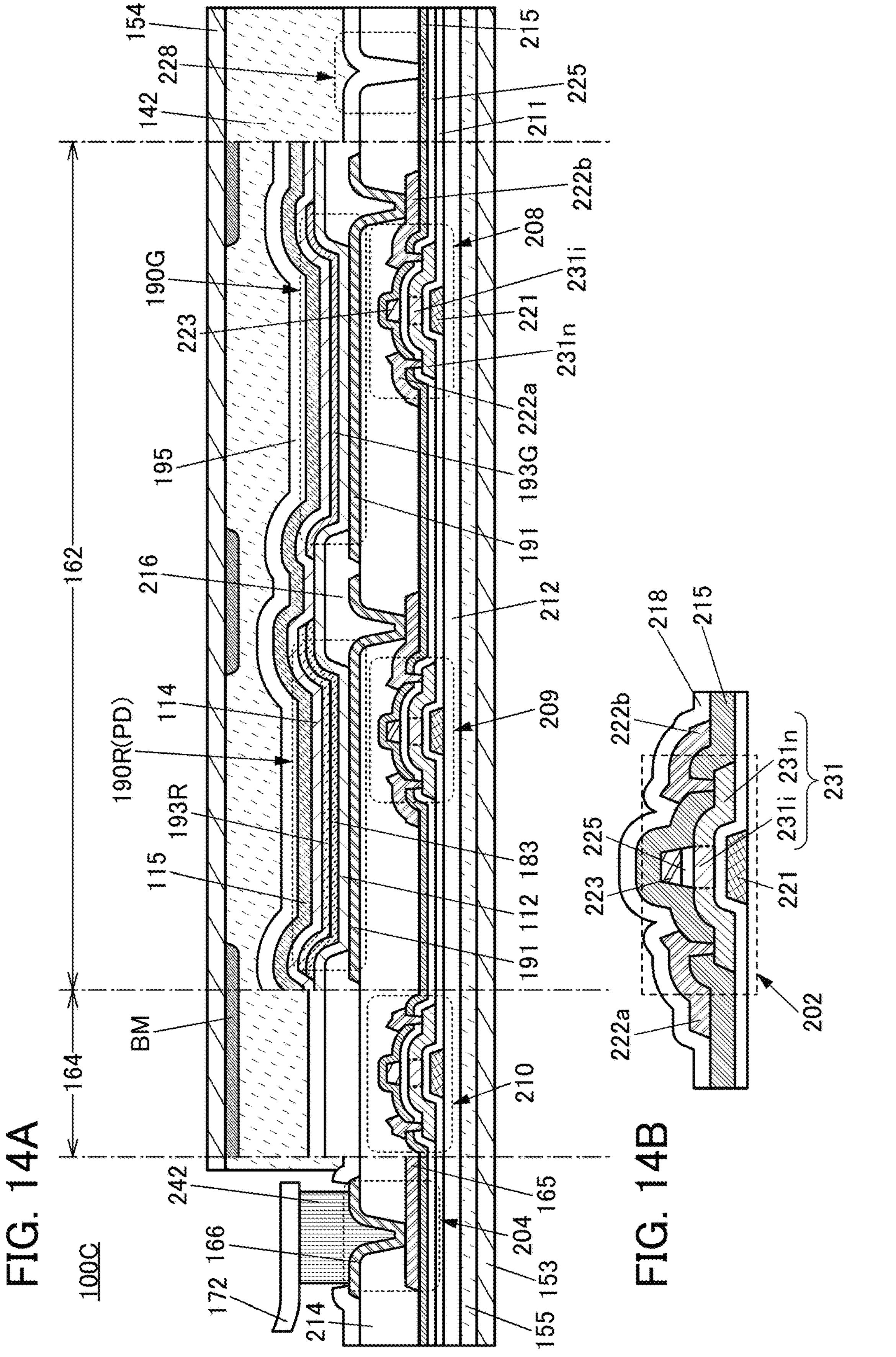
FIG. 14A is a cross-sectional view illustrating an example of a display apparatus.
FIG. 14B is a cross-sectional view illustrating an example of a transistor.

FIG. 14A illustrates a cross-sectional view of a display apparatus 100C.

The display apparatus 100C is different from the display apparatus 100B in transistor structures.

The display apparatus 100C includes a transistor 208, a transistor 209, and a transistor 210 over the substrate 151.

Each of the transistor 208, the transistor 209, and the transistor 210 includes the conductive layer 221 functioning as a gate, the insulating layer 211 functioning as a gate insulating layer, a semiconductor layer including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between the conductive layer 223 and the channel formation region 231*i*.

The conductive layer 222*a* and the conductive layer 222*b* are connected to the corresponding low-resistance regions 231*n* through openings provided in the insulating layer 225 and the insulating layer 215. One of the conductive layer 222*a* and the conductive layer 222*b* serves as a source, and the other serves as a drain.

The pixel electrode 191 of the light-emitting device 190G is electrically connected to one of the pair of low-resistance regions 231*n* of the transistor 208 through the conductive layer 222*b*.

The pixel electrode 191 of the light-emitting and light-receiving device 190R(PD) is electrically connected to the other of the pair of low-resistance regions 231*n* of the transistor 209 through the conductive layer 222*b*.

FIG. 14A illustrates an example in which the insulating layer 225 covers a top surface and a side surface of the semiconductor layer. Meanwhile, in FIG. 14B, the insulating layer 225 overlaps with the channel formation region 231*i* of the semiconductor layer 231 and does not overlap with the low-resistance regions 231*n*. A transistor 202 illustrated in FIG. 14B can be manufactured by processing the insulating layer 225 using the conductive layer 223 as a mask, for example. In FIG. 14B, the insulating layer 215 is provided to cover the insulating layer 225 and the conductive layer 223, and the conductive layer 222*a* and the conductive layer 222*b* are connected to the low-resistance regions 231*n* through openings in the insulating layer 215. Furthermore, an insulating layer 218 that covers the transistor may be provided over the conductive layer 222*a* and the conductive layer 222*b*.

In addition, the display apparatus 100C is different from the display apparatus 100B in that neither the substrate 151 nor the substrate 152 is included and the substrate 153, the substrate 154, the adhesive layer 155, and the insulating layer 212 are included.

The substrate 153 and the insulating layer 212 are bonded to each other with the adhesive layer 155. The substrate 154 and the protective layer 195 are bonded to each other with the adhesive layer 142.

The display apparatus 100C is formed in such a manner that the insulating layer 212, the transistor 208, the transistor 209, the transistor 210, the light-emitting and light-receiving device 190R(PD), the light-emitting device 190G, and the like which are formed over a formation substrate are transferred onto the substrate 153. The substrate 153 and the substrate 154 preferably have flexibility. Accordingly, the display apparatus 100C can be highly flexible.

The inorganic insulating film that can be used as the insulating layer 211 and the insulating layer 215 can be used as the insulating layer 212.

In the display apparatus of this embodiment, a subpixel emitting light of any of the colors includes a light-emitting and light-receiving device instead of a light-emitting device as described above. The light-emitting and light-receiving device functions as both a light-emitting device and a light-receiving device, whereby the pixel can have a light-receiving function without an increase in the number of subpixels included in the pixel. Furthermore, the pixel can be provided with a light-receiving function without a reduction in the resolution of the display apparatus or a reduction in the aperture ratio of each subpixel.

This embodiment can be combined with the other embodiments as appropriate. In this specification, in the case where a plurality of structure examples are shown in one embodiment, the structure examples can be combined as appropriate.

Embodiment 2

In this embodiment, a method for driving a display apparatus of one embodiment of the present invention will be described with reference to FIG. 15 to FIG. 20.

Figure 15:
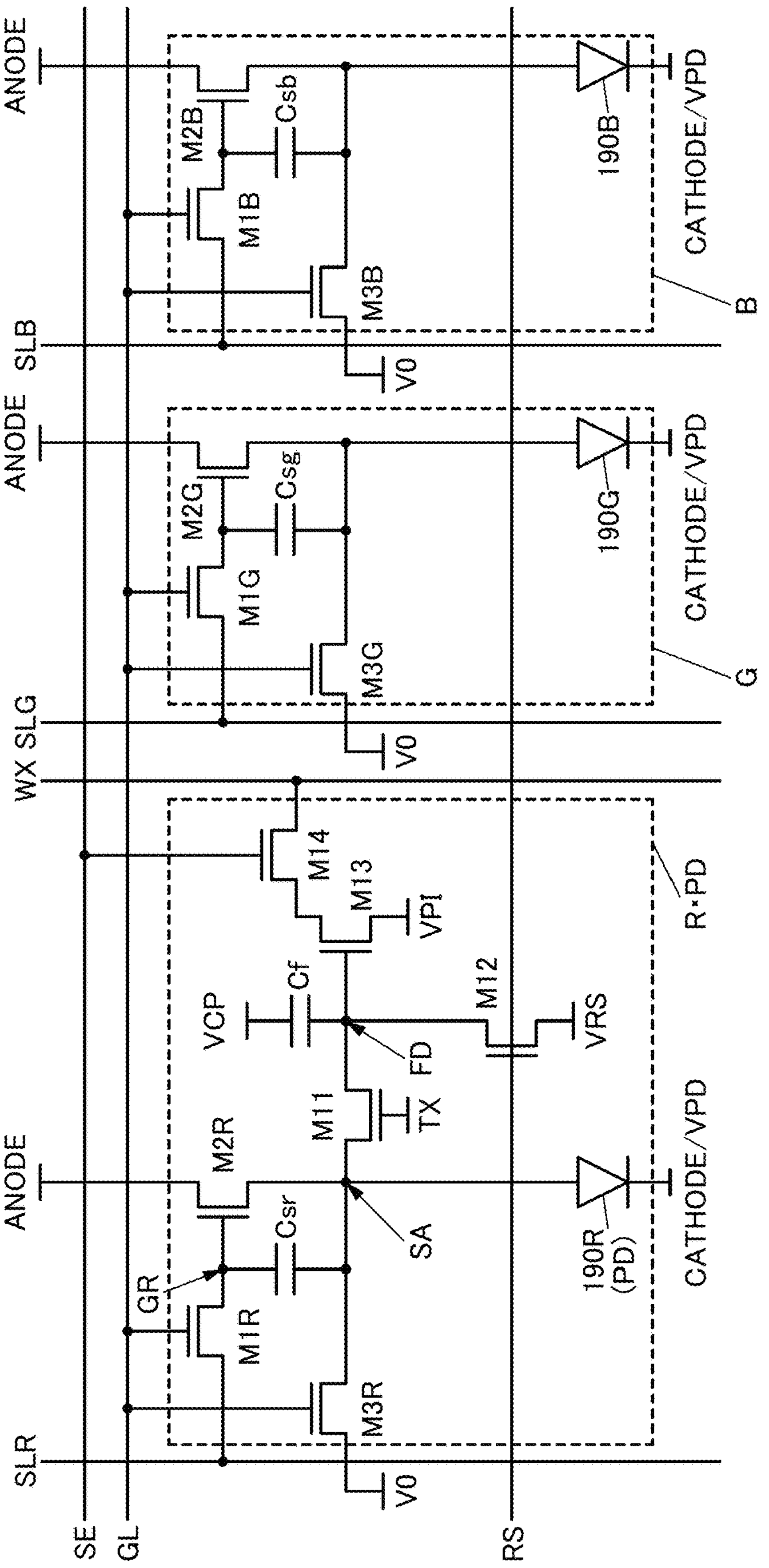
FIG. 15 is a circuit diagram showing an example of a pixel circuit.

FIG. 15 shows a circuit diagram of a pixel of a display apparatus.

The pixel shown in FIG. 15 includes a subpixel (R·PD) that exhibits red light and has a light-receiving function, a subpixel (G) that exhibits green light, and a subpixel (B) that exhibits blue light.

The subpixel (R·PD) that exhibits red light and has a light-receiving function includes a transistor MIR, a transistor M2R, a transistor M3R, a transistor M11, a transistor M12, a transistor M13, a transistor M14, a capacitor Csr, a capacitor Cf, and the light-emitting and light-receiving device 190R(PD). The transistor MIR, the transistor M3R, the transistor M11, the transistor M12, and the transistor M14 each function as a switch.

A gate of the transistor MIR is electrically connected to a wiring GL, one of a source and a drain of the transistor MIR is electrically connected to a wiring SLR, and the other thereof is electrically connected to a gate of the transistor M2R and one electrode of the capacitor Csr. One of a source and a drain of the transistor M2R is electrically connected to one of a source and a drain of the transistor M3R, one of a source and a drain of the transistor M11, the other electrode of the capacitor Csr, and an anode of the light-emitting and light-receiving device 190R(PD), and the other thereof is electrically connected to a wiring ANODE. A gate of the transistor M3R is electrically connected to the wiring GL, and the other of the source and the drain of the transistor M3R is electrically connected to a wiring V0. A gate of the transistor M11 is electrically connected to a wiring TX, and the other of the source and the drain of the transistor M11 is electrically connected to one of a source and a drain of the transistor M12, a gate of the transistor M13, and one electrode of the capacitor Cf. A gate of the transistor M12 is electrically connected to a wiring RS, and the other of the source and the drain of the transistor M12 is electrically connected to a wiring VRS. One of a source and a drain of the transistor M13 is electrically connected to one of a source and a drain of the transistor M14, and the other thereof is electrically connected to a wiring VPI. A gate of the transistor M14 is electrically connected to a wiring SE, and the other of the source and the drain of the transistor M14 is electrically connected to a wiring WX. The other electrode of the capacitor Cf is electrically connected to a wiring VCP. A cathode of the light-emitting and light-receiving device 190R(PD) is electrically connected to a wiring CATHODE/VPD.

The subpixel (G) that exhibits green light includes a transistor MIG, a transistor M2G, a transistor M3G, a capacitor Csg, and the light-emitting device 190G. The transistor MIG and the transistor M3G each function as a switch.

A gate of the transistor MIG is electrically connected to the wiring GL, one of a source and a drain of the transistor MIG is electrically connected to a wiring SLG, and the other thereof is electrically connected to a gate of the transistor M2G and one electrode of the capacitor Csg. One of a source and a drain of the transistor M2G is electrically connected to one of a source and a drain of the transistor M3G, the other electrode of the capacitor Csg, and an anode of the light-emitting device 190G, and the other thereof is electrically connected to the wiring ANODE. A gate of the transistor M3G is electrically connected to the wiring GL, and the other of the source and the drain of the transistor M3G is electrically connected to the wiring V0. A cathode of the light-emitting device 190G is electrically connected to the wiring CATHODE/VPD.

The subpixel (B) that exhibits blue light includes a transistor MIB, a transistor M2B, a transistor M3B, a capacitor Csb, and the light-emitting device 190B. The transistor MIB and the transistor M3B each function as a switch.

A gate of the transistor M1B is electrically connected to the wiring GL, one of a source and a drain of the transistor MIB is electrically connected to a wiring SLB, and the other thereof is electrically connected to a gate of the transistor M2B and one electrode of the capacitor Csb. One of a source and a drain of the transistor M2B is electrically connected to one of a source and a drain of the transistor M3B, the other electrode of the capacitor Csb, and an anode of the light-emitting device 190B, and the other thereof is electrically connected to the wiring ANODE. A gate of the transistor M3B is electrically connected to the wiring GL, and the other of the source and the drain of the transistor M3B is electrically connected to the wiring V0. A cathode of the light-emitting device 190B is electrically connected to the wiring CATHODE/VPD.

Signals for controlling operations of the transistors are supplied to the wiring GL, the wiring SE, the wiring TX, and the wiring RS.

In the case of displaying an image, image signals VdataR, VdataG, and VdataB are supplied to the wirings SLR, SLG, and SLB, respectively.

Predetermined potentials are supplied to the wiring V0, the wiring VPI, the wiring VCP, the wiring VRS, the wiring ANODE, and the wiring CATHODE/VPD. A potential Vo corresponding to black display of the image signals VdataR, VdataG, and VdataB (e.g., 0 V) is supplied to the wiring V0. A potential higher than a gate voltage range of the transistor M13 is supplied to the wiring VPI. An arbitrary potential (e.g., 0 V) can be supplied to the wiring VCP. A potential lower than that of the wiring CATHODE/VPD is supplied to the wiring VRS. A potential higher than that of the wiring CATHODE/VPD is supplied to the wiring ANODE.

The transistor MIR, the transistor MIG, the transistor M1B, the transistor M3R, the transistor M3G, and the transistor M3B are controlled by a signal supplied to the wiring GL and function as selection transistors for controlling the selection states of the pixels.

The transistor M2R functions as a driving transistor that controls a current flowing to the light-emitting and light-receiving device 190R(PD) in accordance with a potential supplied to the gate. Similarly, the transistor M2G and the transistor M2B each function as a driving transistor that controls a current flowing to the light-emitting device 190G or the light-emitting device 190B in accordance with a potential supplied to the gate.

When the transistor MIR is in a conducting state, the transistor M3R is also in a conducting state at the same time, so that a potential supplied to the wiring SLR (e.g., the image signal VdataR) is supplied to the gate of the transistor M2R and the potential Vo supplied to the wiring V0 is supplied to the source of the transistor M3R. A charge corresponding to the voltage VdataR-Vo is accumulated in the capacitor Csr. The light-emitting and light-receiving device 190R(PD) can emit light with a luminance corresponding to the potential of a node GR (the gate potential of the transistor M2R).

Similarly, when the transistor MIG is in a conducting state, the transistor M3G is also in a conducting state at the same time, so that a potential supplied to the wiring SLG (e.g., the image signal VdataG) is supplied to the gate of the transistor M2G and the potential Vo supplied to the wiring V0 is supplied to the source of the transistor M3G. A charge corresponding to the voltage VdataG-Vo is accumulated. The light-emitting device 190G can emit light with a luminance corresponding to the gate potential of the transistor M2G. When the transistor M1B is in a conducting state, the transistor M3B is also in a conducting state at the same time, so that a potential supplied to the wiring SLB (e.g., the image signal VdataB) is supplied to the gate of the transistor M2B and the potential Vo supplied to the wiring V0 is supplied to the source of the transistor M3B. A charge corresponding to the voltage VdataB-Vo is accumulated in the capacitor Csb. The light-emitting device 190B can emit light with a luminance corresponding to the gate potential of the transistor M2B.

The transistor M11 is controlled by a signal supplied to the wiring TX and has a function of controlling the timing at which the potential of a node FD changes, in accordance with a current flowing through the light-emitting and light-receiving device 190R(PD). The transistor M12 is controlled by a signal supplied to the wiring RS and has a function of resetting the potential of the node FD connected to the gate of the transistor M13 to a potential supplied to the wiring VRS. The transistor M13 functions as an amplifier transistor that performs output corresponding to the potential of the node FD. The transistor M14 is controlled by a signal supplied to the wiring SE and functions as a selection transistor for reading an output corresponding to the potential of the node FD by an external circuit connected to the wiring WX.

In the display apparatus of one embodiment of the present invention, it is preferable to use transistors including a metal oxide (also referred to as an oxide semiconductor) in their semiconductor layers where channels are formed (such transistors are also referred to as OS transistors below) as all the transistors included in the pixel shown in FIG. 15. An OS transistor has an extremely low off-state current and enables charge stored in a capacitor that is series-connected to the transistor to be retained for a long time. Furthermore, power consumption of the display apparatus can be reduced with an OS transistor.

Alternatively, in the display apparatus of one embodiment of the present invention, it is preferable to use transistors including silicon in their semiconductor layers where channels are formed (such transistors are also referred to as Si transistors below) as all the transistors included in the pixel shown in FIG. 15. As silicon, single crystal silicon, polycrystalline silicon, amorphous silicon, and the like can be given. It is particularly preferable to use transistors including low-temperature polysilicon (LTPS) (hereinafter also referred to as LTPS transistors) in their semiconductor layers. An LTPS transistor has high field-effect mobility and can operate at high speed.

With the use of Si transistors such as LTPS transistors, a variety of circuits formed using a CMOS circuit and a display portion can be easily formed on the same substrate. Thus, external circuits mounted on the display apparatus can be simplified, and costs of parts and mounting costs can be reduced.

Alternatively, in the display apparatus of one embodiment of the present invention, two kinds of transistors are preferably used in the subpixel (R·PD) including the light-emitting and light-receiving device. Specifically, the subpixel preferably includes an OS transistor and an LTPS transistor. Changing the material of the semiconductor layer depending on the desired function of the transistor can increase the quality of the pixel circuit of the subpixel (R·PD) including the light-emitting and light-receiving device and increase the accuracy of sensing and image capturing. In that case, in the subpixels (G) and (B) that include the light-emitting devices, OS transistors and/or LTPS transistors can be used.

Furthermore, even when two kinds of transistors (e.g., OS transistors and LTPS transistors) are used in the pixel, using the LTPS transistors facilitates formation of a variety of circuits formed using a CMOS circuit and a display portion on the same substrate. Thus, external circuits mounted on the display apparatus can be simplified, and costs of parts and mounting costs can be reduced.

A transistor using a metal oxide having a wider band gap and a lower carrier density than silicon can achieve an extremely low off-state current. Thus, such a low off-state current enables long-term retention of charge accumulated in a capacitor that is connected in series with the transistor. Therefore, it is preferable to use OS transistors especially as the transistor MIR, the transistor MIG, the transistor M1B, the transistor M3R, the transistor M3G, the transistor M3B, the transistor M11, and the transistor M12 that are series-connected to the capacitor Csr, the capacitor Csg, the capacitor Csb, or the capacitor Cf.

An Si transistor is preferably used as the transistor M13. This enables high-speed reading operation of imaging data.

Although n-channel transistors are shown as the transistors in FIG. 15, p-channel transistors can be used. The transistors are not limited to single-gate transistors and may further include a back gate.

One or more layers including one or both of the transistor and the capacitor are preferably provided at a position overlapping with the light-emitting and light-receiving device 190R(PD), the light-emitting device 190G, or the light-emitting device 190B. Thus, the effective area of each pixel circuit can be reduced, and a high-definition display portion can be achieved.

Figure 16A:
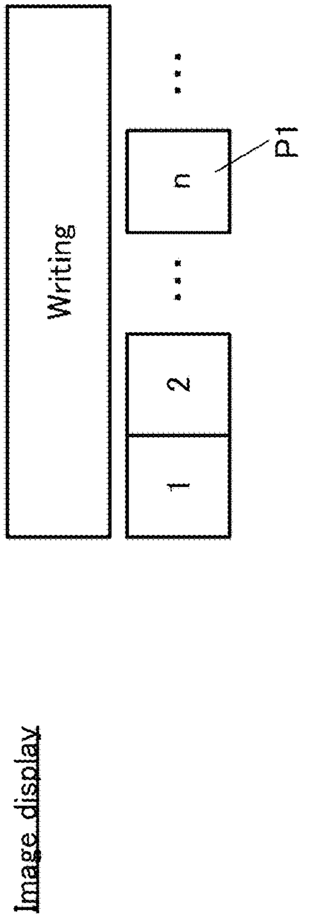
FIG. 16A and FIG. 16B are drawings showing examples of a method for driving a display apparatus.
Figure 16B:
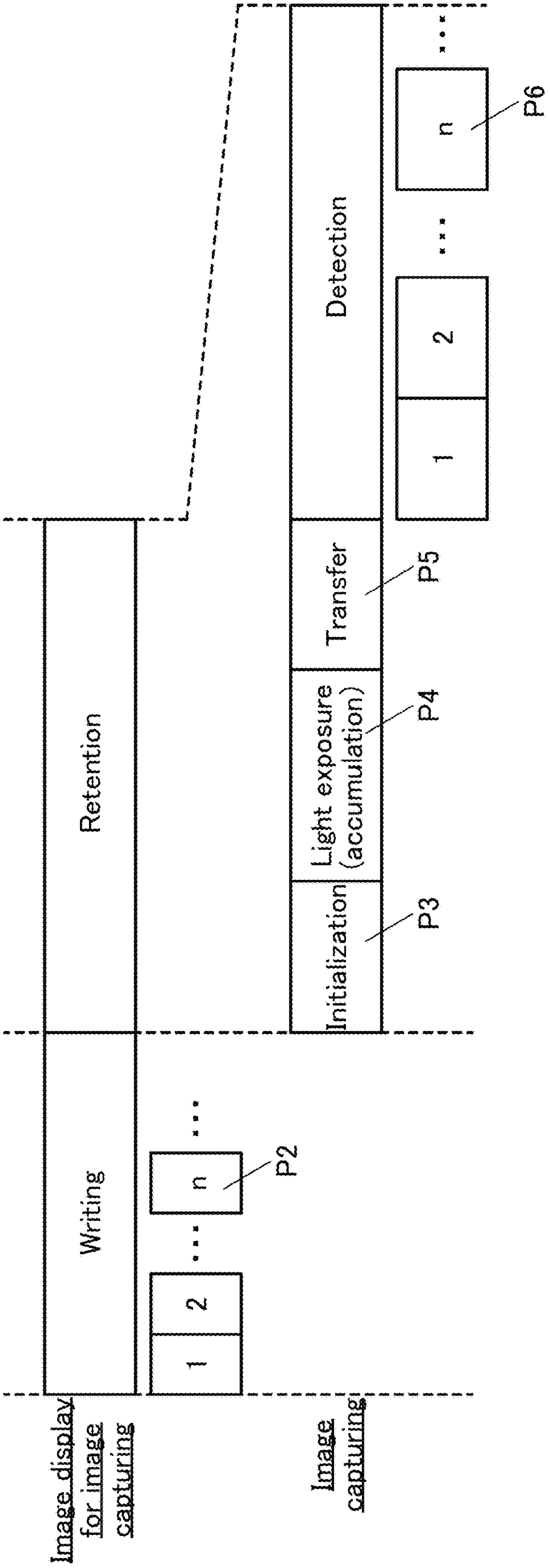

FIG. 16A and FIG. 16B show an example of a method for driving a display apparatus. FIG. 17A to FIG. 17D, FIG. 18A, and FIG. 18B show timing charts of operations.

As shown in FIG. 16A, in the case of performing image display, an operation of writing an image signal is performed row by row.

Figure 17A:
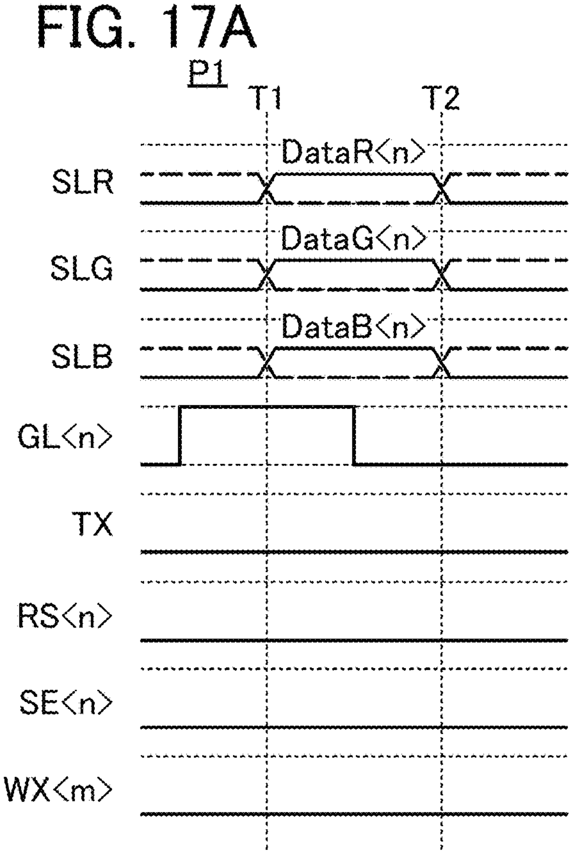
FIG. 17A to FIG. 17D are timing charts showing an example of a method for driving a display apparatus.

FIG. 17A shows a timing chart of an operation P1 of writing an image signal in a pixel of the n-th row.

First, before Time T1, the potential of the wiring GL<n> is set to a high potential and the potentials of the wiring TX, the wiring RS<n>, and the wiring SE<n> are each set to a low potential. Accordingly, the transistor MIR and the transistor M3R are turned on, so that a charge corresponding to a potential difference (a voltage DataR<n>–Vo) between a potential DataR<n> of the wiring SLR and the potential Vo of the wiring V0 is accumulated in the capacitor Csr. Furthermore, the transistor M1G and the transistor M3G are turned on, so that a charge corresponding to a potential difference (a voltage DataG<n>–Vo) between a potential DataG<n> of the wiring SLG and the potential Vo of the wiring V0 is accumulated in the capacitor Csg. Moreover, the transistor M1B and the transistor M3B are turned on, so that a charge corresponding to a potential difference (a voltage DataB<n>–Vo) between a potential DataB<n> of the wiring SLB and the potential Vo of the wiring V0 is accumulated in the capacitor Csb. At this time, the potential of the wiring WX<m> is a low potential.

Next, in a period between Time T1 to Time T2, the potential of the wiring GL<n> is set to a low potential, so that the transistors MIR, MIG, MIB, M3R, M3G, and M3B are turned off, the charges accumulated in the capacitors Csr, Csg, and Csb are retained, and the operation of writing the image signal is terminated. The light-emitting and light-receiving device 190R(PD), the light-emitting device 190G, and the light-emitting device 190B are each emit light on the basis of the gate potential of the transistor M2R, M2G, or M2B.

FIG. 16B shows a sequence in the case of performing image capturing by a global shutter method with the use of the light-emitting and light-receiving device 190R(PD). As shown in FIG. 16B, in the case where image capturing is performed using the light-emitting and light-receiving device 190R(PD), first, an operation of writing an image signal for image capturing is performed row by row; an initialization (reset) operation, a light-exposure (accumulation) operation, and a transfer operation are performed in this order in the subpixel having a light-receiving function while the written data is retained; and then, detection is performed by reading imaging data row by row.

Figure 17B:
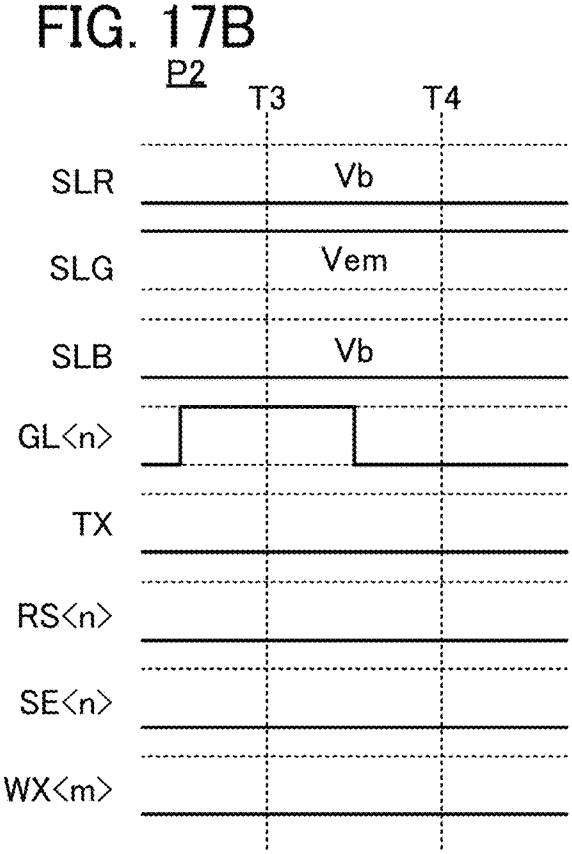

FIG. 17B shows a timing chart of an operation P2 of writing an image signal for image capturing in the pixel of the n-th row. In the example described here, image capturing is performed with the light-emitting and light-receiving device 190R(PD) using the light-emitting device 190G as a light source.

First, before Time T3, the potential of the wiring GL<n> is set to a high potential and the potentials of the wiring TX, the wiring RS<n>, and the wiring SE<n> are each set to a low potential. Accordingly, the transistor MIR and the transistor M3R are turned on, so that a charge corresponding to a potential difference (a voltage Vb−Vo) between a potential Vb of the wiring SLR and the potential Vo of the wiring V0 is accumulated in the capacitor Csr. Furthermore, the transistor MIG and the transistor M3G are turned on, so that a charge corresponding to a potential difference (a voltage Vem−Vo) between a potential Vem of the wiring SLG and the potential Vo of the wiring V0 is accumulated in the capacitor Csg. Moreover, the transistor MIB and the transistor M3B are turned on, so that a charge corresponding to a potential difference (the voltage Vb−Vo) between the potential Vb of the wiring SLB and the potential Vo of the wiring V0 is accumulated in the capacitor Csg. At this time, the potential of the wiring WX<m> is a low potential.

Here, the potential Vb of the wiring SLR is a potential such that the gate-source voltage (Vgs) and the threshold voltage (Vth) of the transistor M2R satisfy Vgs=Vb−Vo<Vth. Consequently, the transistor M2R can be turned off completely.

The potential Vem of the wiring SLG is set to a potential for making the light-emitting device 190G emit light. A potential that makes light emission of the light-emitting device 190G have a sufficient luminance for image capturing is preferably supplied as the potential Vem.

A potential that makes the light-emitting device 190B not emit light is supplied to the wiring SLB. Although the potential Vb is supplied to the wiring SLB in the example shown in FIG. 17B, one embodiment of the present invention is not limited to the example. The potential supplied to the wiring SLB may be the same as or different from the potential supplied to the wiring SLR. Note that in the case where the light-emitting device 190B is also used as a light source at the time of image capturing, a potential for making the light-emitting device 190B emit light is supplied to the wiring SLB.

Next, in a period between Time T3 and Time T4, the potential of the wiring GL<n> is set to a low potential, so that the transistors MIR, MIG, MIB, M3R, M3G, and M3B are turned off, the charges accumulated in the capacitor Csr, Csg, and Csb are retained, and the operation of writing the image signal for image capturing is terminated. The light-emitting device 190G emits light on the basis of the gate potential of the transistor M2G.

Figure 17C:
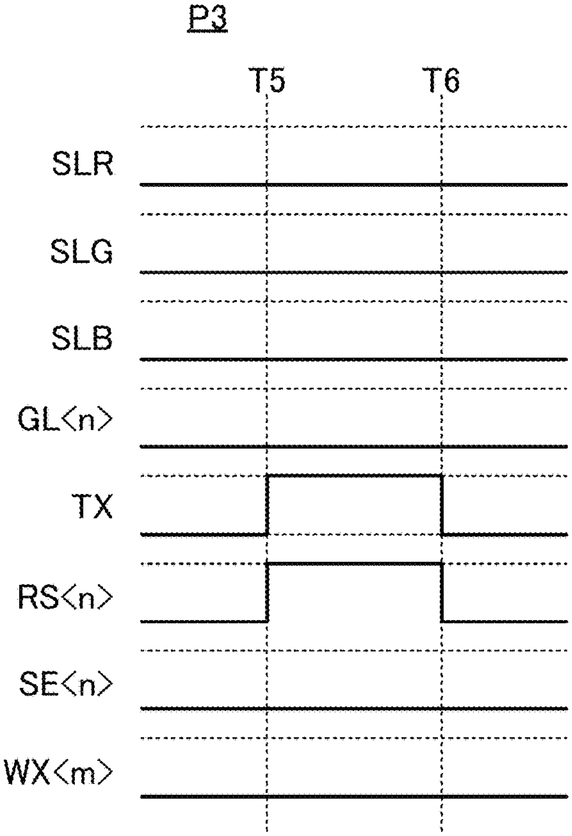

FIG. 17C shows a timing chart of an initialization (reset) operation P3.

At Time T5, the potentials of the wiring TX and the wiring RS<n> are set to high potentials, so that the transistor M11 and the transistor M12 are turned on. Thus, the potential of the anode of the light-emitting and light-receiving device 190R(PD) and the potential of the node FD can be reset to the potential supplied to the wiring VRS. Since the node GR is floating, Vgs is stored and the transistor M2R remains off regardless of the potential of a node SA. When a potential lower than that of the wiring CATHODE/VPD is supplied to the wiring VRS, a reverse bias can be applied to the light-emitting and light-receiving device 190R(PD).

At Time T6, the potentials of the wiring TX and the wiring RS<n> are set to low potentials, so that the transistor M11 and the transistor M12 are turned off and the initialization operation is terminated.

Figure 17D:
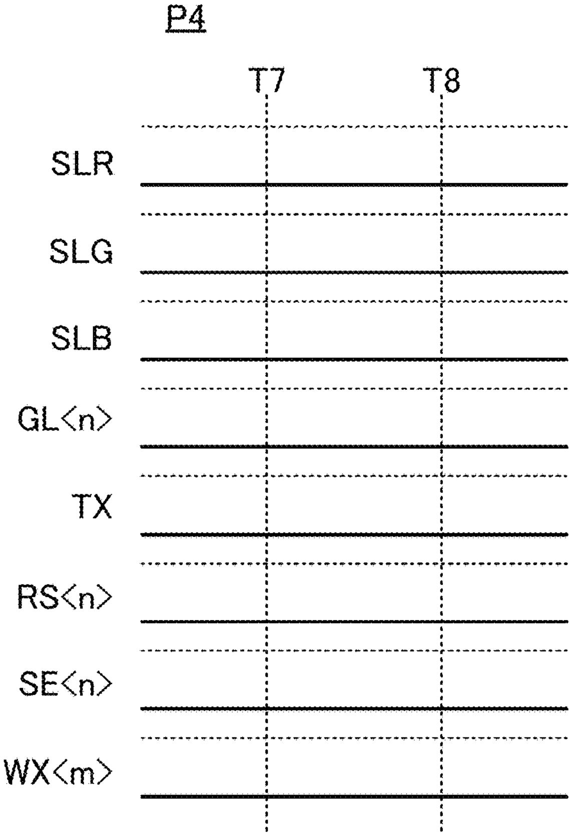

FIG. 17D shows a timing chart of a light-exposure (accumulation) operation P4.

In a period from Time T7 to Time T8, the light-emitting and light-receiving device 190R(PD) generates charge by receiving light emitted by the light-emitting device 190G. Thus, charge is accumulated in the capacitor of the light-emitting and light-receiving device 190R(PD), and the potential of the node SA becomes a potential corresponding to the charge generated in the light-emitting and light-receiving device 190R(PD).

Note that during the period from Time T7 to Time T8, the wiring SLR, the wiring SLG, the wiring SLB, the wiring GL<n>, the wiring TX, the wiring RS<n>, the wiring SE<n>, and the wiring WX<m> can remain at low potentials.

Figure 18A:
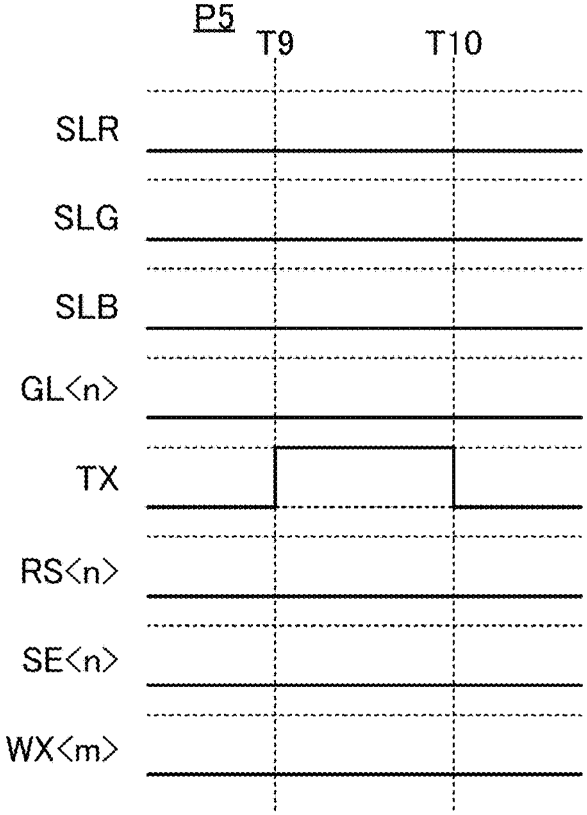
FIG. 18A and FIG. 18B are timing charts showing an example of a method for driving a display apparatus.

FIG. 18A shows a timing chart of a transfer operation P5.

At the time T9, the potential of the wiring TX is set to a high potential, so that the transistor M11 is turned on. Accordingly, charge is transferred from the node SA to the node FD. In other words, the potential of the node FD becomes a potential corresponding to the charge generated in the light-emitting and light-receiving device 190R(PD).

At Time T10, the potential of the wiring TX is set to a low potential, so that the transistor M11 is turned off and the transfer operation is terminated.

Figure 18B:
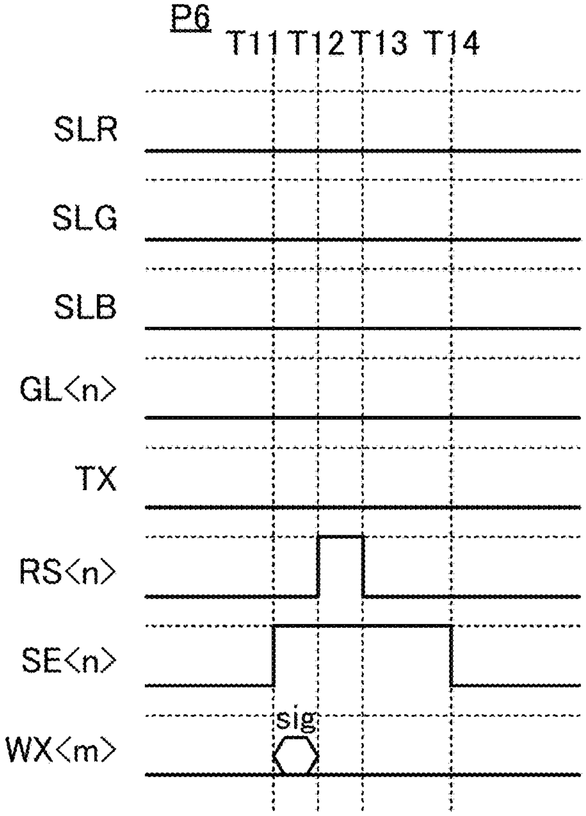

FIG. 18B shows a timing chart of a detection operation P6.

At Time T11, the potential of the wiring SE is set to a high potential, so that the transistor M14 is turned on and the potential of the wiring WX can be set to a potential corresponding to the charge generated in the light-emitting and light-receiving device 190R(PD). Accordingly, an output sig corresponding to the charge generated in the light-emitting and light-receiving device 190R(PD) can be read out with an external circuit connected to the wiring WX. Note that the transistor M13 can also be referred to as a transistor included in a source follower circuit.

At Time T12, the potential of the wiring RS<n> is set to a high potential while the wiring SE remains at a high potential, so that the transistor M12 is turned on and the potential of the wiring WX is reset to a potential corresponding to the potential of the wiring VRS. When the potential of a background is read out, fixed pattern noise caused by the transistor M13 can be removed from the output signal that has been read out with the external circuit at Time T11. This can reduce influence of variations in the characteristics of the transistors M13 among the pixels.

At Time T13, the potential of the wiring RS<n> is set to a low potential, so that the transistor M12 is turned off.

At Time T14, the potential of the wiring SE<n> is set to t a low potential, so that the transistor M14 is turned off and the detection operation is terminated.

When the operations of Time T3 to Time T14 are performed repeatedly, image capturing can be performed repeatedly. In the case where OS transistors are used as the transistors M1R, M2R, M1G, M2G, M1B, and M2B, the image signal for image capturing can be retained for a long term; therefore, the frequency of performing the operation P2 of writing the image signal for image capturing can be low. Therefore, after the operations of Time T3 to Time T14 are performed once, the operations of Time T5 to Time T14 may be repeated predetermined times, and then the operation may return to Time T3.

Note that the display apparatus of this embodiment can be driven in any of an image display mode, an image capturing mode, and a mode of simultaneously performing image display and image capturing. In the image display mode, a full-color image can be displayed, for example. In the image capture mode, an image for image capturing (e.g., a green monochromatic image or a blue monochromatic image) can be displayed and image capturing can be performed with the light-emitting and light-receiving device, for example. Fingerprint identification can be performed in the image capture mode, for example. In the mode of simultaneously performing image display and image capturing, an image for image capturing can be displayed with the light-emitting device (the light-emitting devices 190G or the light-emitting device 190B) and image capturing can be performed with the light-emitting and light-receiving device 190R(PD) in some pixels, and a full-color image can be displayed with the light-emitting and light-receiving device and the light-emitting device in the other pixels, for example.

An example of an operation method in the mode of simultaneously performing image display and image capturing is described with reference to FIG. 19.

Figure 19:
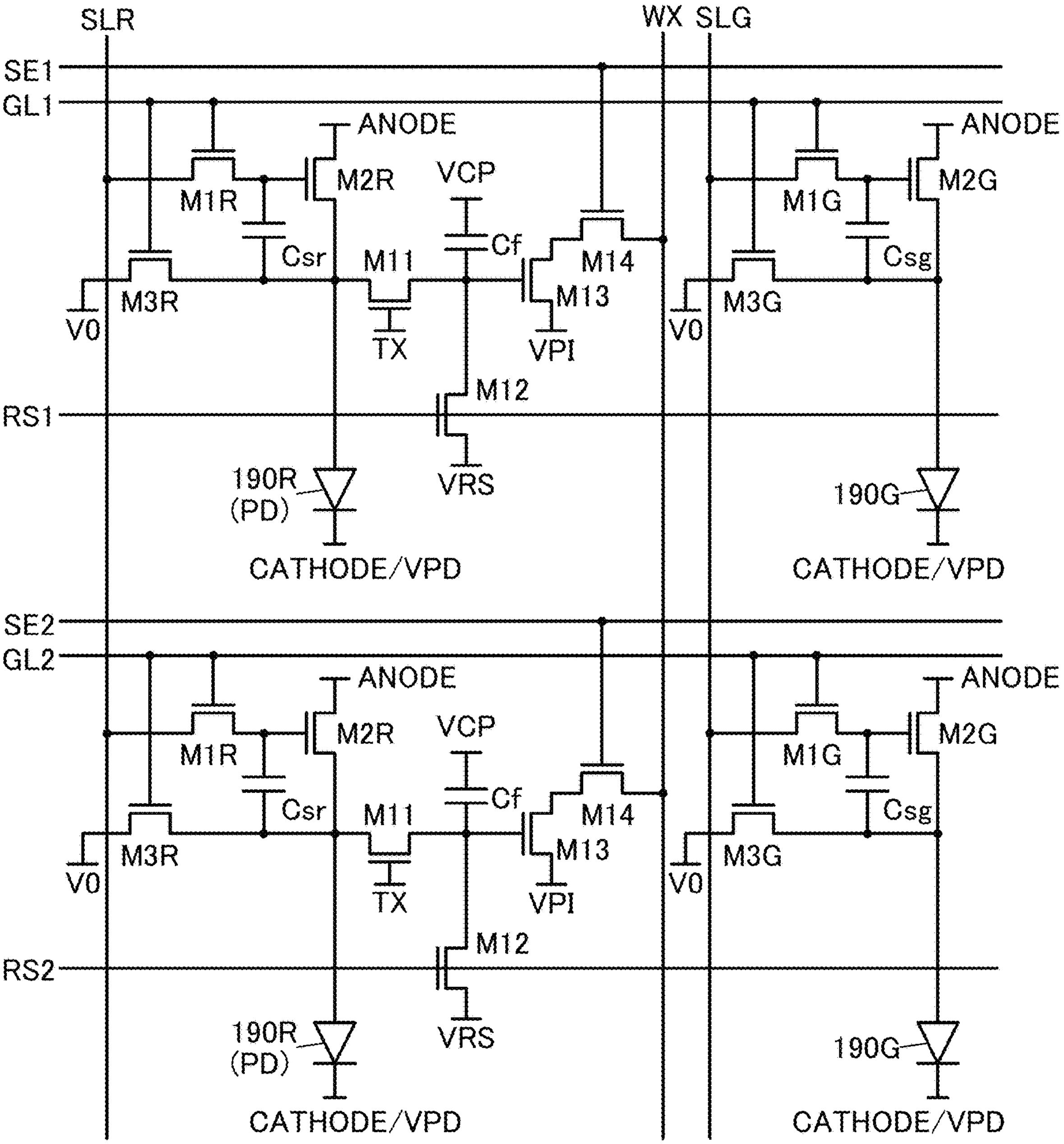
FIG. 19 is a circuit diagram showing an example of a pixel circuit.

FIG. 19 shows a pixel circuit of a subpixel (R·PD) and a subpixel (G) of the first row and a subpixel (R·PD) and a subpixel (G) of the second row. The circuit structure of each subpixel is similar to that in FIG. 15.

An example in which an image is displayed using the subpixel (R·PD) and the subpixel (G) of the first row and image capturing is performed using the subpixel (R·PD) and the subpixel (G) of the second row will be described below.

First, the potential of the wiring GL1 of the first row is set to a high potential and the potentials of the wiring TX, the wiring RS1, and the wiring SE1 are set to low potentials. Accordingly, the transistors M1R and M3R of the subpixel (R·PD) and the transistors M1G and M3G of the subpixel (G) are turned on, so that image signals are supplied from the wiring SLR and the wiring SLG. At this time, the potential of the wiring WX1 is a low potential. Then, the potential of the wiring GL1 is set low to a low potential, so that the transistors M1R, M1G, M3R, and M3G are turned off and the operation of writing an image signal is terminated. The light-emitting and light-receiving device 190R(PD) and the light-emitting device 190G each emit light on the basis of the gate potential of the transistor M2R or M2G.

Next, the potential of the wiring GL2 of the second row is set to a high potential and the potentials of the wiring TX, the wiring RS2, and the wiring SE2 are set to low potentials. Accordingly, the transistors M1R and M3R of the subpixel (R·PD) and the transistors M1G and M3G of the subpixel (G) are turned on, so that a potential making the transistor M2R turned off completely is supplied from the wiring SLR and an image signal for image capturing is supplied from the wiring SLG. At this time, the potential of the wiring WX2 is a low potential. Then, the potential of the wiring GL2 is set low to a low potential, so that the transistors M1R, M1G, M3R, and M3G are turned off and the operation of writing a signal is terminated. The light-emitting device 190G emits light on the basis of the gate potential of the transistor M2G. In addition, when the above-described initialization operation, light-exposure operation, transfer operation, and detection operation are performed, imaging capturing can be performed in the subpixel (R·PD).

The function of an electronic device 6000 in which the display apparatus of one embodiment of the present invention is used as a display portion 6001 will be described with reference to FIG. 20A to FIG. 20C.

Figure 20A:
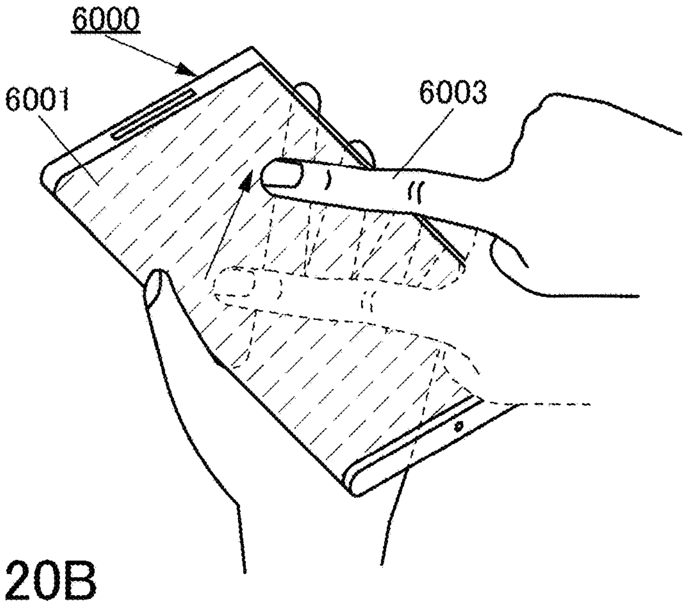
FIG. 20A to FIG. 20C are drawings showing examples of the function of an electronic device.

The display portion 6001 can function as a touch panel as illustrated in FIG. 20A. The display portion 6001 can detect a touch by a finger 6003 while displaying a full-color image.

Figure 20B:
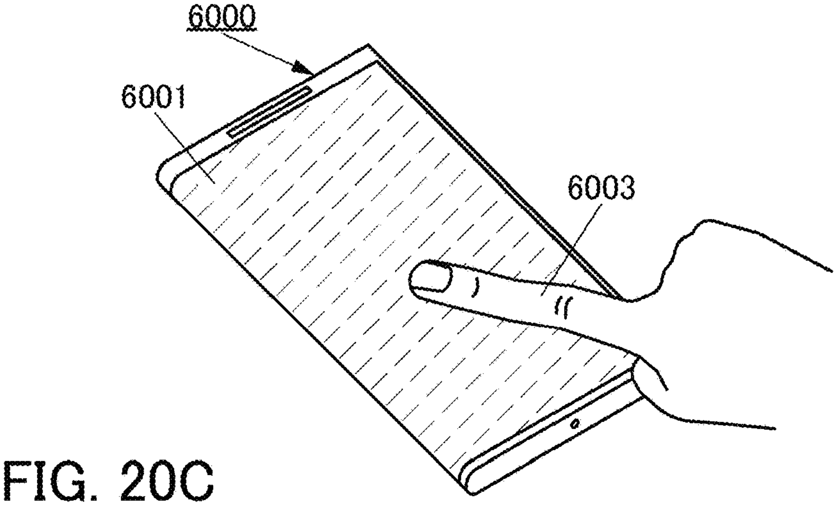
Figure 20C:
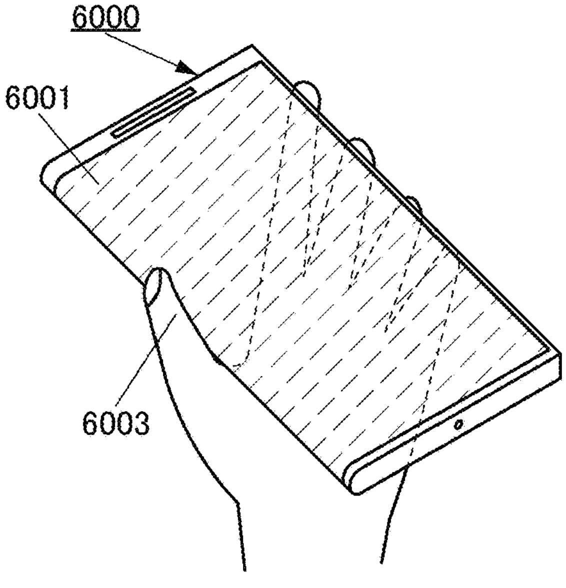

FIG. 20B illustrates an example of performing fingerprint identification of the finger 6003 touching the top surface of the display portion 6001, and FIG. 20C illustrates an example of performing fingerprint identification of the finger 6003 touching the side surface of the display portion 6001. Since the whole display portion of the display apparatus has a light-receiving function, the degree of freedom of a region used in fingerprint identification can be higher than that in the case where a fingerprint sensor is mounted in the electronic device in addition to the display apparatus. Furthermore, since the display apparatus of one embodiment of the present invention serves as all of a display panel, a fingerprint sensor, and a touch sensor, these need not be provided additionally, and therefore it is possible to reduce the size, thickness, and weight of the electronic device.

As described above, in the display apparatus of this embodiment, the subpixels (R·PD) that exhibit red light and have a light-receiving function can be used for both image display and light detection. Alternatively, some of the plurality of subpixels (R·PD) can be used for image display, and the others can be used for light detection. Accordingly, the display apparatus of this embodiment can be driven in any of an image display mode, an image capturing mode, and a mode of simultaneously performing image display and image capturing.

This embodiment can be combined with the other embodiments as appropriate.

Embodiment 3

In this embodiment, a driving method of a display apparatus of one embodiment of the present invention will be described with reference to FIG. 21 and FIG. 22.

In this embodiment, the case where the display apparatus of one embodiment of the present invention functions as a touch panel is described.

High resolution is required in capturing an image of a fingerprint and thus, it is preferable that imaging data obtained with a light-emitting and light-receiving device be individually read out one (pixel) by one (pixel) from all the pixels. In contrast, in the case where the display apparatus functions as a touch panel, a resolution as high as that required for fingerprint authentication is not required but a high-speed reading operation is required.

For example, when touch detection is performed all at once in a plurality of pixels, the driving frequency can be increased. The pixels in which simultaneous reading is performed can be determined as appropriate to be 4 pixels (2×2 pixels), 9 pixels (3×3 pixels), or 16 pixels (4×4 pixels), for example.

Figure 21A:
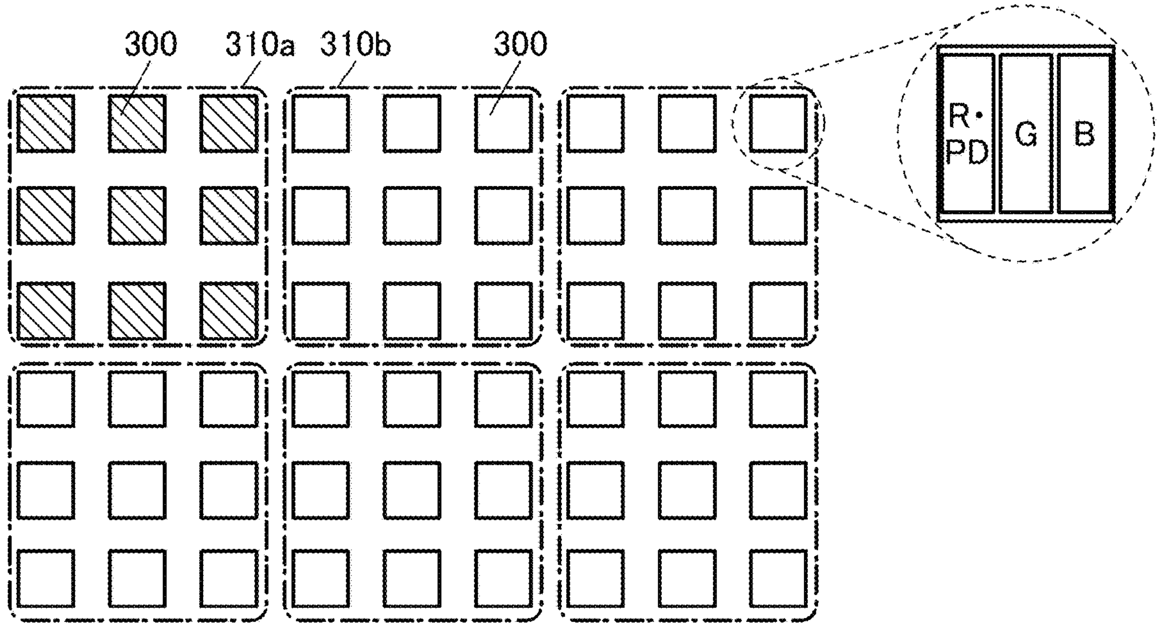
FIG. 21A and FIG. 21B are drawings showing examples of a method for driving a display apparatus.

FIG. 21A illustrates an example in which imaging data of the light-emitting and light-receiving devices (R·PD) included in a plurality of pixels are collectively read out.

One pixel 300 includes a light-emitting and light-receiving device (R·PD) having a light-receiving function, a subpixel (G) that exhibits green light, and a subpixel (B) that exhibits blue light. Although FIG. 21A illustrates an example in which a unit 310 includes nine pixels 300 (3×3 pixels), the number of pixels included in the unit 310 is not particularly limited. The pixels 300 included in the same unit 310 are subjected to imaging data reading at the same time. For example, the imaging data in a unit 310_a_ is read first; then, the imaging data in a unit 310_b_ is read out. Thus, the number of times of reading can be smaller than that in the case where imaging data is individually read pixel by pixel, and the driving frequency can be increased. The imaging data in the unit 310*a* is data in which the imaging data in the plurality of pixels 300 (here, the nine pixels 300) are added together; thus, the sensitivity can be higher than that in the case where image capturing is performed pixel by pixel.

Alternatively, touch detection may be performed using only some pixels. For example, pixels used for touch detection can be determined as appropriate to be one pixel out of four pixels (2×2 pixels), one pixel out of 100 pixels (10×10 pixels), or one pixel out of 900 pixels (30×30 pixels), for example.

Figure 21B:
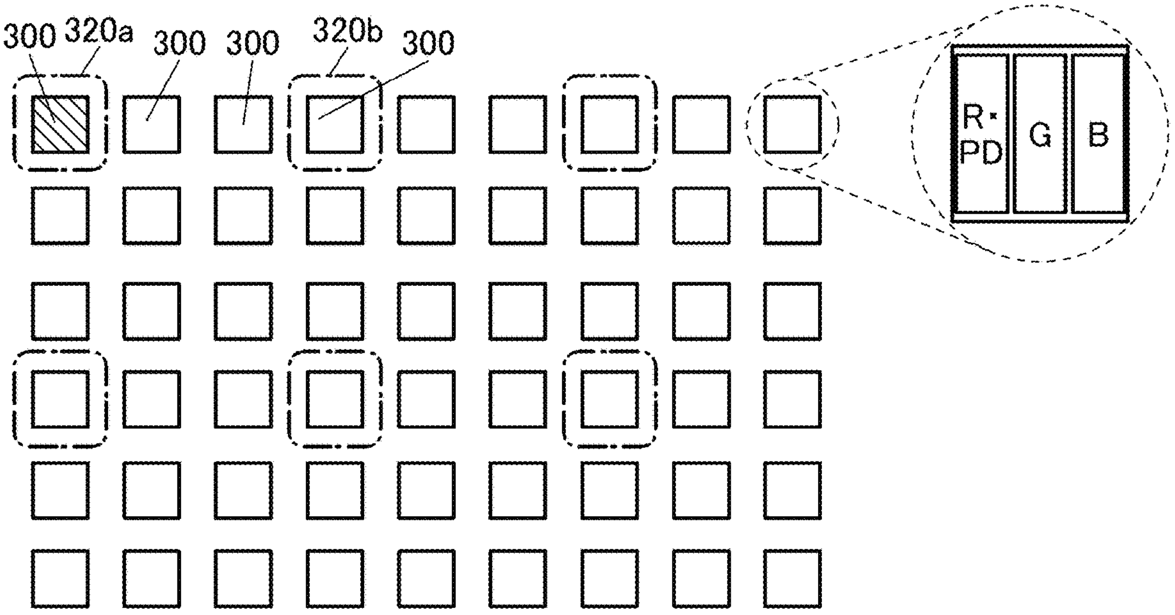

FIG. 21B illustrates examples of touch detection using only some pixels.

One pixel 300 includes a light-emitting and light-receiving element (R·PD), a subpixel (G) that exhibits green light, and a subpixel (B) that exhibits blue light. Target pixels 320 that are a reading target are only the pixels 300 surrounded by dashed-dotted lines. FIG. 21B illustrates an example in which the number of target pixels 320 used for touch detection is one pixel out of nine pixels (3×3 pixels); however, the number of target pixels 320 is not particularly limited. First, imaging data of a target pixel 320*a* is read out, and imaging data of a target pixel 320*b* is then read out. Imaging data is not read from the pixels 300 positioned between the target pixel 320*a* and the target pixel 320*b*. Thus, the number of times of reading can be smaller than that in the case where imaging data is read pixel by pixel from all the pixels, and the driving frequency can be increased.

Note that when only a particular pixel 300 is used as the target pixel 320, the degradation degree of the light-emitting and light-receiving device may vary between the pixels 300. Therefore, it is preferable the plurality of pixels 300 be serve as the target pixel 320 in turn. For example, in the case where one pixel out of nine pixels is used as the target pixel 320, the target pixel 320 may shift one row by one row or one column by one column so that three pixels can serve as the target pixel 320 in turn. All the nine pixels may serve as the target pixel 320 in turn.

The display apparatus of one embodiment of the present invention preferably has two or more kinds of operation modes of the light-emitting and light-receiving device so that switching therebetween is possible. For example, switching between a mode of performing reading pixel by pixel individually from all the pixels and a mode of performing reading collectively from a plurality of pixels is preferably possible. Alternatively, switching between a mode of performing reading from all the pixels and a mode of performing reading from some of the pixels is preferably possible. Thus, image capturing at a high resolution can be performed in fingerprint image capturing, and touch detection at a high driving frequency can be performed in displaying an image.

Furthermore, the influence of ambient light which is noise in touch detection is preferably removed.

For example, lighting and non-lighting of the light-emitting device are made to repeat periodically in some pixels, and a difference in detection intensity of the light-emitting and light-receiving device between a lighting period and a non-lighting period is obtained, so that the influence of ambient light can be removed. Note that it is preferable that the number of pixels where lighting and non-lighting repeat be two or more within the range not affecting images displayed on the display apparatus. Furthermore, lighting and non-lighting of the light-emitting device are preferably made to repeat at intervals of one frame; for example, a lighting pixel and a non-lighting pixel may be exchanged between an odd-numbered frame and an even-numbered frame. Note that the emission color in the lighting period is not particularly limited.

Figure 22A:
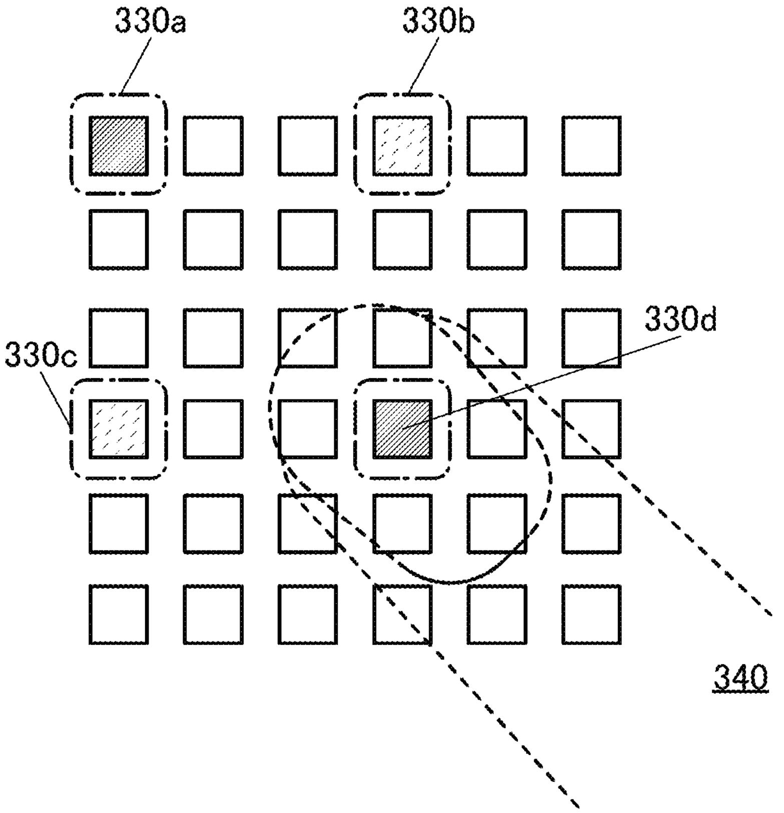
FIG. 22A and FIG. 22B are drawings showing examples of a method for driving a display apparatus.
Figure 22B:
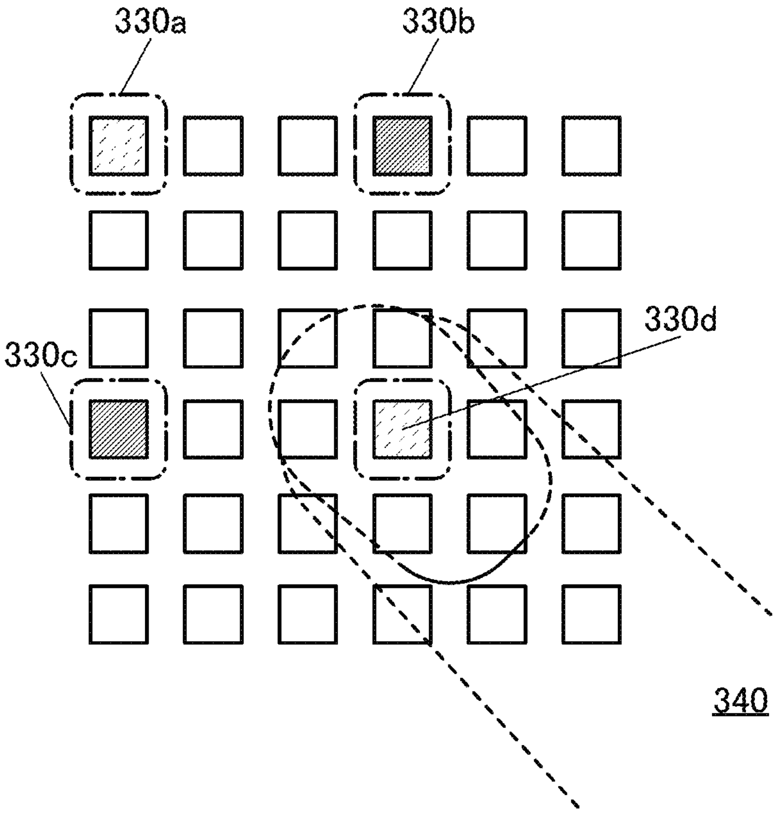

A pixel 330*a* and a pixel 330*d* are in a non-lighting state and a pixel 330*b* and a pixel 330*c* are in a lighting state in FIG. 22A, whereas the pixel 330*a* and the pixel 330*d* are in a lighting state and the pixel 330*b* and the pixel 330*c* are in a non-lighting state in FIG. 22B.

The pixel 330*b* detects ambient light and thus, the detection intensity of the light-emitting and light-receiving device does not change between the lighting period and the non-lighting period of the light source. In contrast, the pixel 330*d* detects the light reflected by a finger 340 and thus, the detection intensity of the light-emitting and light-receiving device changes between the lighting period and the non-lighting period of the light-emitting device. Utilizing this difference in detection intensity between the lighting period and the non-lighting period, the influence of ambient light can be removed.

As described above, the display apparatus of this embodiment can be driven in either of a mode of performing image capturing for each unit and a mode of performing image capturing for each light-emitting and light-receiving device. For example, a mode of performing image capturing for each unit can be employed when high-speed operation is needed. Furthermore, a mode of performing image capturing pixel (light-emitting and light-receiving device) by pixel (light-emitting and light-receiving element) can be employed when high-resolution image capturing is needed. By changing the driving mode in accordance with the usage, the functionality of the display apparatus can be increased.

This embodiment can be combined with the other embodiments as appropriate.

Embodiment 4

In this embodiment, a pixel layout that can be used in a display apparatus of one embodiment of the present invention will be described. Note that the arrangement of subpixels is not limited to the illustrated order. For example, the positions of a subpixel (B) and a subpixel (B) may be reversed.

Figure 23A:
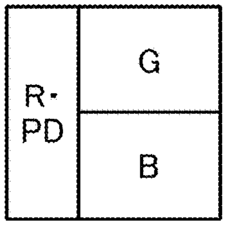
FIG. 23A to FIG. 23D are top views showing examples of pixels.

A pixel illustrated in FIG. 23A includes a subpixel (R·PD) that exhibits red light and has a light-receiving function, a subpixel (G) that exhibits green light, and a subpixel (B) that exhibits blue light. The subpixel (R·PD) is provided in a column different from a column where the subpixel (G) and the subpixel (B) are positioned. The subpixel (G) and the subpixel (B) are alternately arranged in the same column; one is provided in an odd-numbered row and the other is provided in an even-numbered row. The color of the subpixel positioned in a column different from the column where the subpixels of the other colors are positioned is not limited to red (R) and may be green (G) or blue (B).

Figure 23B:
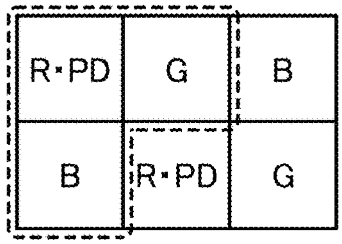

FIG. 23B illustrates two pixels, each of which is composed of three subpixels surrounded by dotted lines. A pixel illustrated in FIG. 23B includes a subpixel (R·PD) that exhibits red light and has a light-receiving function, a subpixel (G) that exhibits green light, and a subpixel (B) that exhibits blue light. In the pixel on the left in FIG. 23B, the subpixel (G) is positioned in the same row as the subpixel (R·PD), and the subpixel (B) is positioned in the same column as the subpixel (R·PD). In the pixel on the right in FIG. 23B, the subpixel (G) is positioned in the same row as the subpixel (R·PD), and the subpixel (B) is positioned in the same column as the subpixel (R·PD). In every odd-numbered row and every even-numbered row of the pixel layout illustrated in FIG. 23B, the subpixel (R·PD), the subpixel (G), and the subpixel (B) are repeatedly arranged. In addition, subpixels of different colors are arranged in the odd-numbered row and the even-numbered row in every column.

Figure 23C:
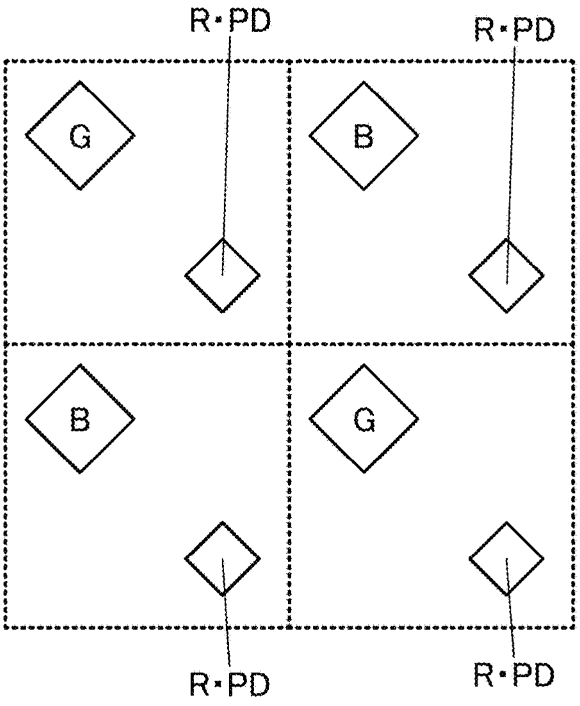

FIG. 23C is a modification example of the pixel arrangement of FIG. 1G. The upper-left pixel and the lower-right pixel in FIG. 23C each include a subpixel (R·PD) that exhibits red light and has a light-receiving function and a subpixel (G) that exhibits green light. The lower-left pixel and the upper-right pixel in FIG. 23C each include a subpixel (R·PD) that exhibits red light and has a light-receiving function and a subpixel (B) that exhibits blue light.

In FIG. 1G, the subpixel (G) that exhibits green light is provided in each pixel. In FIG. 23C, the subpixel (R·PD) that exhibits red light and has a light-receiving function is provided in each pixel. The structure illustrated in FIG. 23C achieves higher-resolution image capturing than the structure illustrated in FIG. 1G because a subpixel having a light-receiving function is provided in each pixel. Thus, the accuracy of biometric authentication can be increased, for example.

The top-surface shape of the light-emitting devices and the light-emitting and light-receiving devices is not particularly limited and can be a circular shape, an elliptical shape, a polygonal shape, a polygonal shape with rounded corners, or the like. The top-surface shape of the light-emitting devices included in the subpixels (G) is a circular in the example in FIG. 1G and square in the example in FIG. 23C. The top surface shape of the light-emitting devices and the light-emitting and light-receiving devices may vary depending on the color thereof, or the light-emitting devices and the light-emitting and light-receiving devices of some colors or every color may have the same top-surface shape.

The aperture ratio of subpixels may vary depending on the color of the subpixels, or may be the same among the subpixels of some colors or every color. For example, the aperture ratio of a subpixel provided in each pixel (the subpixel (G) in FIG. 1G, and the subpixel (R·PD) in FIG. 23C) may be made lower than that of a subpixel of another color.

Figure 23D:
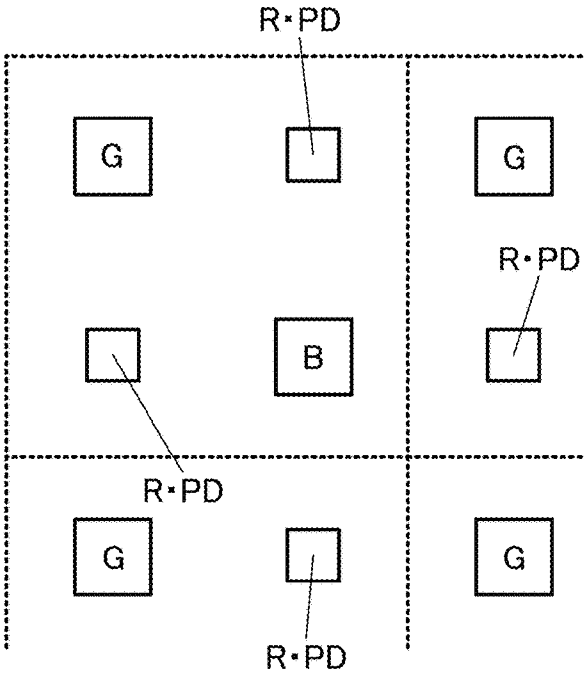

FIG. 23D is a modification example of the pixel arrangement of FIG. 23C. Specifically, the structure of FIG. 23D is obtained by rotating the structure of FIG. 23C by 45°. Although one pixel is regarded as being formed of two subpixels in FIG. 23C, one pixel can be regarded as being formed of four subpixels as illustrated in FIG. 23D.

In the description with reference to FIG. 23D, one pixel is regarded as being formed of four subpixels surrounded by dotted lines. A pixel includes two subpixels (R·PD), one subpixel (G), and one subpixel (B). The pixel including a plurality of subpixels having a light-receiving function allows high-resolution image capturing. Accordingly, the accuracy of biometric authentication can be increased. For example, the resolution of image capturing can be the square root of 2 times the resolution of display.

A display apparatus which employs the structure illustrated in FIG. 23C or FIG. 23D includes p (p is an integer greater than or equal to 2) first light-emitting devices, q (q is an integer greater than or equal to 2) second light-emitting devices, and r (r is an integer greater than p and greater than q) light-emitting and light-receiving devices. p and r satisfy $r=2p$, p, q, and r satisfy $r=p+q$. Either the first light-emitting devices or the second light-emitting devices emits green light, and the other light-emitting devices emit blue light. The light-emitting and light-receiving devices emit red light and have a light-receiving function.

In the case where touch detection is performed with the light-emitting and light-receiving devices, for example, it is preferable that light emitted by a light source be hard for a user to recognize. Since blue light has low visibility than green light, light-emitting devices which emit blue light are preferably used as a light source. Accordingly, the light-emitting and light-receiving devices preferably have a function of receiving blue light.

As described above, the display apparatus of this embodiment can employ any of various types of pixel arrangements.

This embodiment can be combined with the other embodiments as appropriate.

Embodiment 5

Described in this embodiment is a metal oxide (hereinafter also referred to as an oxide semiconductor) that can be used in an OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of crystal structures of an oxide semiconductor is described with reference to FIG. 24A. FIG. 24A is a diagram showing the classification of crystal structures of an oxide semiconductor, typically IGZO (a metal oxide containing In, Ga, and Zn).

As shown in FIG. 24A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 24A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. Here, XRD spectra of a quartz glass substrate and an IGZO film having a crystal structure classified into "Crystalline" (also referred to as Crystalline IGZO), which are obtained by a GIXD (Grazing-Incidence) XRD measurement, are shown in FIG. 11B and FIG. 11C, respectively. Note that a GIXD method is also referred to as a thin film method or a Seemann-Bohlin method. The XRD spectrum that is shown in FIG. 24B and FIG. 24C and obtained by GIXD measurement is hereinafter simply referred to as an XRD spectrum. FIG. 24B shows an XRD spectrum of a quartz glass substrate, and FIG. 24C shows an XRD spectrum of a crystalline IGZO film. In each of FIG. 24A and FIG. 24C, the vertical axis (Intensity [a.u.]) represents the intensity (arbitrary unit). Note that the crystalline IGZO film shown in FIG. 24C has a composition in the vicinity of In:Ga:Zn=4:2:3 [atomic ratio]. Furthermore, the crystalline IGZO film shown in FIG. 24C has a thickness of 500 nm.

As indicated by arrows in FIG. 24B, the XRD spectrum of the quartz glass substrate shows a peak with a substantially bilaterally symmetrical shape. In contrast, as indicated by arrows in FIG. 24C, the XRD spectrum of the crystalline IGZO film shows a peak with a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum. Note that in FIG. 24C, a crystal phase (IGZO crystal phase) is denoted at 20 of 31° or in the vicinity thereof. The bilaterally asymmetrical peak of the XRD spectrum is probably attributed to a diffraction peak derived from such a crystal phase (a fine crystal).

Specifically, interference of an X-ray scattered by atoms contained in IGZO probably contributes to a peak at $2\theta=34°$ or in the vicinity thereof. In addition, the fine crystal probably contributes to the peak at $2\theta=31°$ or in the vicinity thereof. In the XRD spectrum of the crystalline IGZO film shown in FIG. 24C, the peak at 20 of 34° or in the vicinity thereof is wide on the lower angle side. This indicates that the crystalline IGZO film includes a fine crystal attributed to the peak at $2\theta$ of 31° or in the vicinity thereof.

A crystal structure of a film or a substrate can also be evaluated with a diffraction pattern obtained by a nanobeam electron diffraction (NBED) method (such a pattern is also referred to as a nanobeam electron diffraction pattern). Diffraction patterns of the quartz glass substrate and the IGZO film formed with a substrate temperature set at room temperature are shown in FIG. 24D and FIG. 24E, respectively. FIG. 24D shows the diffraction pattern of the quartz glass substrate and FIG. 24E shows the diffraction pattern of the IGZO film. Note that the IGZO film of FIG. 24E is formed by a sputtering method using an In—Ga—Zn oxide target with In:Ga:Zn=1:1:1 [atomic ratio]. In the nanobeam electron diffraction method, electron diffraction is performed with a probe diameter of 1 nm.

Note that as shown in FIG. 24D, a halo pattern is observed in the diffraction pattern of the quartz glass substrate, which indicates that the quartz glass substrate is in an amorphous state. As shown in FIG. 24E, not a halo pattern but a spot-like pattern is observed in the diffraction pattern of the IGZO film formed at room temperature. Thus, it is presumed that the IGZO film formed at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from that in FIG. 24A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution transmission electron microscope (TEM) image, for example.

When the CAAC-OS film is subjected to structural analysis by out-of-plane XRD measurement with an XRD apparatus using $\theta/2\theta$ scanning, for example, a peak indicating c-axis alignment is detected at $2\theta$ of 31° or in the vicinity thereof. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. Furthermore, a pentagonal or heptagonal lattice arrangement, for example, is included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[A-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, [In] of the first region in the CAC-OS in the In—Ga—Zn oxide is higher than [In] in the composition of the CAC-OS film. Moreover, [Ga] of the second region is higher than [Ga] in the composition of the CAC-OS film. Alternatively, for example, the first region has higher [In] than the second region and lower [Ga] than the second region. Moreover, the second region has higher [Ga] than the first region and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly dispersed to form a mosaic pattern. Thus, it is suggested that the CAC-OS has a structure in which metal elements are unevenly distributed.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. The flow rate of the oxygen gas to the total flow rate of the deposition gas in deposition is preferably as low as possible; for example, the flow rate of the oxygen gas to the total flow rate of the deposition gas in deposition is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility (μ) can be achieved.

The second region has a higher insulating property than the first region. In other words, when the second regions are distributed in a metal oxide, leakage current can be inhibited.

Thus, in the case where a CAC-OS is used for a transistor, by the complementary function of the conducting function due to the first region and the insulating function due to the second region, the CAC-OS can have a switching function (On/Off function). A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

A transistor using a CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used for the transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times 10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal tends to have normally-on characteristics. Thus, the concentration of an alkali metal or an alkaline earth metal in the oxide semiconductor, which is obtained by SIMS, is set lower than or equal to $1\times10^{18}$ atoms/$cm^3$, preferably lower than or equal to $2\times10^{16}$ atoms/$cm^3$.

An oxide semiconductor containing nitrogen easily becomes n-type by generation of electrons serving as carriers and an increase in carrier concentration. Thus, a transistor using an oxide semiconductor containing nitrogen as the semiconductor tends to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given.

This embodiment can be combined with the other embodiments as appropriate.

Embodiment 6

In this embodiment, electronic devices of embodiments of the present invention will be described with reference to FIG. 25 to FIG. 27.

An electronic device in this embodiment includes a display apparatus of one embodiment of the present invention. For example, the display apparatus of one embodiment of the present invention can be used in a display portion of the electronic device. The display apparatus of one embodiment of the present invention has a function of detecting light, and is thus capable of performing biological authentication with the display portion or detecting touch or approach on/to the display portion. Thus, the electronic device can have improved functionality and convenience, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 25A:
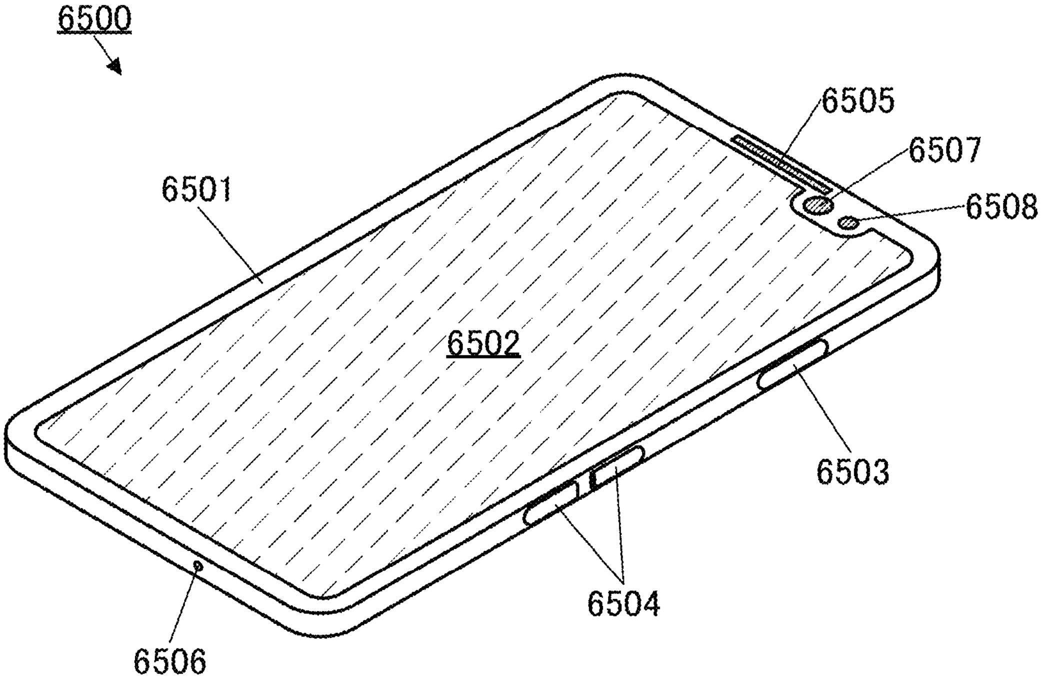
FIG. 25A and FIG. 25B are diagrams illustrating an example of an electronic device.

An electronic device 6500 illustrated in FIG. 25A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 25B:
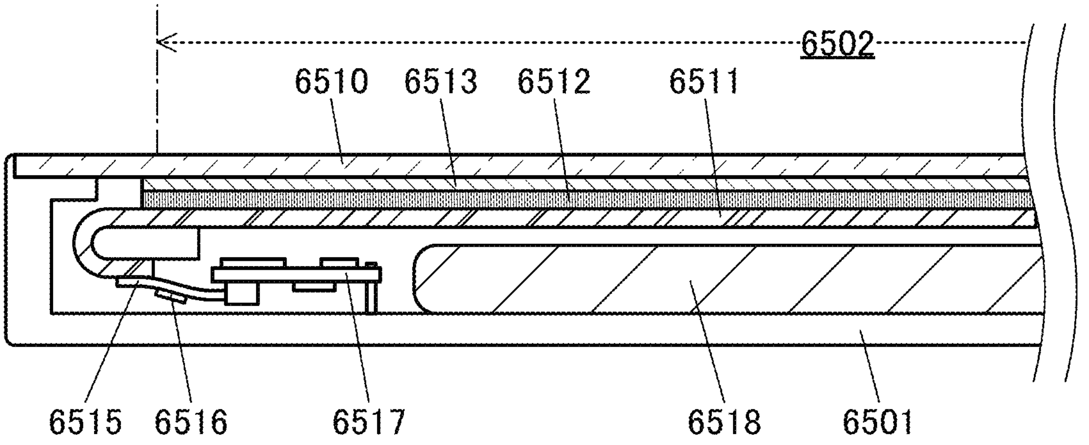

FIG. 25B is a schematic cross-sectional view including an end portion of the housing 6501 on the microphone 6506 side.

A protection member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted with the thickness of the electronic device controlled. An electronic device with a narrow frame can be achieved when part of the display panel 6511 is folded back so that the portion connected to the FPC 6515 is provided on the rear side of a pixel portion.

Using the display apparatus of one embodiment of the present invention as the display panel 6511 allows image capturing on the display portion 6502. For example, an image of a fingerprint is captured by the display panel 6511; thus, fingerprint identification can be performed.

By further including the touch sensor panel 6513, the display portion 6502 can have a touch panel function. A variety of types such as a capacitive type, a resistive type, a surface acoustic wave type, an infrared type, an optical type, and a pressure-sensitive type can be used for the touch sensor panel 6513. Alternatively, the display panel 6511 may function as a touch sensor; in such a case, the touch sensor panel 6513 is not necessarily provided.

Figure 26A:
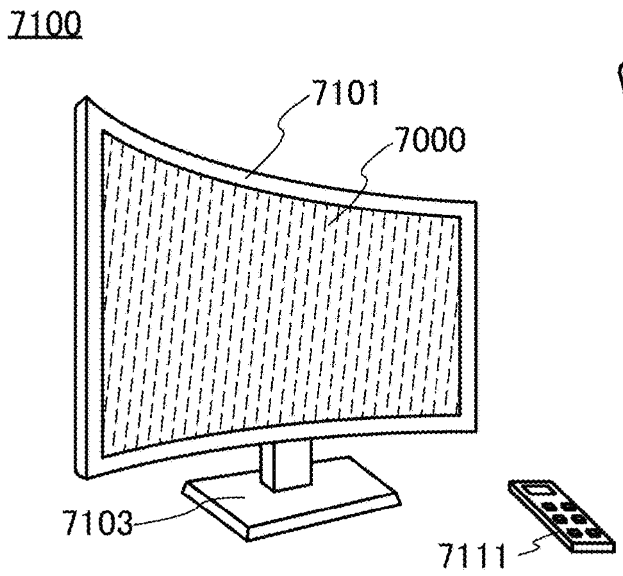
FIG. 26A to FIG. 26D are diagrams illustrating examples of electronic devices.

FIG. 26A illustrates an example of a television device. In a television device 7100, a display portion 7000 is incorporated in a housing 7101. Here, a structure in which the housing 7101 is supported by a stand 7103 is illustrated.

A display apparatus of one embodiment of the present invention can be used in the display portion 7000.

The television device 7100 illustrated in FIG. 26A can be operated with an operation switch provided in the housing 7101 or a separate remote controller 7111. Alternatively, the display portion 7000 may include a touch sensor, and the television device 7100 may be operated by a touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 26B:
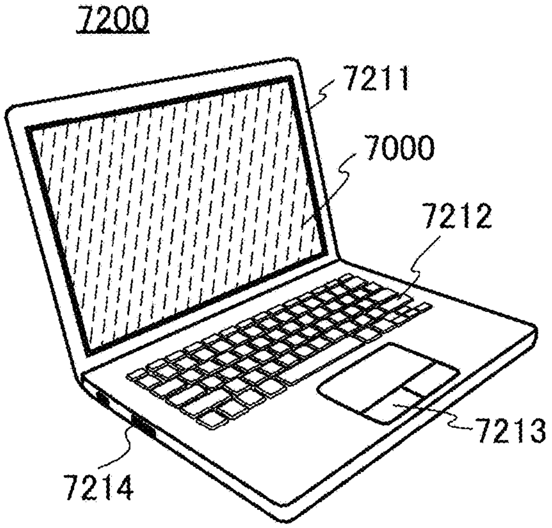

FIG. 26B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

A display apparatus of one embodiment of the present invention can be used in the display portion 7000.

Figure 26C:
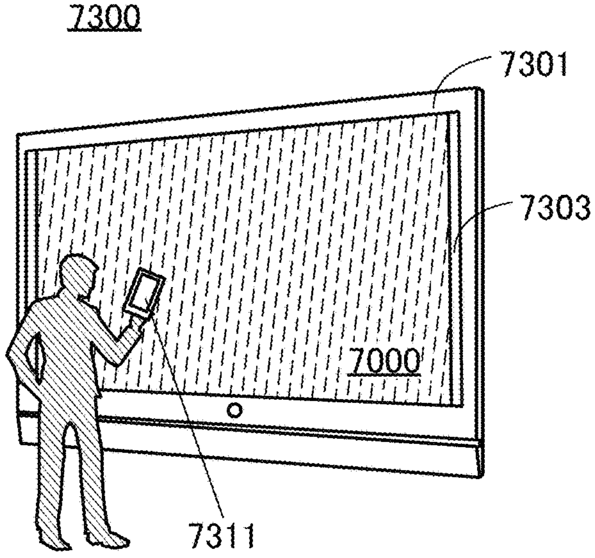
Figure 26D:
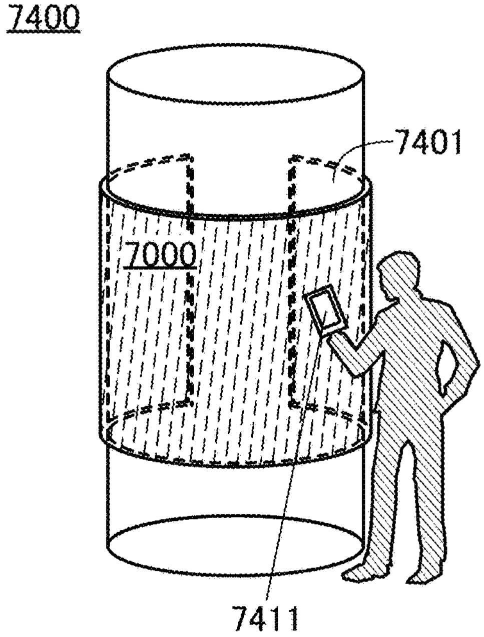

FIG. 26C and FIG. 26D illustrate examples of digital signage.

Digital signage 7300 illustrated in FIG. 26C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 26D illustrates digital signage 7400 mounted on a cylindrical pillar 7401. The digital signage 7400 includes the display portion 7000 provided along a curved surface of the pillar 7401.

The display apparatus of one embodiment of the present invention can be used for the display portion 7000 in FIG. 26C and FIG. 26D.

A larger area of the display portion 7000 can increase the amount of data that can be provided at a time. The larger display portion 7000 attracts more attention, so that the advertising effectiveness can be enhanced, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 26C and FIG. 26D, the digital signage 7300 or the digital signage 7400 is preferably capable of working with an information terminal 7311 or an information terminal 7411 such as a user's smartphone through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 27A to FIG. 27F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 27A to FIG. 27F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 27A to FIG. 27F are described below.

Figure 27A:
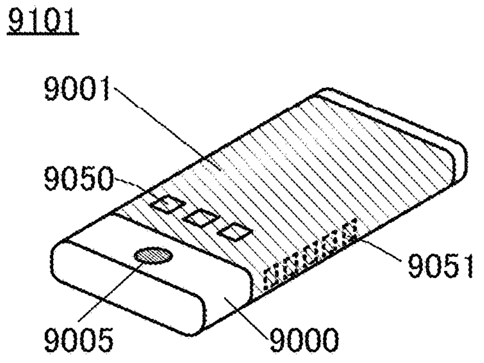
FIG. 27A to FIG. 27F are diagrams illustrating examples of electronic devices.

FIG. 27A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, and the like. The portable information terminal 9101 can display characters and image information on its plurality of surfaces. FIG. 27A shows an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 27B:
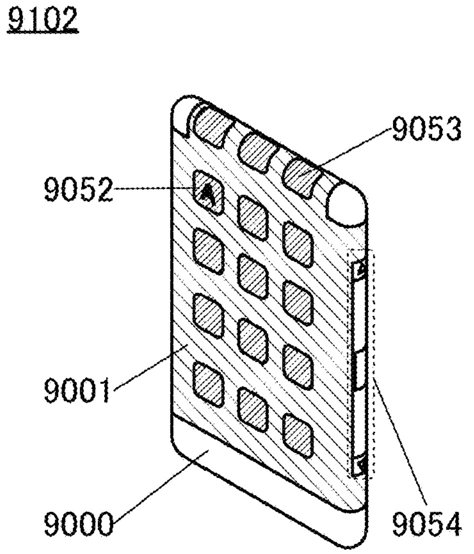

FIG. 27B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 27C:
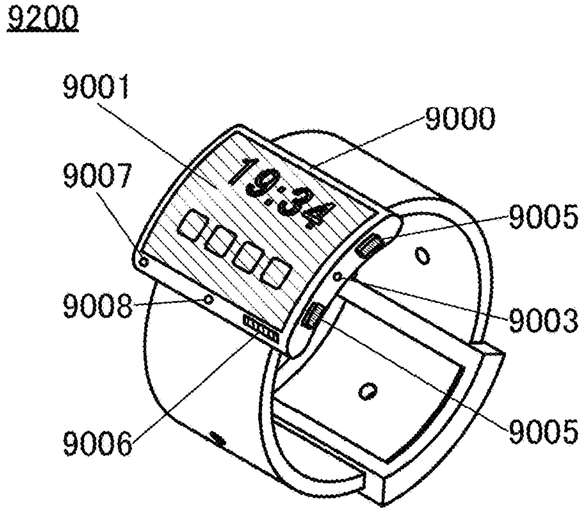

FIG. 27C is a perspective view illustrating a watch-type portable information terminal 9200. For example, the portable information terminal 9200 can be used as a smartwatch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 27D:
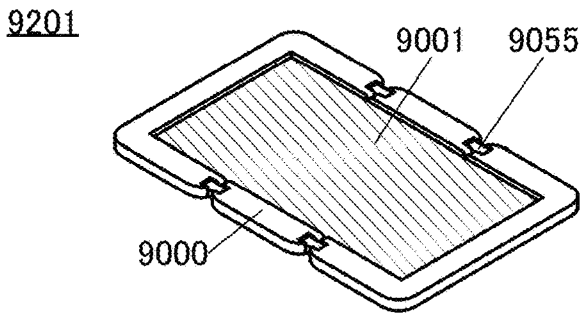
Figure 27E:
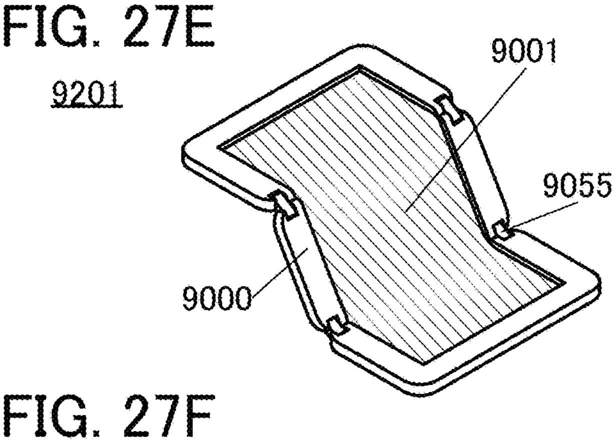
Figure 27F:
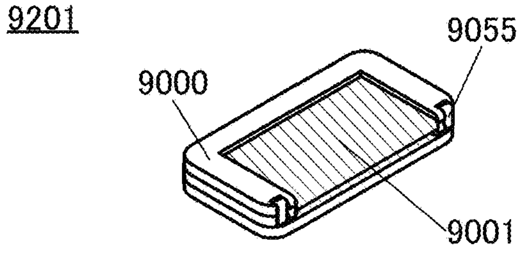

FIG. 27D to FIG. 27F are perspective views illustrating a foldable portable information terminal 9201. FIG. 27D is a perspective view of an opened state of the portable information terminal 9201, FIG. 27F is a perspective view of a folded state thereof, and FIG. 27E is a perspective view of a state in the middle of change from one of FIG. 27D and FIG. 27F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be curved with a radius of curvature greater than or equal to 0.1 mm and less than or equal to 150 mm.

This embodiment can be combined with the other embodiments as appropriate.

Example 1

In this example, results of evaluation of light-emitting and light-receiving devices that were fabricated to be used for the display apparatus of one embodiment of the present invention will be described.

In this example, two light-emitting and light-receiving devices (Device 1 and Device 2) were fabricated. The light-emitting and light-receiving devices fabricated in this example had a structure in common with a light-emitting device (organic EL device).

Chemical formulae of materials used in this example are shown below.

[Chemical formulae 1]

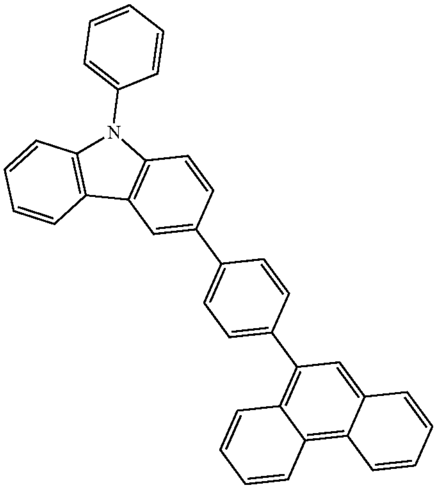

PCPPn

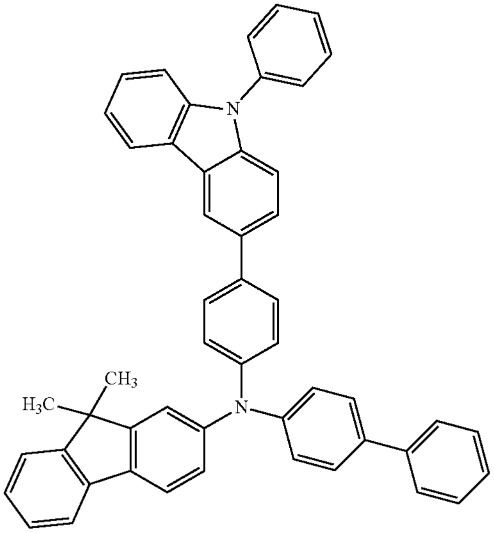

PCBBiF

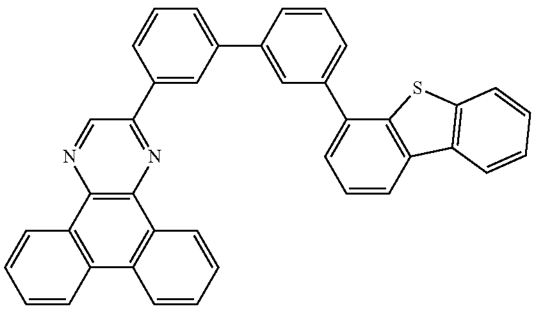

2mDBTBPDBq-II

-continued

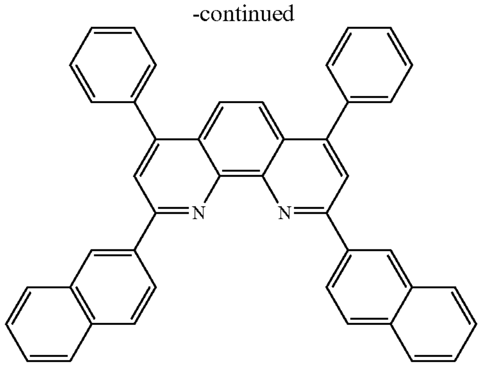

NBPhen

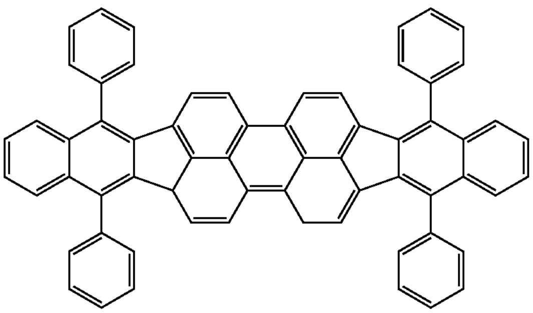

DBP

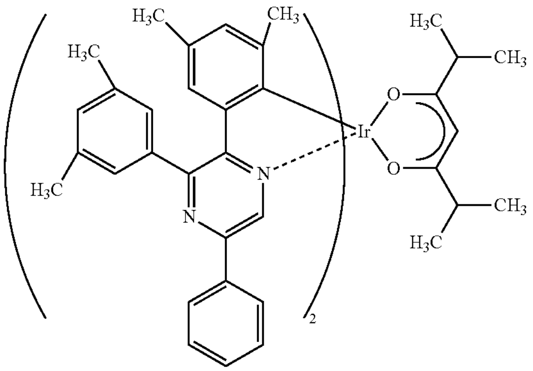

[Ir(dmdppr-P)$_2$(dibm)]

Table 1 shows specific structures of the light-emitting and light-receiving devices of this example. FIG. 2D illustrates a stacked-layer structure of Device 1. The stacked-layer structure of Device 1 can be fabricated by replacing a hole-transport layer of a light-emitting device with an active layer of a light-receiving device. FIG. 2C illustrates a stacked-layer structure of Device 2. The stacked-layer structure of Device 2 can be fabricated by adding an active layer of a light-receiving device to a light-emitting device.

TABLE 1

<table>
<tr><th></th><th>First electrode 180</th><th>Hole-injection layer 181</th><th>Active layer 183</th><th>Hole-transport layer 182</th><th>Light-emitting layer 193</th><th colspan="2">Electron-transport layer 184</th><th>Electron-injection layer 185</th><th colspan="2">Second electrode 189</th></tr>
<tr><td>Device 1</td><td rowspan="2">APC\ ITSO 100 nm\ 100 nm</td><td rowspan="2">PCPPn: MoOx (=2:1) 15 nm</td><td rowspan="2">$C_{70}$: DBP = 9:1 50 nm</td><td></td><td rowspan="2">*</td><td rowspan="2">2mDBTBPDBq-II 10 nm</td><td rowspan="2">NBPhen 10 nm</td><td rowspan="2">LiF 1 nm</td><td rowspan="2">Ag: Mg (=10:1) 10 nm</td><td rowspan="2">ITO 40 nm</td></tr>
<tr><td>Device 2</td><td>PCBBiF 15 nm</td></tr>
</table>

* 2mDBTBPDBq-II:PCBBiF: $[Ir(dmdppr-P)_2(dibm)]$ 0.8:0.2:0.06 70 nm

The first electrode 180 was formed in such a manner that an alloy film of silver (Ag), palladium (Pd), and copper (Cu) (Ag—Pd—Cu (APC)) was deposited to a thickness of 100 nm by a sputtering method, and a film of indium tin oxide containing silicon oxide (ITSO) was deposited to a thickness of 100 nm by a sputtering method.

The hole-injection layer 181 was formed by co-evaporation of 3-[4-(9-phenanthryl)-phenyl]-9-phenyl-9H-carbazole (abbreviation: PCPPn) and molybdenum oxide in a weight ratio of PCPPn:molybdenum oxide=2:1. The hole-injection layer 181 was formed to have a thickness of 15 nm.

The active layer 183 was formed by co-evaporation of fullerene ($C_{70}$) and tetraphenyldibenzoperiflanthene (abbreviation: DBP) in a weight ratio of $C_{70}$:DBP=9:1. The active layer 183 was formed to have a thickness of 50 nm.

The hole-transport layer 182 was not provided in Device 1 but provided in Device 2. For the hole-transport layer 182, N-(1,1'-biphenyl-4-yl)-N-[4-(9-phenyl-9H-carbazol-3-yl) phenyl]-9,9-dimethyl-9H-fluoren-2-amine (abbreviation: PCBBiF) was used and deposited by evaporation to a thickness of 15 nm.

The light-emitting layer 193 was formed to a thickness of 70 nm by co-evaporation of 2-[3'-(dibenzothiophen-4-yl) biphenyl-3-yl] dibenzo[f,h] quinoxaline (abbreviation: 2mDBTBPDBq-II), PCBBiF, and bis {4,6-dimethyl-2-[3-(3, 5-dimethylphenyl)-5-phenyl-2-pyrazinyl-κN] phenyl-κC} (2,6-dimethyl-3,5-heptanedionato-κ2O,O') iridium (III) (abbreviation: $[Ir\ (dmdppr-P)_2(dibm)]$) in a weight ratio of 0.8:0.2:0.06 (=2mDBTBPDBq-II:PCBBiF:$[Ir\ (dmdppr-P)_2(dibm)]$).

The electron-transport layer 184 was formed by sequential evaporation such that the thickness of 2mDBTBPDBq-II was 10 nm and the thickness of 2,9-bis(naphthalen-2-yl)-4, 7-diphenyl-1,10-phenanthroline (abbreviation: NBPhen) was 10 nm.

The electron-injection layer 185 was formed to a thickness of 1 nm by evaporation of lithium fluoride (LiF).

The second electrode 189 was formed in such a manner that silver (Ag) and magnesium (Mg) were deposited by co-evaporation in a volume ratio of 10:1 to have a thickness of 10 nm; then, indium tin oxide (ITO) was formed by a sputtering method to have a thickness of 40 nm.

In the above manner, the light-emitting and light-receiving devices of this example were fabricated.

[Characteristics as Light-Emitting Device]

Figure 28:
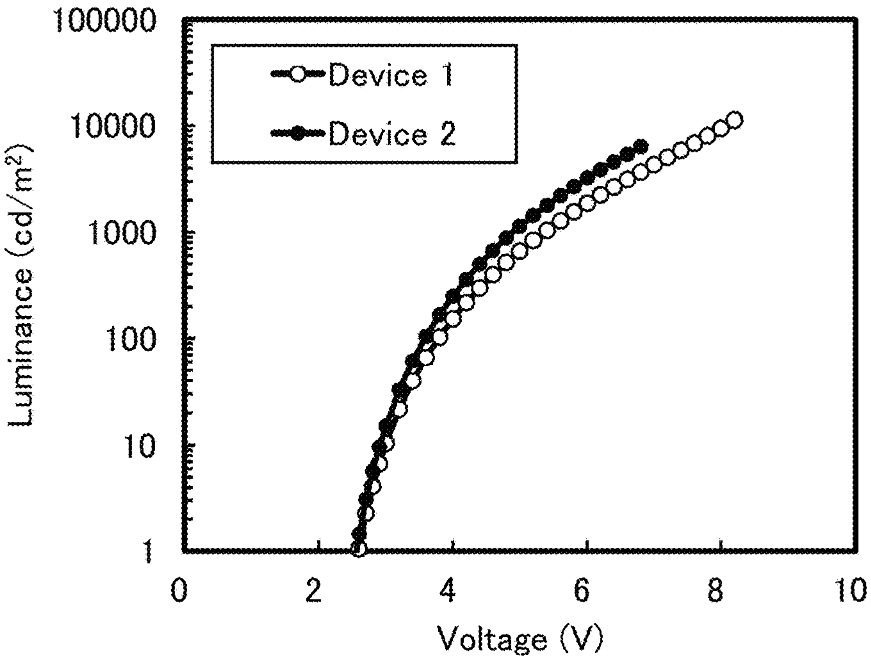
FIG. 28 is a graph showing the luminance-voltage characteristics of light-emitting and light-receiving devices.
Figure 29:
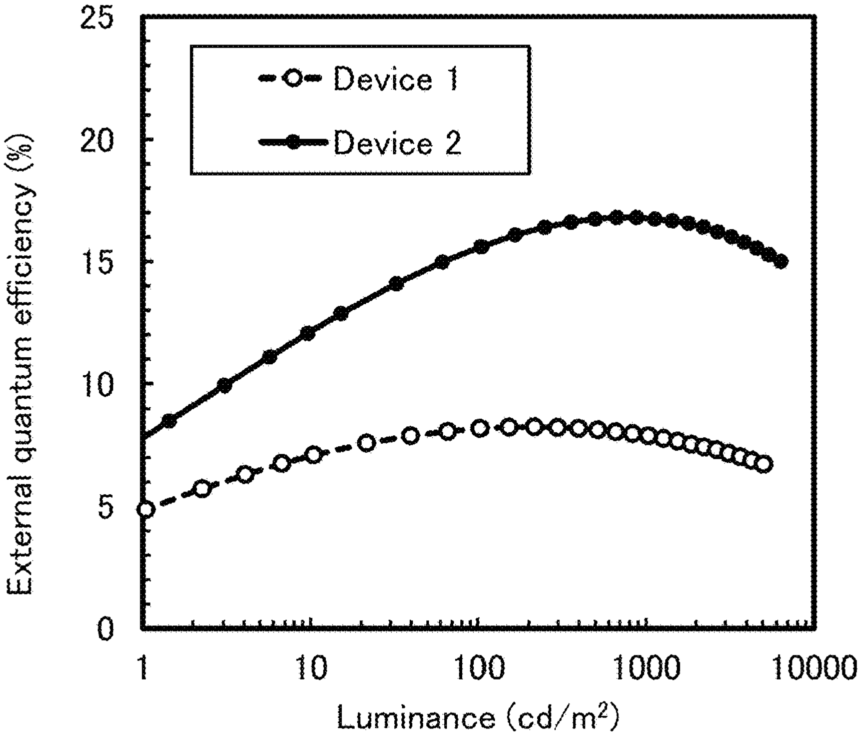
FIG. 29 is a graph showing the external quantum efficiency-luminance characteristics of light-emitting and light-receiving devices.

First, the characteristics of the light-emitting and light-receiving devices as light-emitting devices (characteristics at the time of forward bias application) were evaluated. FIG. 28 shows the luminance-voltage characteristics of the light-emitting and light-receiving devices. FIG. 29 shows the external quantum efficiency-luminance characteristics of the light-emitting and light-receiving devices.

Normal operation of Device 1 and Device 2 as light-emitting devices was observed. In particular, Device 2 in which the hole-transport layer 182 was provided between the active layer 183 and the light-emitting layer 193R had high external quantum efficiency.

[Characteristics as Light-Receiving Device]

Figure 30:
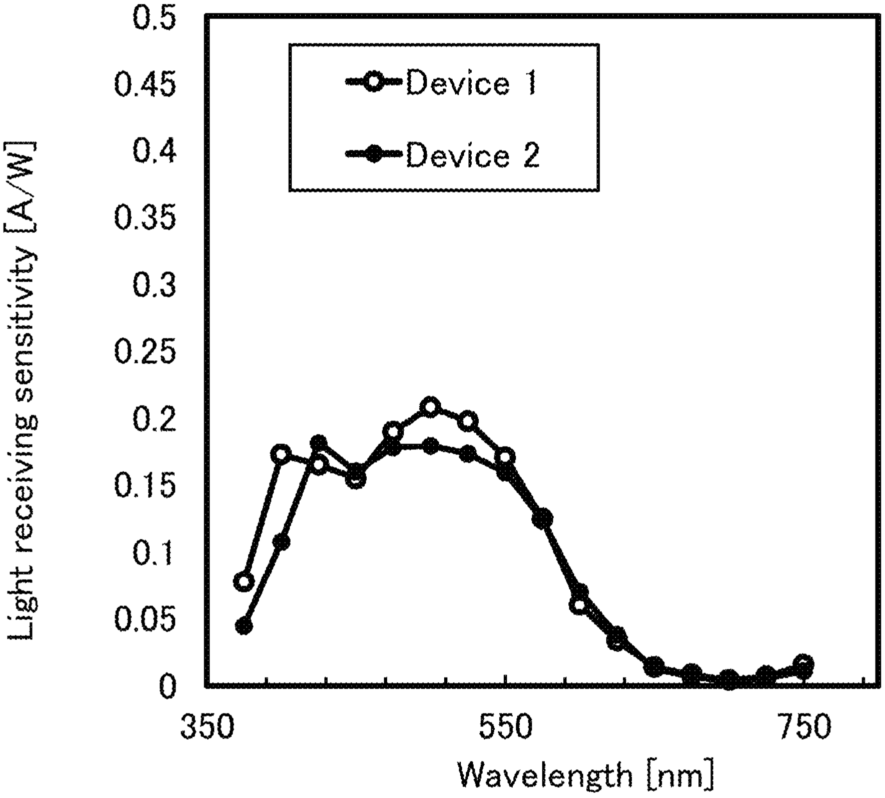
FIG. 30 is a graph showing wavelength dependence of light receiving sensitivity of light-emitting and light-receiving devices.

Next, the characteristics of the light-emitting and light-receiving devices as light-receiving devices (characteristics at the time of reverse bias application) were evaluated. FIG. 30 shows the wavelength dependence of light receiving sensitivity of the light-emitting and light-receiving devices. As for the measurement conditions, the voltage was −6 V and light irradiation was performed at 12.5 $\mu W/cm^2$. Note that the applied voltage is a value in the case where a bias usually applied to an EL device is positive. In other words, the positive bias is applied when the first electrode 180 side has a high potential and the second electrode 189 side has a low potential.

Normal operation of Device 1 and Device 2 as light-receiving devices was observed.

As described above, in this example, the light-emitting and light-receiving devices having a structure in common with a light-emitting device (organic EL device) were fabricated and they were able to have favorable characteristics as both light-emitting devices and light-receiving devices.

Example 2

In this example, results of evaluation of a light-emitting and light-receiving device that was fabricated to be used for the display apparatus of one embodiment of the present invention will be described The light-emitting and light-receiving device fabricated in this example had a structure in common with a light-emitting device (organic EL device).

The light-emitting and light-receiving device fabricated in this example had the same structure as Device 2 fabricated in Example 1 (see Table 1) except that the thickness of the active layer 183 was approximately 60 nm.

[Characteristics as Light-Receiving Device]

Figure 31:
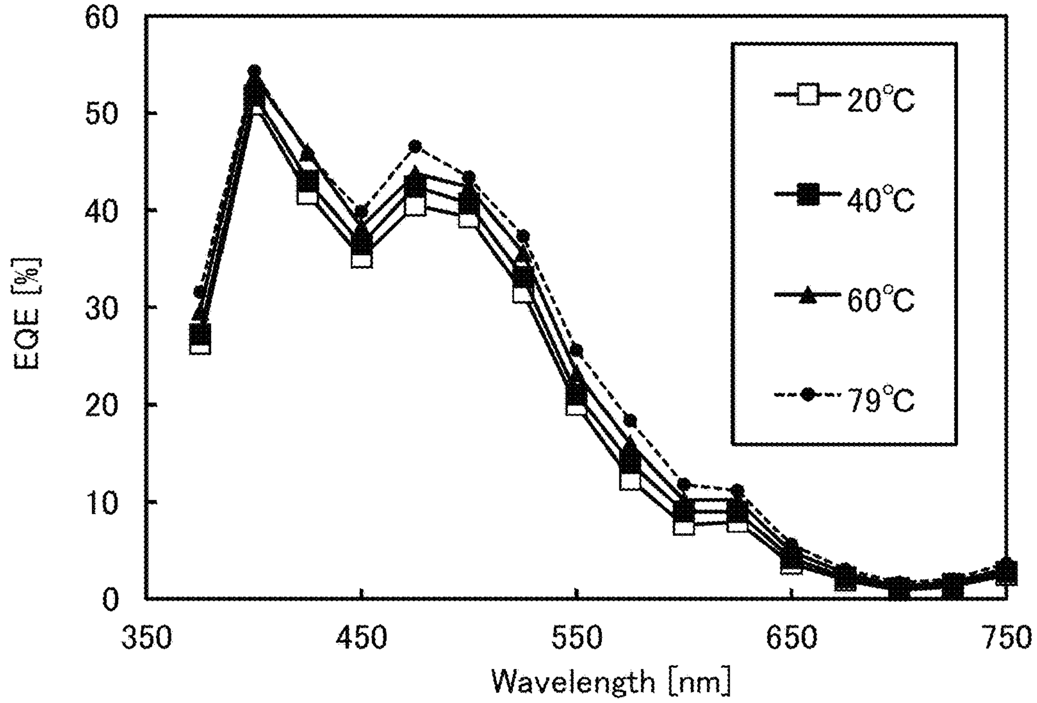
FIG. 31 is a graph showing wavelength dependence of light receiving sensitivity of a light-emitting and light-receiving device.
Figure 32:
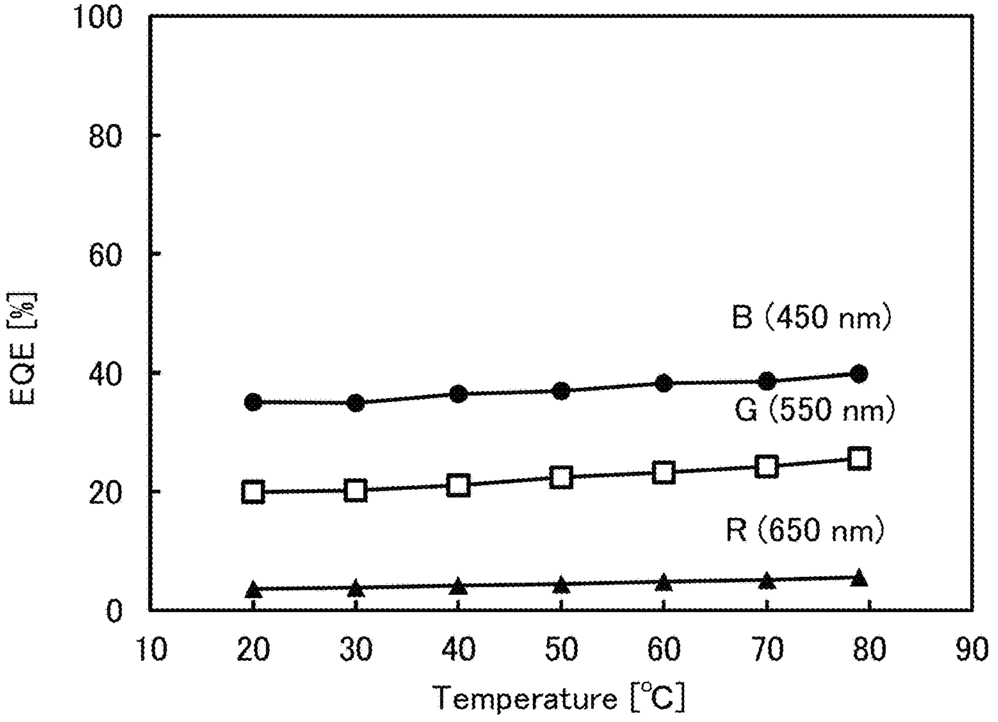
FIG. 32 is a graph showing temperature dependence of light receiving sensitivity of a light-emitting and light-receiving device.

The characteristics of the light-emitting and light-receiving device fabricated in this example as a light-receiving device (characteristics at the time of reverse bias application) were evaluated. The light-emitting and light-receiving device in this example was irradiated with light with every 25 nm in a wavelength of 375 nm to 750 nm at 12.5 $\mu W/cm^2$, and the wavelength dependence of external quantum efficiency was obtained. The voltage was set to −6 V. The temperature dependence of external quantum efficiency was obtained under seven conditions of measurement temperatures of 20° C., 30° C., 40° C., 50° C., 60° C., 70° C., and 79° C. FIG. 31 shows the wavelength dependence of light receiving sensitivity of the light-emitting and light-receiving device. FIG. 32 shows the temperature dependence of light receiving sensitivity of the light-emitting and light-receiving device. Note that in FIG. 31 and FIG. 32, the vertical axis represents external quantum efficiency (EQE).

From the results in this example, it was confirmed that the external quantum efficiency of the light-emitting and light-receiving device in this example tended to increase gradually as the temperature increases. In a range from 20° C. to 79° C., normal operation of the light-emitting and light-receiving device in this example as a light-receiving device was observed without rapid change of efficiency.

As described above, in this example, a light-emitting and light-receiving device having a structure in common with a structure of a light-emitting device (organic EL device) was fabricated and confirmed to be usable as a light-receiving device in a wide temperature range.

Example 3

In this example, results of evaluation of light-emitting and light-receiving devices that were fabricated to be used for the display apparatus of one embodiment of the present invention will be described.

The light-emitting and light-receiving devices fabricated in this example had a structure in common with a light-emitting device (organic EL device).

<3-1. Influence of Thickness of Active Layer>

First, to confirm the influence of the thickness of the active layer of the light-emitting and light-receiving device, five devices shown in Table 2 (Devices 3-*a*, 3-*b*, 3-*c*, 3-*d*, and 3-*e*) were fabricated, and both the characteristics as a light-emitting device and the characteristics as a light-receiving device were evaluated.

Figure 34:
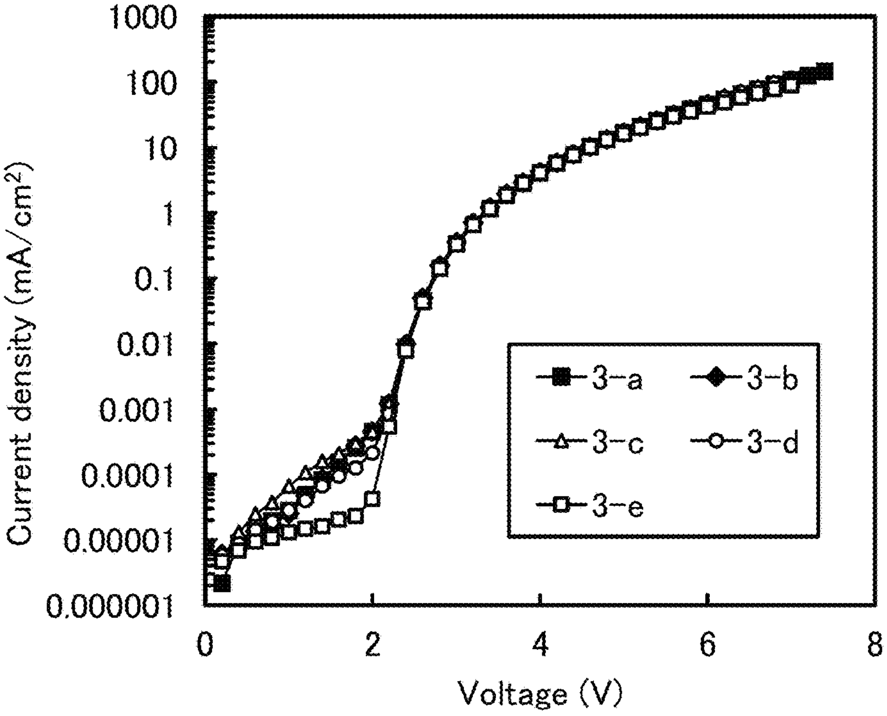
FIG. 34 is a graph showing the current density-voltage characteristics of light-emitting and light-receiving devices at the time of forward bias application.

FIG. 34 shows the current density-voltage characteristics of the light-emitting and light-receiving devices.

Figure 33:
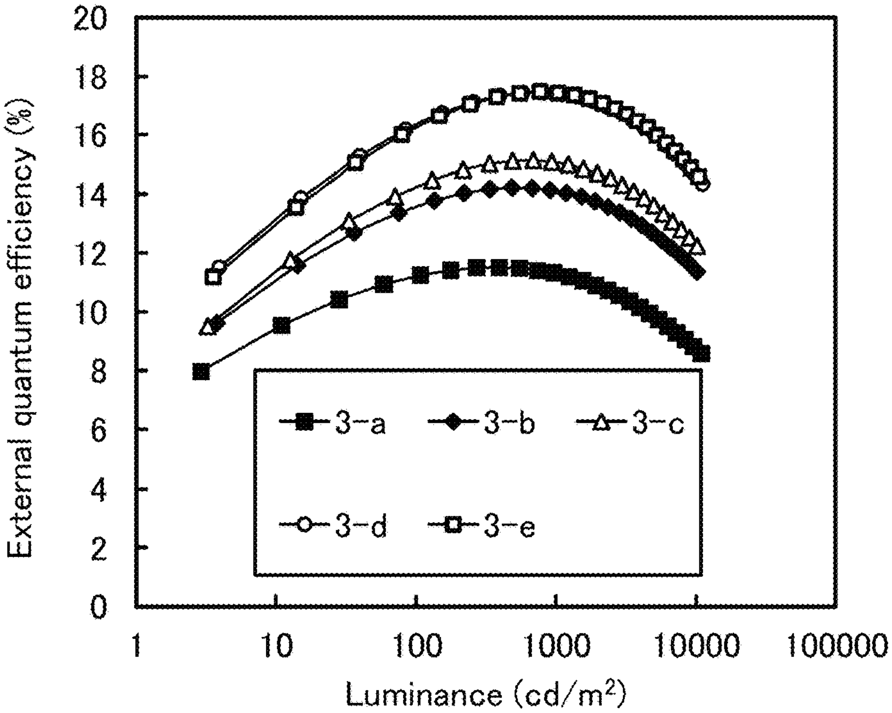
FIG. 33 is a graph showing the external quantum efficiency-luminance characteristics of light-emitting and light-receiving devices.

As shown in FIG. 33, the smaller the thickness (X) of the active layer 183 is, the higher the external quantum efficiency becomes. As shown in FIG. 34, there was little difference in the current density-voltage characteristics among the five devices, which showed extremely small influence of the thickness (X) of the active layer 183. This indicates that there is no large difference in the carrier (hole)-transport property between the active layer 183 and the hole-transport layer 182.

From the above, it was found that the active layer 183 of the light-emitting and light-receiving device in this example affected the emission efficiency but did not greatly affect the hole-transport property at the time of forward bias application.

[Characteristics as Light-Receiving Device]

Figure 35:
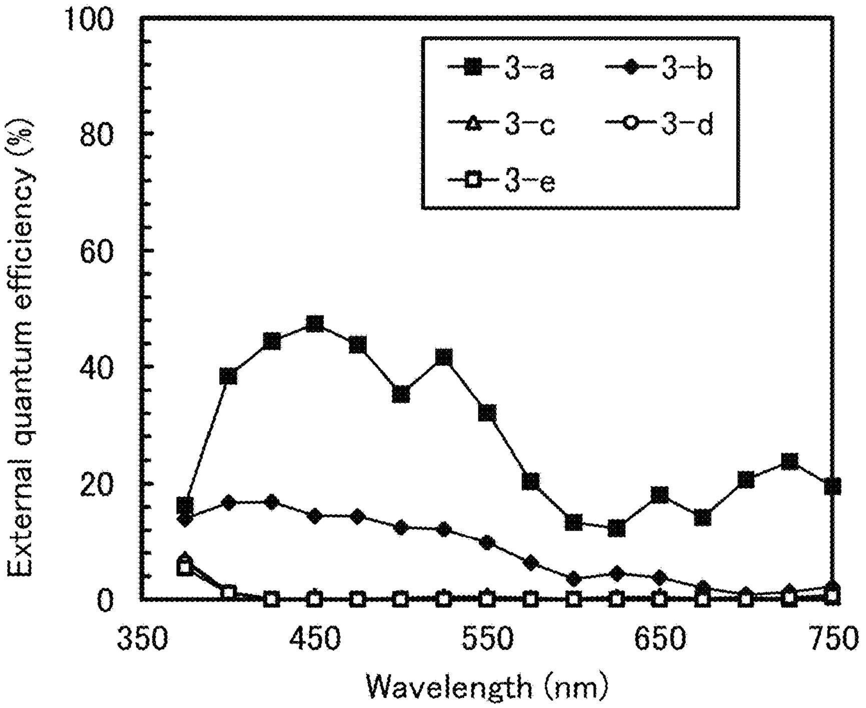
FIG. 35 is a graph showing luminance-wavelength characteristics of light-emitting and light-receiving devices.
Figure 36:
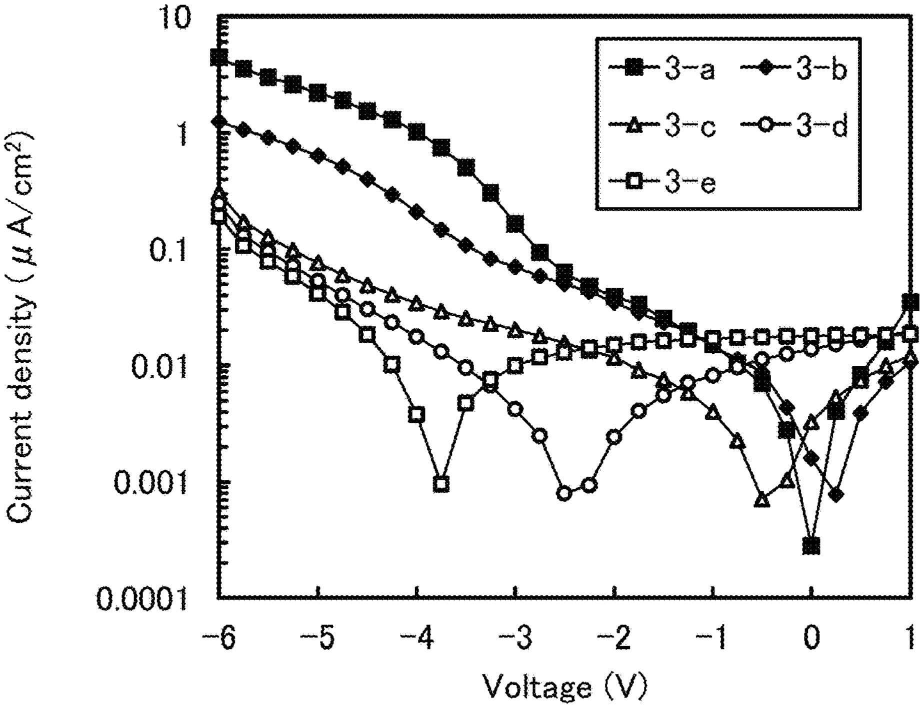
FIG. 36 is a graph showing the current density-voltage characteristics of light-emitting and light-receiving devices at the time of reverse bias application.

Next, the characteristics of the light-emitting and light-receiving devices as light-receiving devices (characteristics at the time of reverse bias application) were evaluated. FIG. 35 shows the external quantum efficiency-wavelength characteristics of the light-emitting and light-receiving devices. FIG. 36 shows the current density-voltage characteristics of the light-emitting and light-receiving devices.

As for the measurement conditions, light irradiation was performed at 12.5 $\mu W/cm^2$ and the voltage in FIG. 35 was set to −6 V. Note that the applied voltage is a value in the case where a bias usually applied to an EL device is positive. In other words, the positive bias is applied when the first electrode 180 side has a high potential and the second electrode 189 side has a low potential.

TABLE 2

| | First electrode 180 | Hole-injection layer 181 | Active layer 183 | Hole-transport layer 182 | Light-emitting layer 193 | Electron-transport layer 184 | | Electron-injection layer 185 | Second electrode 189 | |
|---|---|---|---|---|---|---|---|---|---|---|
| Device | APC\ ITSO 100 nm\ 100 nm | PCPPn: MoOx (=2:1) 15 nm | $C_{70}$: DBP = 9:1 X nm | PCBBiF Y nm | * | 2mDBTBPDBq-II 10 nm | NBPhen 10 nm | LiF 1 nm | Ag: Mg (=10:1) 10 nm | ITO 40 nm |

| Device | X | Y |
|---|---|---|
| 3-a | 60 | 15 |
| 3-b | 45 | 30 |
| 3-c | 30 | 45 |
| 3-d | 15 | 60 |
| 3-e | 0 | 75 |

* 2mDBTBPDBq-II:PCBBiF: [Ir(dmdppr-P)$_2$(dibm)] 0.8:0.2:0.06 70 nm

Under the conditions where the sum of the thickness of the active layer 183 (X) and the thickness of the hole-transport layer 182 (Y) was 75 nm, the five light-emitting and light-receiving devices were fabricated at various X and Y values. The light-emitting and light-receiving devices had the same structure as Device 2 fabricated in Example 1 (see Table 1) except for the thickness of the active layer 183 and the thickness of the hole-transport layer 182. Note that Device 3-*e* does not include the active layer 183 and can be referred to as a red light-emitting device.

[Characteristics as Light-Emitting Device]

First, the characteristics of the light-emitting and light-receiving devices as light-emitting devices (characteristics at the time of forward bias application) were evaluated. FIG. 33 shows the external quantum efficiency-luminance characteristics of the light-emitting and light-receiving devices.

As shown in FIG. 35, the smaller the thickness (X) of the active layer 183 is, the lower the external quantum efficiency becomes. Furthermore, as shown in FIG. 36, the smaller the thickness (X) of the active layer 183 is, the lower the photocurrent becomes. Moreover, the larger the thickness (Y) of the hole-transport layer 182 functioning as a buffer layer between the active layer and the light-emitting layer, the higher the driving voltage.

<3-2. Influence of Thickness of Buffer Layer>

Next, to investigate the influence of the thickness of the buffer layer of the light-emitting and light-receiving device, five devices shown in Table 3 (Devices 3-*f*, 3-*g*, 3-*h*, 3-*i*, and 3-*j*) were fabricated, and both the characteristics as a light-emitting device and the characteristics as a light-receiving device were evaluated.

TABLE 3

| | First electrode 180 | Hole-injection layer 181 | Active layer 183 | Hole-transport layer 182 | Light-emitting layer 193 | Electron-transport layer 184 | | Electron-injection layer 185 | Second electrode 189 |
|---|---|---|---|---|---|---|---|---|---|
| Device | ITO 70 nm | PCPPn: MoOx (=2:1) 15 nm | $C_{70}$: DBP = 9:1 60 nm | PCBBiF Z nm | * | 2mDBTBPDBq-II 10 nm | NBPhen 10 nm | LiF 1 nm | Al 150 nm |

| Device | Z |
|---|---|
| 3-f | 0 |
| 3-g | 5 |
| 3-h | 10 |
| 3-i | 15 |
| 3-j | 20 |

* 2mDBTBPDBq-II:PCBBiF: [Ir(dmdppr-P)2(dibm)] 0.8:0.2:0.06 70 nm

Although the light-emitting and light-receiving devices fabricated in Example 1, Example 2, and 3-1 of this example (see Table 1 and Table 2) each have a structure that receives light from the second electrode 189 side, the light emitting and light-receiving devices fabricated in 3-2 of this example (Table 3) each have a structure that receives light from the first electrode 180 side.

The light-emitting and light-receiving devices fabricated in 3-2 of this example have the same structure as Device 2 fabricated in Example 1 (see Table 1) except that the first electrode 180 is an approximately 70-nm-thick indium-tin oxide (ITO) film, the second electrode 189 is an approximately 150-nm-thick aluminum (Al) film, and various thicknesses (Z) are employed for the hole-transport layer 182.

[Characteristics as Light-Emitting Device]

Figure 37:
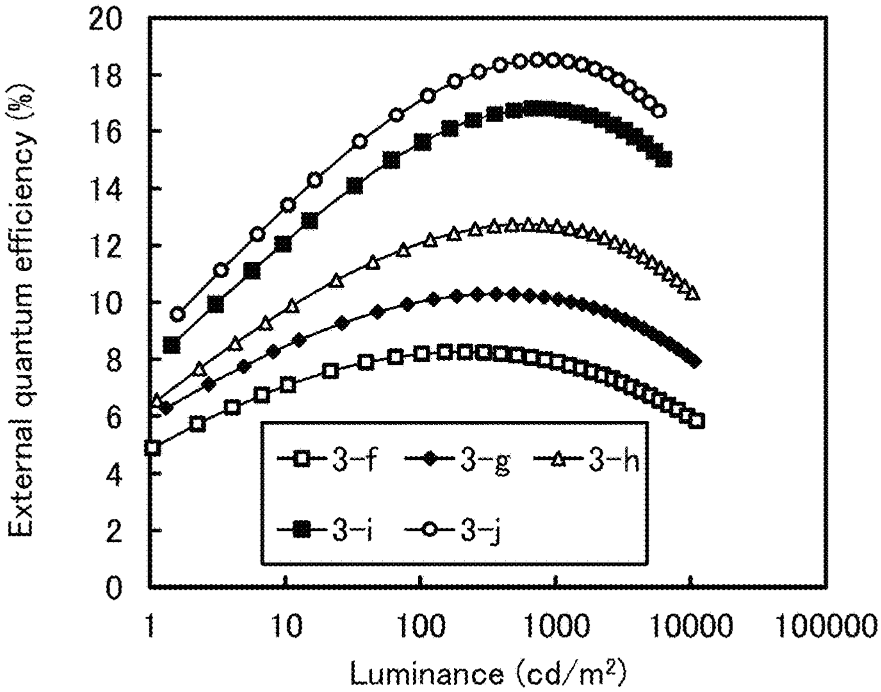
FIG. 37 is a graph showing the external quantum efficiency-luminance characteristics of the light-emitting and light-receiving devices.
Figure 38:
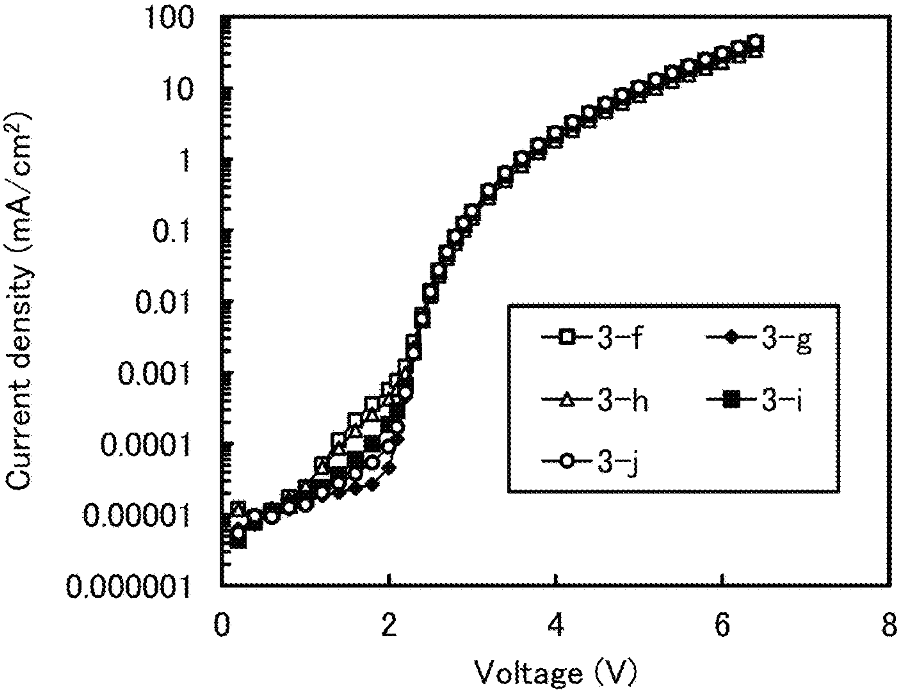
FIG. 38 is a graph showing current density-voltage characteristics of light-emitting and light-receiving devices at the time when forward bias application.

First, the characteristics of the light-emitting and light-receiving devices as light-emitting devices (characteristics at the time of forward bias application) were evaluated. FIG. 37 shows the external quantum efficiency-luminance characteristics of the light-emitting and light-receiving devices. FIG. 38 shows the current density-voltage characteristics of the light-emitting and light-receiving devices.

As shown in FIG. 37, the larger the thickness (Z) of the hole-transport layer 182, the higher the external quantum efficiency. As shown in FIG. 38, there was little difference in the current density-voltage characteristics among the five devices, which showed extremely small influence of the thickness (Z) of the hole-transport layer 182.

From the above, it was found that as the thickness (Z) of the hole-transport layer 182 functioning as the buffer layer between the active layer 183 and the light-emitting layer 193 became larger, energy transfer from the light-emitting layer 193 to the active layer 183 was more inhibited and the emission efficiency became higher.

[Characteristics as Light-Receiving Devices]

Figure 39:
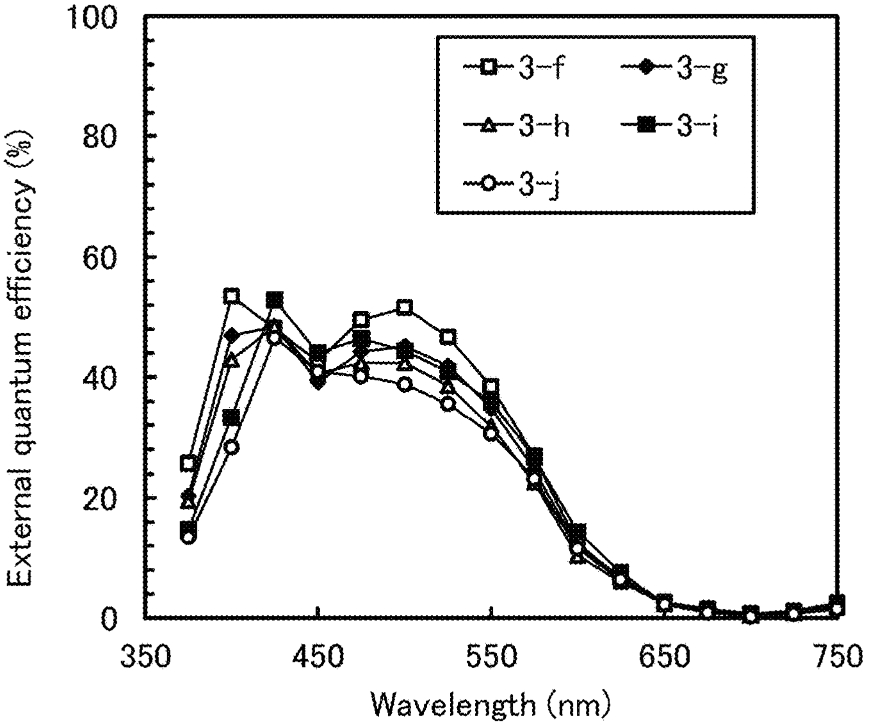
FIG. 39 is a graph showing the external quantum efficiency-wavelength characteristics of light-emitting and light-receiving devices.
Figure 40:
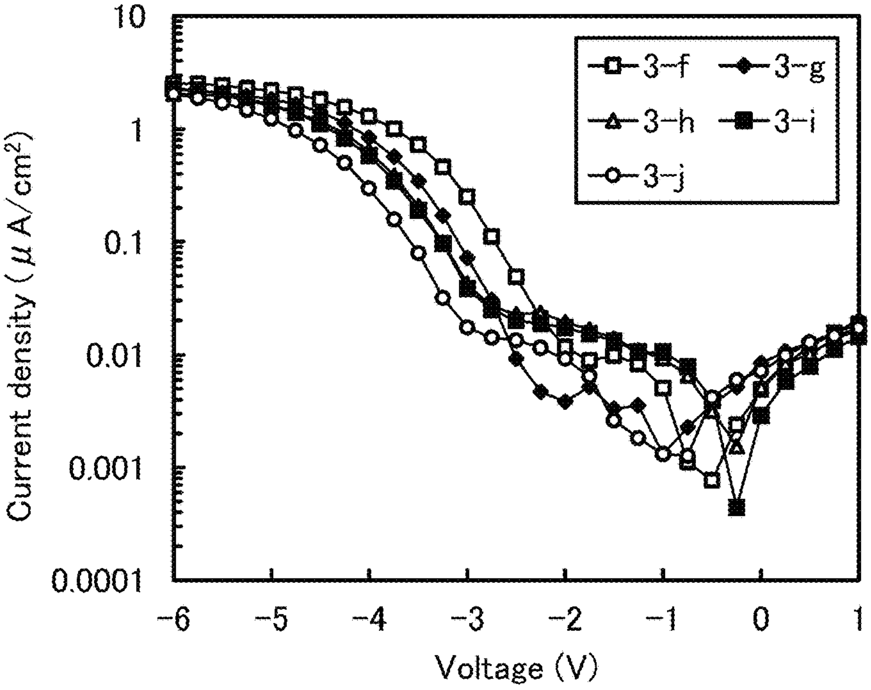
FIG. 40 is a graph showing current density-voltage characteristics of light-emitting and light-receiving devices at the time of reverse bias application.

Next, the characteristics of the light-emitting and light-receiving devices as light-receiving devices (characteristics at the time of reverse bias application) were evaluated. FIG. 39 shows external quantum efficiency-wavelength characteristics of the light-emitting and light-receiving devices. FIG. 40 shows the current density-voltage characteristics of the light-emitting and light-receiving devices.

As for the measurement conditions, light irradiation was performed at 12.5 $\mu W/cm^2$ and the voltage in FIG. 39 was set to −6 V.

A comparison between FIG. 35 and FIG. 39 showed that a change in the external quantum efficiency was small in the case where the thickness of the hole-transport layer 182 was varied as compared with the case where both the thickness of the active layer 183 and the thickness of the hole-transport layer 182 were adjusted. As shown in FIG. 40, it was found that as the thickness of the hole-transport layer 182 became larger, the driving voltage increased. Meanwhile, a comparison between FIG. 36 and FIG. 40 did not show a reduction in the current density due to the variation in the thickness of the hole-transport layer 182.

From the above, it was found that the driving voltage increased when the buffer layer (the hole-transport layer in this example) was provided between the active layer and the light-emitting layer, and as the thickness of the buffer layer became larger, the amount of increase in the driving voltage became larger.

The two evaluations for 3-1 and 3-2 suggest that the active layer 183 is not a factor of inhibiting charge (hole) transfer. They further suggest that introduction of the buffer layer (the hole-transport layer 182 in this example) inhibits Förster transfer from the light-emitting layer 193 to the active layer 183 to inhibit a reduction in the emission efficiency. Accordingly, charge transfer, recombination, and light emission are considered to occur efficiently when the light-emitting and light-receiving device of this example is driven as a light-emitting device.

Here, there is a possibility that the emission efficiency can be further increased when an overlap of the absorption spectrum of the active layer with the emission spectrum of the light-emitting layer is made small to inhibit a phenomenon in which light emitted by the light-emitting layer is absorbed by the active layer. In the case where the characteristics as a light-emitting device is improved by a method of reducing the thickness of the active layer, the characteristics as a light-receiving device deteriorates; that is, they have a trade-off relationship. Meanwhile, by a method of changing the material of the active layer, both the characteristics as a light-emitting device and the characteristics as a light-receiving device are probably increased while the trade-off relationship is avoided.

REFERENCE NUMERALS

ANODE: wiring, BM: light-blocking layer, CATHODE/VPD: wiring, Cf: capacitor, Csb: capacitor, Csg: capacitor, Csr: capacitor, FD: node, GL: wiring, GL1: wiring, GL2: wiring, GR: node, L1: shortest distance, L2: shortest distance, M1B: transistor, M1G: transistor, M1R: transistor, M2B: transistor, M2G: transistor, M2R: transistor, M3B: transistor, M3G: transistor, M3R: transistor, M11: transistor, M12: transistor, M13: transistor, M14: transistor, RS: wiring, RS1: wiring, RS2: wiring, SA: node, SE: wiring, SE1: wiring, SE2: wiring, SLB: wiring, SLG: wiring, SLR: wiring, TX: wiring, V0: wiring, VCP: wiring, VPI: wiring, VRS: wiring, WX: wiring, WX1: wiring, WX2: wiring, 10A: display apparatus, 10B: display apparatus, 10C: display apparatus, 10D: display apparatus, 10E: display apparatus, 10F: display apparatus, 10G: display apparatus, 21B: light, 21G: light, 21R: light, 22: light, 23: light, 23*a*: stray light, 23*b*: stray light, 23*c*: stray light, 23*d*: stray light, 24: reflected light, 42: transistor, 47B: light-emitting device, 47G: light-emitting device, 47R: light-emitting and light-receiving device, 50A: display apparatus, 50B: display apparatus, 51: substrate, 52: finger, 53: layer including light-emitting and light-receiving device, 55: layer including transistor, 57: layer including light-emitting device, 59: substrate, 100A: display apparatus, 100B: display apparatus, 100C: display apparatus, 112: common layer, 114: common layer, 115: common electrode, 142: adhesive layer, 143: space, 151: substrate, 152: substrate, 153: substrate, 154: substrate, 155: adhesive layer, 159: resin layer, 159*p*: opening, 162: display portion, 164: circuit, 165: wiring, 166: conductive layer, 172: FPC, 173: IC, 180: first electrode, 181: hole-injection layer, 182: hole-transport layer, 182B: hole-transport layer, 182G: hole-transport layer, 182R: hole-transport layer, 183: active layer, 184: electron-transport layer, 185: electron-injection layer, 186: layer serving as both light-emitting layer and active layer, 189: second electrode, 190: light-emitting device, 190B: light-emitting device, 190G: light-emitting device, 190R(PD): light-emitting and light-receiving device, 191: pixel electrode, 192: buffer layer, 192B: buffer layer, 192G: buffer layer, 192R: buffer layer, 193: light-emitting layer, 193B: light-emitting layer, 193G: light-emitting layer, 193R: light-emitting layer, 194: buffer layer, 194B: buffer layer, 194G: buffer layer, 194R: buffer layer, 195: protective layer, 201: transistor, 202: transistor, 204: connection portion, 205: transistor, 206: transistor, 207: transistor, 208: transistor, 209: transistor, 210: transistor, 211: insulating layer, 212: insulating layer, 213: insulating layer, 214: insulating layer, 215: insulating layer, 216: partition, 217: partition, 218: insulating layer, 219: light-blocking layer, 221: conductive layer, 222*a*: conductive layer, 222*b*: conductive layer, 223: conductive layer, 225: insulating layer, 228: region, 231: semiconductor layer, 231*i*: channel formation region, 231*n*: low-resistance region, 242: connection layer, 300: pixel, 310: unit, 310*a*: unit, 310*b*: unit, 320: target pixel, 320*a*: target pixel, 320*b*: target pixel, 330*a*: pixel, 330*b*: pixel, 330*c*: pixel, 330*d*: pixel, 340: finger, 6000: electronic device, 6001: display portion, 6003: finger, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display apparatus comprising:

a light-emitting device; and a light-emitting and light-receiving device, wherein the light-emitting device comprises a first pixel electrode, a first light-emitting layer, and a common electrode, wherein the light-emitting and light-receiving device comprises a second pixel electrode, a second light-emitting layer, an active layer, and the common electrode, wherein the first light-emitting layer is positioned between the first pixel electrode and the common electrode, wherein the second light-emitting layer and the active layer are each positioned between the second pixel electrode and the common electrode, wherein the first light-emitting layer comprises a first light-emitting material configured to emit light of a first color, wherein the second light-emitting layer comprises a second light-emitting material configured to emit light of a second color, wherein a wavelength of the light of the first color is shorter than a wavelength of the light of the second color, and wherein the active layer is configured to absorb light having a wavelength shorter than the wavelength of the light of the second color.

2. The display apparatus according to claim 1, wherein the active layer comprises an organic compound.

3. The display apparatus according to claim 1, wherein the second color is red.

4. A display apparatus comprising:

m (m is an integer greater than or equal to 2) light-emitting devices; and n (n is an integer greater than m) light-emitting and light-receiving devices, wherein each of the m light-emitting devices comprises a first pixel electrode, a first light-emitting layer, and a common electrode, wherein each of the n light-emitting and light-receiving devices comprises a second pixel electrode, a second light-emitting layer, an active layer, and the common electrode, wherein the first light-emitting layer is positioned between the first pixel electrode and the common electrode, wherein the second light-emitting layer and the active layer are each positioned between the second pixel electrode and the common electrode, wherein the first light-emitting layer comprises a first light-emitting material configured to emit light of a first color, wherein the second light-emitting layer comprises a second light-emitting material configured to emit light of a second color, wherein a wavelength of the light of the first color is shorter than a wavelength of the light of the second color, and wherein the active layer is configured to absorb light having a wavelength shorter than the wavelength of the light of the second color.

5. The display apparatus according to claim 4, wherein the active layer comprises an organic compound.

6. The display apparatus according to claim 4, wherein the second color is red.

7. The display apparatus according to claim 4, wherein the m and the n satisfy n=2m.

8. A display apparatus comprising:

p (p is an integer greater than or equal to 2) first light-emitting devices;

q (q is an integer greater than or equal to 2) second light-emitting devices; and r (r is an integer greater than p and greater than q) light-emitting and light-receiving devices, wherein each of the p first light-emitting devices comprises a first pixel electrode, a first light-emitting layer, and a common electrode, wherein each of the r light-emitting and light-receiving devices comprises a second pixel electrode, a second light-emitting layer, an active layer, and the common electrode, wherein each of the q second light-emitting devices comprises a third pixel electrode, a third light-emitting layer, and the common electrode, wherein the first light-emitting layer is positioned between the first pixel electrode and the common electrode, wherein the second light-emitting layer and the active layer are each positioned between the second pixel electrode and the common electrode, wherein the third light-emitting layer is positioned between the third pixel electrode and the common electrode, wherein the first light-emitting layer comprises a first light-emitting material configured to emit light of a first color, wherein the second light-emitting layer comprises a second light-emitting material configured to emit light of a second color, wherein the third light-emitting layer comprises a third light-emitting material configured to emit light of a third color, wherein each of a wavelength of the light of the first color and a wavelength of the light of the third color is shorter than a wavelength of the light of the second color, and wherein the active layer is configured to absorb light having a wavelength shorter than the wavelength of the light of the second color.

9. The display apparatus according to claim 8, wherein the active layer comprises an organic compound.

10. The display apparatus according to claim 8, wherein the second color is red.

11. The display apparatus according to claim 8, wherein the p and the r satisfy r=2p.

12. The display apparatus according to claim 8, wherein the p, the q, and the r satisfy r=p+q.

* * * * *